US007160667B2

(12) United States Patent
Iwato

(10) Patent No.: US 7,160,667 B2
(45) Date of Patent: Jan. 9, 2007

(54) IMAGE FORMING MATERIAL

(75) Inventor: Kaoru Iwato, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/760,497

(22) Filed: Jan. 21, 2004

(65) Prior Publication Data

US 2004/0152012 A1 Aug. 5, 2004

(30) Foreign Application Priority Data

Jan. 31, 2003 (JP) ............................ 2003-024499
Jan. 24, 2004 (JP) ............................ 2003-015905

(51) Int. Cl.
*G03F 7/039* (2006.01)
*G03F 7/14* (2006.01)

(52) U.S. Cl. .................. 430/270.1; 430/905; 430/921; 430/922; 430/964

(58) Field of Classification Search ............ 430/270.1, 430/905, 921, 922, 964
See application file for complete search history.

(56) References Cited

U.S. PATENT DOCUMENTS

| | | | |
|---|---|---|---|
| 4,696,891 A | 9/1987 | Guzzi | |
| 4,708,925 A * | 11/1987 | Newman | 430/270.1 |
| 4,792,516 A | 12/1988 | Toriumi et al. | |
| 5,525,453 A | 6/1996 | Przybilla et al. | |
| 5,731,123 A | 3/1998 | Kawamura et al. | |
| 5,965,319 A * | 10/1999 | Kobayashi | 430/176 |
| 6,060,217 A | 5/2000 | Nguyen et al. | |
| 6,083,663 A | 7/2000 | Vermeersch et al. | |
| 6,117,610 A | 9/2000 | Sheriff et al. | |
| 6,153,353 A | 11/2000 | Van Damme et al. | |
| 6,352,811 B1 | 3/2002 | Patel et al. | |
| 6,841,330 B1 | 1/2005 | Miyake et al. | |
| 2003/0017411 A1* | 1/2003 | Shimada et al. | 430/270.1 |
| 2003/0143481 A1 | 7/2003 | Iwato et al. | |
| 2003/0207203 A1 | 11/2003 | Tsuchimura et al. | |
| 2004/0067435 A1 | 4/2004 | Iwato et al. | |

FOREIGN PATENT DOCUMENTS

| | | |
|---|---|---|
| EP | 0 823 327 A2 | 2/1998 |
| EP | 0 899 614 A1 | 3/1999 |
| EP | 0 908 307 A2 | 4/1999 |
| EP | 0 914 964 A2 | 5/1999 |
| EP | 0 945 264 A1 | 9/1999 |
| EP | 0 997 272 A1 | 5/2000 |
| EP | 1 038 668 A2 | 9/2000 |
| EP | 1 059 164 A2 | 12/2000 |
| EP | 1 093 934 A1 | 4/2001 |
| EP | 1 162 063 A2 | 12/2001 |
| EP | 1 162 078 A2 | 12/2001 |
| EP | 1 211 065 A2 | 6/2002 |
| EP | 1 279 519 A2 | 1/2003 |
| EP | 1 400 350 A2 | 3/2004 |
| JP | 07-285275 A | 10/1995 |
| JP | 11-119421 A | 4/1999 |
| JP | 2002-278050 A | 9/2002 |
| JP | 2003-107688 A | 4/2003 |
| WO | WO 97/39894 A1 | 10/1997 |
| WO | WO 99/11458 A1 | 3/1999 |

OTHER PUBLICATIONS

Robert L. Bentley, et al.; "Syntheses of Heterocyclic Compounds. Part XXXIII. Preparation and Reactions of 4-(2-Dialkylaminophenyl)azetidin-s-ones"; Journal of the Chemical Society, Perkin Transaction 1, 1976, pp. 1725-1734.

* cited by examiner

*Primary Examiner*—Richard L. Schilling
(74) *Attorney, Agent, or Firm*—Sughrue Mion, PLLC

(57) ABSTRACT

The present invention relates to an image forming material having, on a substrate, an image forming layer that includes at least (A) a novolac type phenolic resin containing phenol as a structural unit, (B) a photo-thermal converting agent, and (C) a specific ammonium compound or a specific onium salt.

7 Claims, No Drawings

IMAGE FORMING MATERIAL

CROSS-REFERENCE TO RELATED APPLICATION

This application claims priority under 35 USC 119 from Japanese patent Application Nos. 2003-15905 and 2003-24499, the disclosures of which are incorporated by reference herein.

BACKGROUND OF THE INVENTION

1. Field of the Invention

The present invention relates to an image forming material, and, more particularly, to a positive image forming material useful as a positive planographic printing plate precursor suitable for a so-called "direct plate-making" by an infrared laser, by which direct plate-making a plate can be made directly from a digital signal in particular such as from a computer.

2. Description of the Related Art

In recent years, laser technology has rapidly progressed; in particular, higher output and smaller size solid lasers and semiconductor lasers that have an emission region from near infrared to infrared are readily available. These lasers are very useful as an exposure light source when a planographic plate is directly made from digital data such as from computers.

A known positive photosensitive image forming material for use in a direct plate-making by an infrared laser includes a novolac resin or the like as a resin soluble in an aqueous alkali solution. For example, a positive photosensitive image forming material is known which includes a resin that has a phenolic hydroxyl group and is soluble in an aqueous alkali solution such as a novolac resin, a substance that absorbs light to generate heat, and a positive photosensitive compound such as an onium salts, quinone diazide compounds are added (Japanese Patent Application Laid-open (JP-A) No. 7-285275). In the above positive photosensitive image forming material, the positive photosensitive compound, in an image portion, works as a dissolution inhibitor that substantially decreases the solubility of the resin soluble in an aqueous alkali solution. Meanwhile, in a non-image portion, owing to heat, the positive photosensitive compound does not exhibit the dissolution inhibiting effect and the resin soluble in an aqueous alkali solution can be removed by development. In this way, an image is formed.

Furthermore, a positive photosensitive image forming material is disclosed (International Publication WO97/39894 and European Patent Application Laid-open (EP-A) No. 0,823,327). This positive photosensitive image forming material includes a substance that absorbs light to generate heat and a resin whose solubility in an aqueous alkali solution is changed by heat. In this positive photosensitive image forming material, an image portion has low solubility in an aqueous alkali solution, and a solubility of a non-image portion in an aqueous alkali solution is increased by heat. In this way, the non-image portion becomes able to be removed by development to form an image.

In a conventional planographic printing plate precursor, a novolac resin is preferably used since the novolac resin interacts strongly with a dissolution inhibitor, the difference in solubility between the novolac resin in an exposed region and the novolac resin in a non-exposed region is large, and the novolac resin has excellent ink-receiving property. A novolac resin is used also in a positive photosensitive image forming material suitable for infrared laser exposure, for similar reasons. As the novolac resin, in particular, novolac resins obtained by polymerizing phenols such as phenol, cresol, and xylenol with formaldehyde under acidic condition are generally used.

As the dissolution inhibitor, although a variety of compounds are under study, it is known that in particular onium salt type dissolution inhibitors exhibit very strong dissolution inhibiting effect. However, when a general onium salt compound is added, although an improvement in the alkali-resistance in a non-exposed portion can be achieved owing to the strong dissolution inhibiting effect of the onium salt, there exists a problem that the sensitivity is lowered. In order to overcome this problem, a novel photosensitive material that uses a specific onium salt is disclosed. For instance, onium salts disclosed in JP-A No. 2002-278050 and quaternary ammonium salts disclosed in JP-A No. 2003-107688 are known to have excellent characteristics in which high dissolution inhibiting power and high sensitivity are compatible.

However, it has become apparent that there is a problem that as time passes after the exposure, developability of a photosensitive material that uses the above onium-salt type dissolution inhibitor declines and development failure is caused. Such decline in the developability with time lapse after the exposure is problematic in a plate making process and an improvement in the stability of the developability is required. (Hereinafter, the magnitude of developability change after the exposure is expressed by the storability after exposure, and larger decrease in developability is referred to as "worse storability after exposure".)

SUMMARY OF THE INVENTION

Accordingly, an object of the invention is to provide an image forming material that can be used for a heat-example type positive planographic printing plate precursor, is excellent in the difference (solubility discrimination) in the solubility in a developer between an exposed portion and a non-exposed portion, and has small degree of change of the developability with time after the exposure (excellent in the storability after the exposure).

The present inventors found that when a combination of a novolac-type phenolic resin containing phenol as a structural unit and a specific ammonium compound or a specific onium salt is contained in an image forming layer, the storability after the exposure can be largely improved without decline in the sensitivity and in the development latitude. Thereby, the invention has been accomplished.

A first image forming material according to the present invention comprises, on a substrate, an image forming layer that contains at least (A) a novolac type phenolic resin that contains phenol as a structural unit (hereinafter appropriately referred to as "particular novolac resin"), (B) a photo-thermal converting agent, and (C) a compound represented by the following general formula (1-1) (hereinafter appropriately referred to as "particular ammonium compound").

General formula (1-1)

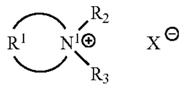

In the general formula (1-1), $R^1$ represents a residue that forms a ring structure containing a $N^1$ atom. $R^2$ and $R^3$ each independently represent an organic group and may combine with each other to form a ring structure. Furthermore, at least one of $R^2$ and $R^3$ may combine with $R^1$ to form a ring structure. $X^-$ represents a conjugate base of an organic acid or inorganic acid.

Furthermore, a second image forming material according to the invention comprises, on a substrate, an image forming layer that contains at least (A) a novolac type phenolic resin that contains phenol as a structural unit (the particular novolac resin), (B) a photo-thermal converting agent, and (C) an onium salt represented by the following general formula (1-2) (hereinafter appropriately referred to as "particular onium salt").

$X^-M^+$ General formula (1-2)

(In the general formula (1-2), $X^-$ represents an anion having at least one substituent group having an alkali dissociative proton. $M^+$ represents a counter cation selected from sulfonium, iodonium, ammonium, phosphonium and oxonium.)

In general, when the development latitude is sacrificed, the storability after the exposure can be secured. However, surprisingly, in the invention, by adopting the above constitution, in addition to making both the sensitivity and the development latitude compatible, improvement in the storability after the exposure becomes also possible.

In the invention, "heat-example type" means that an image forming material can be recorded by the heat-example exposure.

The definition of the heat-example exposure in the invention will be detailed. As described in Hans-Joachim Timpe, IS & Ts NIP 15:1999 International Conference on Digital Printing Technologies, p209, it is known that there are two examples, when largely divided, in a process from photo-excitation to chemical or physical change of a light absorbing substance when the light absorbing substance (for instance dye) in a photosensitive material is excited by light and forms an image through the chemical or physical change. One example is a so-called photon-example in which an optically excited light absorbing substance undergoes a certain photochemical interaction (for instance, energy transfer, electron transfer) with another reactive substance in the photosensitive material and is deactivated, then the resultant activated reactive substance causes the chemical or physical change necessary for the image formation. The other example is a so-called heat-example in which an optically excited light absorbing substance generates heat and is deactivated, and by utilizing the generated heat, a reactive substance causes the chemical or physical change necessary for the image formation. Other than the above-mentioned examples, there are special examples such as an ablation process in which a substance explosively scatters owing to a locally concentrated light energy and a multi-photon absorption process in which one molecule absorbs a lot of photons at one time. However, these special examples are omitted herein.

Exposure processes that make use of the above respective examples are called a photon-example exposure and a heat-example exposure. The technical difference between the photon-example exposure and the heat-example exposure exists in whether or not energy amounts of several photons can be summed up for providing the energy required for a target reaction. For instance, a case is supposed where a certain reaction is caused by n photons. In the photon-example exposure, since a photochemical interaction is utilized, energy amounts of respective photons cannot be summed up due to the requirement of energy conservation law of quantum and momentum conservation law of quantum. That is, in order to cause a certain reaction, it is necessary to satisfy the relation: "amount of energy of single photon ≧ amount of energy of reaction". On the other hand, in the heat-example exposure, since heat is generated after the photo-excitation, that is, since the optical energy is converted to heat and utilized, energy amounts of photons can summed up. Accordingly, in order to cause the reaction, it is sufficient to satisfy the relation: "amount of energy of n photons≧ amount of energy of reaction". However, the summation of amounts of energy is restricted by the heat diffusion. That is, if a subsequent photoexcitation-deactivation process is caused and heat is generated before heat diffuses from a given exposure portion (reaction point) according to the thermal diffusion, heat is certainly accumulated and a temperature in this portion rises. However, when subsequent heat generation is delayed, the heat diffuses and is not accumulated. That is, in the heat-example exposure, even when the total exposure energy is the same, the results are different between a case where light having high energy amount is irradiated for a short period and a case where light having low energy amount is irradiated for a long period. And shorter irradiation is advantageous to the accumulation of heat.

Of course, in some cases, a similar phenomenon may occur even in the photon-example exposure owing to an influence of the diffusion of a subsequent reaction species. However, in principle, such a phenomenon does not occur.

That is, when this phenomenon is expressed as the characteristics of the photosensitive material, while, in the photon-example, a ratio of the specific sensitivity of the photosensitive material (an energy amount for a reaction necessary for forming an image) to an exposure power density ($W/cm^2$)(=energy density per unit time period) is constant regardless of the exposure power density, in the heat-example, a ratio of the specific sensitivity of the photosensitive material to the exposure power density increases as the exposure power density increases. Accordingly, in the case where an exposure time is fixed to such a period that the productivity practically required for an image recording material can be maintained, and the respective examples are compared, in the case of the photon-example exposure, high sensitivity such as substantially 0.1 $mJ/cm^2$ can be ordinarily achieved. However, since a very slight amount of exposure can cause the reaction, there tends to occur a problem that low exposure fog is caused in an unexposed portion. On the other hand, in the case of the heat-example exposure, although a reaction is caused only when the energy amount of the exposure exceeds a certain value, usually about 50 $mJ/cm^2$ from the viewpoint of the thermal stability of the photosensitive material. Accordingly, the problem of the low exposure fog can be avoided in the case of the heat-example exposure.

Practically, in the heat-example exposure, the exposure power density on a plate surface of the photosensitive material has to be no less than 5000 $W/cm^2$, preferably of 10000 $W/cm^2$. However, though not detailed here, when a high power density laser of $5.0\times10^5$ $W/cm^2$ or higher is used, the ablation is caused, resulting in a problem that unfavorable contamination of a light source is caused.

DETAILED DESCRIPTION OF THE INVENTION

In the following, the present invention will be detailed.

One embodiment of the present invention is an image forming material (S1) comprising, on a substrate, an image forming layer which includes at least (A) a novolac type phenolic resin containing phenol as a structural unit, (B) a photo-thermal converting agent, and (C) a compound represented by the following general formula (1-1):

General formula (1-1)

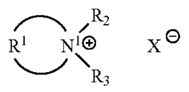

wherein in the general formula (1-1), $R^1$ represents a residue which, together with $N^1$, forms a ring structure; $R^2$ and $R^3$ each independently represent an organic group and may combine with each other to form a ring structure; at least one of $R^2$ and $R^3$ may combine with $R^1$ to form a ring structure; and $X^-$ represents a conjugate base of an organic acid or an inorganic acid.

Another embodiment of the invention is the image forming material (S1), wherein the compound represented by the general formula (1-1) is represented by the following general formula (1-1-a):

General formula (1-1-a)

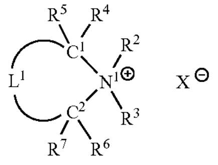

wherein in the general formula (1-1-a), $R^2$ and $R^3$ each independently represent an organic group and may combine with each other to form a ring structure; $X^-$ represents a conjugate base of an organic acid or an inorganic acid; $R^4$ through $R^7$ each independently represent a hydrogen atom or a substituent, may be the same as or different from one another, and may combine with one another to form a ring; $R^4$ through $R^7$ may each combine with $L^1$, $R^2$ or $R^3$ to form a ring structure; when a bond between $L^1$ and $C^1$ or $C^2$ is a double bond or a triple bond, some of $R^4$ through $R^7$ do/does not exist in accordance with the existence of the double bond or the triple bond; $L^1$ represents a single bond or a divalent linkage group which, together with —$C^1$—$N^1$—$C^2$—, forms a ring structure; $R^4$ and $R^5$ may represent an identical atom or an identical substituent so that a bond between $C^1$ and $R^4$, which is also $R^5$, becomes a double bond; and $R^6$ and $R^7$ may represent an identical atom or an identical substituent so that a bond between $C^2$ and $R^6$, which is also $R^7$, becomes a double bond.

Another embodiment of the invention is the image forming material (S1), wherein a mass of the compound represented by the general formula (1-1) is 50% or less of a mass of a total solids content in the image forming layer.

Another embodiment of the invention is the image forming material (S1), wherein the novolac type phenolic resin is a resin obtained by condensing phenol, a substituted phenol represented by the following general formula (I), and an aldehyde:

General formula (I)

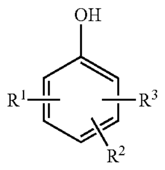

wherein in the general formula (I), $R^1$ and $R^2$ each independently represent a hydrogen atom, an alkyl group, or a halogen atom.

Another embodiment of the invention is the image forming material (S1), wherein the novolac type phenolic resin is a resin obtained by condensing phenol, a substituted phenol represented by the general formula (I), and an aldehyde, and a phenol content in monomers that constitute the novolac type phenolic resin is from 21 to 90% by mole.

Another embodiment of the invention is the image forming material (S1), wherein the novolac type phenolic resin is a resin obtained by condensing phenol, a substituted phenol represented by the general formula (I), and an aldehyde, and a weight average molecular weight of the novolac type phenolic resin is from 500 to 50000.

Another embodiment of the invention is the image forming material (S1), wherein the novolac type phenolic resin is a resin obtained by condensing phenol, a substituted phenol represented by the general formula (I), and an aldehyde, and a proportion of the novolac type phenolic resin to a total solids content in the image forming layer is from 0.1 to 20% by mass.

Another embodiment of the invention is an image forming material (S2) comprising, on a substrate, an image forming layer which includes at least (A) a novolac type phenolic resin containing phenol as a structural unit, (B) a photo-thermal converting agent, and (C) an onium salt represented by the following general formula (1-2):

$X^-M^+$ General formula (1-2)

wherein, in the general formula (1-2), $X^-$ represents an anion including at least one substituent that has an alkali dissociative proton and $M^+$ represents a counter cation selected from the group consisting of a sulfonium ion, an iodonium ion, an ammonium ion, a phosphonium ion, and an oxonium ion.

Another embodiment of the invention is the image formation material (S2), wherein $M^+$ in general formula (1-2) is represented by the following general formula (M-1)

General formula (M-1)

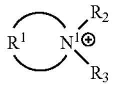

wherein in the general formula (M-1), $R^1$ represents a residue which, together with $N^1$, forms a ring structure; $R^2$ and $R^3$ each independently represent an organic group and may combine with each other to form a ring structure; and at least one of $R^2$ and $R^3$ may combine with $R^1$ to form a ring structure.

Another embodiment of the invention is the image forming material (S2), wherein a mass of the compound represented by general formula (1-2) is 50% or less of a mass of a total solids content in the image forming layer.

Another embodiment of the invention is the image forming material (S2), wherein the novolac type phenolic resin is a resin obtained by condensing phenol, a substituted phenol represented by the following general formula (I), and an aldehyde:

General formula (I)

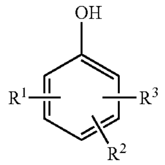

wherein in the general formula (I), $R^1$ and $R^2$ each independently represent a hydrogen atom, an alkyl group, or a halogen atom.

Another embodiment of the invention is the image forming material (S2), wherein the novolac type phenolic resin is a resin obtained by condensing phenol, a substituted phenol represented by the general formula (I), and an aldehyde, and a phenol content in monomers that constitute the novolac type phenolic resin is from 21 to 90% by mole.

Another embodiment of the invention is the image forming material (S2), wherein the novolac type phenolic resin is a resin obtained by condensing phenol, a substituted phenol represented by the general formula (I), and an aldehyde, and a weight average molecular weight of the novolac type phenolic resin is from 500 to 50000.

Still another embodiment of the present invention is the image forming material (S2), wherein the novolac type phenolic resin is a resin obtained by condensing phenol, a substituted phenol represented by the general formula (I), and an aldehyde, and a proportion of the novolac type phenolic resin to a total solids content in the image forming layer is from 0.1 to 20% by mass.

A first image forming material according to the invention is constituted by having, on a substrate, an image forming layer that includes at least (A) a novolac type phenolic resin having phenol as a structural unit, (B) a photo-thermal converting agent, and (C) a compound expressed by the above formula (1-1). A second image forming material according to the invention is constituted by having, on a substrate, an image forming layer that includes at least (A) a novolac type phenolic resin having phenol as a structural unit, (B) a photo-thermal converting agent, and (C) an onium salt expressed by the general formula (1-2). In the following, the respective components in the image forming layer according to the invention will be explained sequentially.

((A) Novolac Type Phenolic Resin Containing Phenol as Structural Unit)

An image forming layer according to the invention includes a novolac type phenolic resin that contains phenol as a structural unit (particular novolac resin). The particular novolac resin is not particularly restricted as far as phenol is contained as a structural unit in a molecule. Phenol as the structural unit preferably occupies 20 to 90 mole %, more preferably from 31 to 85 mole %, and most preferably from 51 to 80 mole % of the structural units that constitutes the novolac resin.

Such particular novolac resin may be preferably (A-1) a resin that are obtained by condensing phenol, a substituted phenol represented by the following general formula (I), and an aldehyde. The particular novolac resin may be more preferably (A-2) a resin obtained by condensing phenol, a phenol derivative selected from cresol and xylenol, and an aldehyde. Here, plural kinds of the substituted phenols may be contained in the particular novolac resin.

((A-1) Resin Obtained by Condensing Phenol, a Substituted Phenol Represented by the Following General Formula (I), and an Aldehyde)

First, a resin obtained by condensing phenol, a substituted phenol represented by the following general formula (I), and an aldehyde (hereinafter occasionally referred to as "(A-1) resin") will be detailed.

General formula (I)

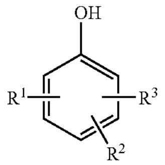

In the general formula (I), $R^1$ and $R^2$ each independently represent a hydrogen atom, an alkyl group or a halogen atom. As the alkyl group, an alkyl group having 1 to 3 carbon atoms is preferable, and an alkyl group having 1 or 2 carbon atoms is more preferable. The halogen atom may be a fluorine atom, a chlorine atom, a bromine atom, or an iodine atom, and preferably a chlorine atom or a bromine atom. $R^3$ represents an alkyl group having 3 to 6 carbon atoms or a cycloalkyl group having 3 to 6 carbon atoms.

Examples of the substituted phenol represented by the general formula (I) that is used as a component of the (A-1) resin include isopropylphenol, t-butylphenol, t-amylphenol, hexylphenol, cyclohexylphenol, 3-methyl-4-chloro-6-t-butylphenol, isopropylcresol, t-butylcresol, t-amylcresol. Among these substituted phenols, t-butylphenol and t-butylcresol are preferable.

Examples of the aldehyde that is used in the (A-1) resin include aliphatic and aromatic aldehydes such as formaldehyde, acetaldehyde, acrolein, crotonaldehyde. Among these aldehydes, formaldehyde and acetaldehyde can be preferably used.

A phenol content in a monomer in the (A-1) resin is preferably in the range of from 21 to 90 mole %, more preferably from 31 to 85 mole %, and most preferably from 51 to 80 mole %.

The weight average molecular weight of the (A-1) resin is preferably in the range of from 500 to 50000, more preferably from 700 to 20000, and particularly preferably from 1000 to 10000.

A ratio of the (A-1) resin to the whole solids content in the image forming layer according to the invention is preferably in the range of from 0.1 to 20% by mass, more preferably from 0.2 to 10% by mass, and particularly preferably from 0.2 to 5% by mass. In the case where the ratio is smaller than 0.1% by mass, the effect of the addition becomes insufficient, while in the case where the ratio is larger than 20% by mass, the sensitivity tends to decline.

((A-2) Resin Obtained by Condensing Phenol, a Phenol Derivative Selected from Cresol and Xylenol, and an Aldehyde)

Next, the (A-2) resin obtained by condensing phenol, a phenol derivative selected from cresol and xylenol, and an aldehyde (hereinafter occasionally referred to as "(A-2) resin") will be detailed.

As the aldehyde that is used in the condensation reaction for obtaining the (A-2) resin, aldehydes that are cited in the foregoing explanation of (A-1) resin can be cited.

The (A-2) resin that is used in the invention is preferably a novolac resin such as a phenol formaldehyde resin or a phenol/cresol (all of m-, p-, and m-/p-mixture are usable) mixture formaldehyde resin.

A phenol content in a monomer in the (A-2) resin is preferably in the range of from 21 to 90 mole %, more preferably from 31 to 85 mole %, and particularly preferably from 51 to 80 mole %. The monomers in the (A-2) resin preferably includes m-cresol in an amount of 10 mole % or more.

The weight average molecular weight of the (A-2) resin is preferably in the range of from 500 to 50000, more preferably from 700 to 20000, and particularly preferably from 1000 to 10000. The number average molecular weight of the (A-2) resin is preferably 500 or more and more preferably in the range of from 750 to 650,000. The dispersion (weight average molecular weight/number average molecular weight) of the (A-2) resin is preferably in the range of from 1.1 to 10.

The content of the (A-2) resin that is used in the invention is preferably in the range of from 10 to 95% by mass, and more preferably from 20 to 90% by mass based on the whole solids content in the image recording layer of the image forming material. In the case where the content is less than 10% by mass, in some cases, the improvement effect of the press life due to the baking is so low that the resultant printing plate cannot be used.

The particular novolac resin such as the (A-1) resin or the (A-2) resin according to the invention may be used singly or plural kinds of the particular novolac resins may be used in combination.

A generally used novolac resin other than the particular novolac resin according to the invention may be used in combination with the particular novolac resin. In that case, the novolac resin other than the particular novolac resin can be blended in an amount of from 5 to 50% by mass, preferably from 5 to 30% by mass, and particularly preferably from 5 to 20% by mass based on the entire amount of the novolac resins.

As a method of producing the particular novolac resins according to the invention, a method described in *Shin Jikken Kagaku Kouza* 19, *Koubunshi Kagaku I*, (Maruzen Co., Ltd, 1993): p. 300 can be applied. According to the method, phenol and a substituted phenol (e.g. a cresol that is cited in the explanation of the (A-1) resin and (A-2) resin) are allowed to react in a solvent together with an aqueous solution of formaldehyde by using an acid as a catalyst, whereby phenol, o-site or p-site in the substituted phenol component and formaldehyde undergoes dehydration condensation to produce the particular novolac resin.

The dehydration condensation between phenol and the o-site or p-site of the substituted phenol component and formaldehyde can be performed as follows. First, a solution containing phenol and the substituted phenol component in an amount of 60 to 90% by mass, and preferably from 70 to 80% by mass in terms of the total mass of phenol and the substituted phenol component. Then, formaldehyde is added to the solution so that the molar ratio of the amount of formaldehyde to the total amount of phenol and the substituted phenol component is in the range of from 0.2 to 2.0, preferably from 0.4 to 1.4, and particularly preferably from 0.6 to 1.2. Further, an acid catalyst is added to the solution at a temperature of from 10 to 150° C. so that the molar ratio of the amount of the acid catalyst to the total amount of phenol and the substituted phenol component is in the range of from 0.01 to 0.1, and preferably in the range of from 0.02 to 0.05. Then, the solution is stirred for several hours while the temperature of the solution is kept in the foregoing range, whereby the dehydration condensation is achieved. The reaction temperature is preferably in the range of from 70 to 150° C. and more preferably from 90 to 140° C.

Solvents usable in the reaction are, for instance, water, acetic acid, methanol, ethanol, 2-propanol, 2-methoxyethanol, ethyl propionate, ethoxyethyl propionate, 4-methyl-2-pentanone, dioxane, xylene, benzene and the like.

As the acid catalyst, hydrochloric acid, sulfuric acid, p-toluene sulfonic acid, phosphoric acid, oxalic acid, tartaric acid, citric acid, zinc acetate, manganese acetate, cobalt acetate, magnesium methylsulfonate, aluminum chloride, zinc oxide and the like can be cited.

The monomers and dimers remaining in a synthesized phenolic resin are distilled and removed such that the total concentration of the remaining monomers and dimers is preferably in the range of from 0.01 to 10% by mass and more preferably in the range of from 0.01 to 2.0% by mass.

Specific examples (S-1 through S-18) of the particular novolac resin that are preferably used in the invention are as follows.

(S-1) Polycondensation product of phenol, m-cresol and p-cresol (molar ratio 30:50:20, weight average molecular weight 4000)

(S-2) Polycondensation product of phenol, m-cresol and o-cresol (molar ratio 50:30:20, weight average molecular weight 5500)

(S-3) Polycondensation product of phenol, m-cresol and p-cresol (molar ratio 70:10:20, weight average molecular weight 4500)

(S-4) Polycondensation product of phenol, m-cresol and p-cresol (molar ratio 50:30:20, weight average molecular weight 4200)

(S-5) Polycondensation product of phenol and m-cresol (molar ratio 70:30, weight average molecular weight 4500)

(S-6) Polycondensation product of phenol and p-cresol (molar ratio 60:40, weight average molecular weight 6000)

(S-7) Polycondensation product of phenol and o-cresol (molar ratio 50:50,weight average molecular weight 3900)

(S-8) Polycondensation product of phenol and p-ethyl phenol (molar ratio 40:60, weight average molecular weight 4000)

(S-9) Polycondensation product of phenol and p-tertiary butyl phenol (molar ratio 80:20, weight average molecular weight 5000)

(S-10) Polycondensation product of phenol and 2,5-xylenol (molar ratio 90:10, weight average molecular weight 8000)

(S-11) Polycondensation product of phenol and 2,3-xylenol (molar ratio 75:25, weight average molecular weight 4400)

(S-12) Polycondensation product of phenol and 2,4-xylenol (molar ratio 80:20, weight average molecular weight 5500)

(S-13) Polycondensation product of phenol and 3,4-xylenol (molar ratio 70:30, weight average molecular weight 7400)

(S-14) Polycondensation product of phenol and p-nonyl phenol (molar ratio 30:70, weight average molecular weight 9800)

(S-15) Polycondensation product of phenol and p-phenyl phenol (molar ratio 65:45, weight average molecular weight 4000)

(S-16) Polycondensation product of phenol and o-phenyl phenol (molar ratio 50:50, weight average molecular weight 4500)

(S-17) Polycondensation product of phenol, m-cresol and 2,5-xylenol (molar ratio 80:15:5, weight average molecular weight 5500)

(S-18) Polycondensation product of phenol, m-cresol and p-phenyl phenol (molar ratio 40:10:50, weight average molecular weight 4500)

Among these examples, (S-1) through (S-13) are preferable and (S-1) through (S-8) are particularly preferable.

Since phenol, which is included as the structural unit in the particular novolac resin according to the invention, has more active sites than the substituted phenols, an obtained polymer is likely to form a three-dimensional structure as a whole. Accordingly, it is considered that in the heat-example exposure, owing to such three-dimensional structure, if interaction of the particular novolac resin with a particular ammonium compound (inhibitor) or a particular onium salt is once broken, it is difficult to reestablish the interaction.

It is inferred that because the interaction between an alkali-soluble resin such as a novolac resin and the dissolution inhibitor recovers with time, the solubility (storability after the exposure) decreases with time. On the other hand, in the invention, it is considered that owing to the use of the particular novolac resin, the recovery of the interaction between the novolac resin and the particular ammonium compound in an exposed portion or between the novolac resin and the particular onium salt in an exposed portion is effectively disturbed, resulting in exhibition of the effect of the present invention.

In the image forming layer according to the invention, in combination with the particular novolac resin, a resin (hereinafter occasionally referred to as "other alkali-soluble resin") which is insoluble in water and soluble in alkaline water and which is other than the particular novolac resin can be used in combination with the particular novolac resin. The simultaneous use of the particular novolac resin and such other alkali-soluble resin is preferable from the viewpoint of expanding the development latitude.

Such other alkali-soluble resin may be polyhydroxystyrene, polyhalogenated hydroxystyrene, copolymer of N-(4-hydroxyphenyl)methacrylamide, hydroquinone monomethacrylate copolymer, the sulfonylimide base polymer described in JP-A No. 7-28244, the carboxyl group containing polymer described in JP-A No. 7-36184, or the like. Other than the above, acrylic resins each containing a phenolic hydroxyl group described in JP-A No. 51-34711, acrylic resins each containing a sulfonamide group described in JP-A No. 2-866, urethane base resins, various kinds of alkali-soluble polymer compounds also can be used as such other alkali-soluble resins.

These other alkali-soluble resins preferably have weight average molecular weights in the range of from 500 to 200,000, and number average molecular weights in the range of from 200 to 60,000.

The above-mentioned other alkali-soluble resin may be used singly or multiple kinds of such other alkali-soluble resins may be used in combination. Such other alkali-soluble resin(s) can be contained in the recording layer (i.e. image forming layer) in an amount of preferably 0.5 to 30% by mass based on the whole solids content of the recording layer, and more preferably from 0.5 to 20% by mass based on the whole solids content of the recording layer.

((C) Compound Represented by General Formula (1-1))

The first image forming layer according to the invention contains a compound (hereinafter, occasionally referred to as "particular ammonium compound") represented by the following general formula (1-1).

General formula (1-1)

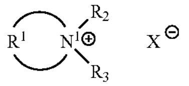

In the general formula (1-1), $R^1$ represents a residue that forms a ring structure containing a $N^1$ atom. $R^2$ and $R^3$ each independently represent an organic group and may combine with each other to form a ring structure. At least one of $R^2$ and $R^3$ may combine with $R^1$ to form a ring structure. $X^-$ represents a conjugate base of an organic acid or an inorganic acid.

The residue represented by the $R^1$ may be any organic group as far as it is a divalent organic group that can form a ring structure containing $N^1$ atom. That is, not only a hydrocarbon ring structure, but also a ring structure containing a plurality of nitrogen atoms or a ring structure containing another hetero atom such as an oxygen atom, sulfur atom may be the ring structure formed by the combination of $R^1$ and $N^1$. The ring structure formed by the combination of $R^1$ and $N^1$ may contain a double bond and the combination of $R^1$ and $N^1$ may form a polycyclic structure.

As a preferable example of the ring structure that is formed by $R^1$ and $N^1$ atom, a three- to ten-membered ring can be cited. From the viewpoint of more efficiently removing the dissolution inhibiting effect, a three- to eight-membered ring is preferable, and when considering the suitability for synthesis, a five-membered ring and a six-membered ring are preferable.

The ring structure formed by $R^1$ and $N^1$ atom may further contain a substituent, and as such substituent, an alkyl group, an aryl group, a halogen atom, or the like can be cited.

$R^2$ and $R^3$ may be the same as or different from each other and can be arbitrarily selected from organic groups. However, in view of exhibiting an inhibition, that is, a strong dissolution inhibition action, a group such as an alkyl group, an aryl group, a group represented by the following general formula (2-1) and the like are preferable. If both $R^2$ and $R^3$ are alkyl groups, the sum of the numbers of carbon atoms thereof has to be no less than 6. It is preferable that at least one of $R^2$ and $R^3$ has a branched structure or a ring structure. In view of the efficiency of removing the dissolution inhibiting effect, it is preferable that at least one of $R^2$ and $R^3$ contains an aromatic ring, and it is more preferable that each of $R^2$ and $R^3$ contains an aromatic ring.

General formula (2-1)

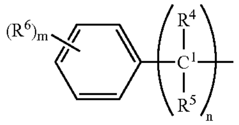

In the general formula (2-1), $R^4$, $R^5$ and $R^6$ each independently represent an arbitrary possible substituent. $R^4$, $R^5$ and $R^6$ may be the same as or different from each other. Any two of $R^4$, $R^5$ and $R^6$ may combine with each other to form a ring structure. The bond between $C^1$ and one of $R^4$ and $R^5$ may be a double bond, and in such a case the other one of $R^4$ and $R^5$ does not exist. And n represents an integer of 0 or 1 and m represents an integer from 0 to 5. When m is larger than 1, a plurality of $R^6$s exist, and in such a case, each $R^6$ may be same or different and may combine with another $R^6$ to form a ring structure. In the case where n is 1, in view of the suitability for synthesis, it is preferable that at least one of $R^4$ and $R^5$ is a hydrogen atom, and it is most preferable that both $R^4$ and $R^5$ are hydrogen atoms.

As the substituent represented by $R^2$ or $R^3$, the following substituents can be cited as examples:

alkyl groups (each preferably having 1 to 20 carbon atoms, more preferably 1 to 16 carbon atoms, and particularly preferably 1 to 12 carbon atoms; specifically such as a methyl group, an ethyl group, an n-butyl group, an isopropyl group, a tert-butyl group, an n-octyl group, an n-decyl group, an n-hexadecyl group, a cyclopropyl group, a cyclopentyl group, a cyclohexyl group, and a 2-cyclohexylethyl group), alkenyl groups (each preferably having 2 to 20 carbon atoms, more preferably 2 to 12 carbon atoms, and particularly preferably 2 to 8 carbon atoms; such as a vinyl group, an allyl group, a 2-betenyl group, a 3-pentenyl group, and a 2-cyclohexenylmethyl group), alkynyl groups (each preferably having 2 to 20 carbon atoms, more preferably 2 to 12 carbon atoms, and particularly preferably 2 to 8 carbon atoms; such as a propargyl group and a 3-pentynyl group), aryl groups (each preferably having 6 to 30 carbon atoms, more preferably 6 to 20 carbon atoms, and particularly preferably 6 to 12 carbon atoms; such as a phenyl group, a p-methyl phenyl group, and a naphthyl group), amino groups (each preferably having 0 to 20 carbon atoms, more preferably 0 to 12 carbon atoms, and particularly preferably 0 to 6 carbon atoms; such as an amino group, a methylamino group, a dimethylamino group, a diethylamino group, a diphenylamino group, and a dibenzylamino group), alkoxy groups (each preferably having 1 to 20 carbon atoms, more preferably 1 to 12 carbon atoms, and particularly preferably 1 to 8 carbon atoms; such as a methoxy group, an ethoxy group, and a butoxy group), aryloxy groups (each preferably having 6 to 20 carbon atoms, more preferably 6 to 16 carbon atoms, and particularly preferably 6 to 12 carbon atoms; such as a phenyloxy group and a 2-naphthyloxy group), acyl groups (each preferably having 1 to 20 carbon atoms, more preferably 1 to 16 carbon atoms, and particularly preferably 1 to 12 carbon atoms; such as an acetyl group, a benzoyl group, a formyl group, and a pivaloyl group), alkoxycarbonyl groups (each preferably having 2 to 20 carbon atoms, more preferably 2 to 16 carbon atoms, and particularly preferably 2 to 12 carbon atoms; such as a methoxycarbonyl group and an ethoxycarbonyl group), aryloxycarbonyl groups (each preferably having 7 to 20 carbon atoms, more preferably 7 to 16 carbon atoms, and particularly preferably 7 to 10 carbon atoms; such as a phenyloxycarbonyl group), acyloxy groups (each preferably having 2 to 20 carbon atoms, more preferably 2 to 16 carbon atoms, and particularly preferably 2 to 10 carbon atoms; such as an acetoxy group and a benzoyloxy group), acylamino groups (each preferably having 2 to 20 carbon atoms, more preferably 2 to 16 carbon atoms, and particularly preferably 2 to 10 carbon atoms; such as an acetylamino group and a benzoylamino group), alkoxycarbonylamino groups (each preferably having 2 to 20 carbon atoms, more preferably 2 to 16 carbon atoms, and particularly preferably 2 to 12 carbon atoms; such as a methoxycarbonylamino group), aryloxycarbonylamino groups (each preferably having 7 to 20 carbon atoms, more preferably 7 to 16 carbon atoms, and particularly preferably 7 to 12 carbon atoms; such as a phenyloxycarbonylamino group), sulfonylamino groups (each preferably having 1 to 20 carbon atoms, more preferably 1 to 16 carbon atoms, and particularly preferably 1 to 12 carbon atoms; such as a methanesulfonylamino group and a benzenesulfonylamino group), sulfamoyl groups (each preferably having 0 to 20 carbon atoms, more preferably from 0 to 16 carbon atoms, and particularly preferably from 0 to 12 carbon atoms; such as a sulfamoyl group, methylsulfamoyl group, dimethylsulfamoyl group, and a phenylsulfamoyl group), carbamoyl groups (each preferably having 1 to 20 carbon atoms, more preferably 1 to 16 carbon atoms, and particularly preferably 1 to 12 carbon atoms; such as a carbamoyl group, a methylcarbamoyl group, a diethylcarbamoyl group, and a phenylcarbamoyl group), alkylthio groups (each preferably having 1 to 20 carbon atoms, more preferably 1 to 16 carbon atoms, and particularly preferably 1 to 12 carbon atoms; such as a methylthio group and an ethylthio group), arylthio groups (each preferably having 6 to 20 carbon atoms, more preferably 6 to 16 carbon atoms, and particularly preferably 6 to 12 carbon atoms; such as a phenylthio group), sulfonyl groups (each preferably having 1 to 20 carbon atoms, more preferably 1 to 16 carbon atoms, and particularly preferably 1 to 12 carbon atoms; such as a mesyl group and a tosyl group), sulfinyl groups (each preferably having 1 to 20 carbon atoms, more preferably 1 to 16 carbon atoms, and particularly preferably 1 to 12 carbon atoms; such as a methanesulfinyl group and benzenesulfinyl group), ureido groups (each preferably having 1 to 20 carbon atoms, more preferably 1 to 16 carbon atoms, and particularly preferably 1 to 12 carbon atoms; such as an ureido group, a methylureido group, and a phenylureido group), phosphoric acid amide groups (each preferably having 1 to 20 carbon atoms, more preferably 1 to 16 carbon atoms and particularly preferably 1 to 12 carbon atoms; such as a diethylphosphoric acid amide group and phenylphosphoric acid amide group), a hydroxyl group, a mercapto group, halogen atoms (for instance, a fluorine atom, a chlorine atom, a bromine atom and an iodine atom), a cyano group, a sulfo group, a carboxyl group, a nitro group, a hydroxamic acid group, a sulfino group, a hydrazino group, an imino group, heterocyclic groups (each preferably having 1 to 30 carbon atoms and more preferably 1 to 12 carbon atoms and including a nitrogen atom, an oxygen atom or a sulfur atom as a heteroatom; specifically such as an imidazolyl group, a pyridyl group, a quinolyl group, a furyl group, a thienyl group, a piperidyl group, a morpholino group, a benzoxazolyl group, a benzoimidazolyl group, a benzothiazolyl group, a carbazolyl group, an azepinyl group, and an oxiranyl group) and silyl groups (each preferably having 3 to 40 carbon atoms, more preferably 3 to 30 carbon atoms and particularly preferably 3 to 24 carbon atoms; such as a trimethylsilyl group and a triphenylsilyl group).

These substituents may be further substituted. When there are two or more substituents, each substituent may be same or different. If possible, the substituents may combine with each other to form a ring.

Each of $R^2$ and $R^3$ is preferably an alkyl group, an aryl group, an alkenyl group, an alkynyl group, or a group obtained by allowing one of these groups to be substituted by substituent(s). From the viewpoint of the dissolution inhibiting effect, the sum of the numbers of carbon atoms of $R^2$ and $R^3$ is preferably no less than 6, more preferably no less than 8 and most preferably no less than 10.

The $X^-$ is an anion that is a conjugate base of an arbitrary organic acid or inorganic acid, and may be a high molecular compound or a low molecular compound, and may be a polyvalent anion. Examples of these anions may include anions, which are organic acid conjugate bases, such as $R^{a1}$—$SO_3^-$, $R^{a1}$—$SO_2^-$, $R^{a1}$—$CO_2^-$, $R^{a1}$—$CS_2^-$, $R^{a1}$—O—$CS_2^-$, $R^{a1}$—S—$CS_2^-$, $R^{a1}$—O—$PO_2^-$, $(R^{a1}$—$O)_2PO_2^-$, $R^{a1}(R^{a1}$—$O)PO_2^-$, $R^{a1}$-$EW^1$-$Z^-$-$EW^2$—$R^{a1}$, $(R^{a1})_4B^-$ and $Ar^xO^-$ or anions, which are inorganic acid conjugate bases, such as $F^-$, $Cl^-$, $Br^-$, $I^-$, $PF_6^-$, $BF_4^-$, $SbF_6^-$, $ClO_4^-$, $SO_4^{2-}$, $NO_3^-$, $CO_3^{2-}$, $SCN^-$, $CN^-$, $SiF_6^-$, $FSO_3^-$, $I_3^-$, $Br_3^-$ and $IBr_2^-$.

Here, the $R^{a1}$ represents an organic substituent selected from alkyl groups, alkenyl groups, alkynyl groups, aryl groups, aralkyl groups, and groups each obtained by further substituting one of these groups with (a) substutuent(s). When a plurality of $R^{a1}$s are present in a molecule, each $R^{a1}$ may be same or different and may be bonded to another $R^{a1}$ to form a ring. $EW^1$ and $EW^2$ each independently represent an electron attractive group and specific examples thereof may include —SO—, —CO—, —$SO_2$— and —CN. Z represents —$CR^{z1}$— ($R^{z1}$ represents a hydrogen atom or a substituent), or —N—. $Ar^x$ represents an aryl group.

Among compounds represented by the general formula (1-1), as a preferable example, compounds represented by the following general formula (1-1-a) can be cited.

General formula (1-1-a)

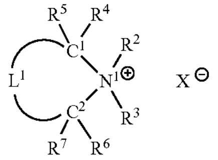

The definition of each of $R^2$, $R^3$ and $X^-$ in the general formula (1-1-a) are the same as in the general formula (1-1), and the preferable ranges thereof are also the same. $R^2$ and $R^3$ in the general formula (1-1-a) each further preferably are an alkyl group, an aryl group, an alkenyl group, an alkynyl group, or a group obtained by allowing one of these groups to be substituted by an arbitrary substituent(s). From the viewpoint of the dissolution inhibiting effect, the sum of the numbers of carbon atoms of $R^2$ and $R^3$ is preferably no less than 6, more preferably no less than 8, and most preferably no less than 10.

In the general formula (1-1-a), $R^4$ though $R^7$ each independently represent a hydrogen atom or a substituent. As the substituent, the substituents cited as examples of $R^2$ and $R^3$ in the general formula (1-1) can be cited. Any two of $R^4$ though $R^7$ may be same as or different from each other and may combine with each other to form a ring structure. $R^4$ though $R^7$ each may combine with $L^1$, $R^2$ or $R^3$ to form a ring structure. In the case where the bond between $L^1$ and $C^1$ carbon or between $L^1$ and $C^2$ carbon is a double bond or a triple bond, some of $R^4$ though $R^7$ may not exist in accordance with the existence of the double or triple bond.

In the general formula (1-1-a), $L^1$ represents a divalent linkage group or a single bond, which, together with —$C^1$—$N^1$—$C^2$—, forms a ring structure. In the case where $L^1$ is a divalent linkage group, $L^1$ may have a substituent. Preferred examples of the ring structure containing $L^1$ are three- to ten-membered ring structure. From the viewpoint of efficiency of removing dissolution inhibiting effect, 3- to 8-membered rings are preferable. In view of the suitability for synthesis, 5-membered rings and 6-membered rings are preferable.

In the general formula (1-1-a), $R^4$ and $R^5$ may represent an identical atom or an identical substituent so that the bond between $C^1$ and $R^4$ (i.e. $R^5$) becomes a double bond. Also, $R^6$ and $R^7$ may represent an identical atom or an identical substituent so that the bond between $C^2$ and $R^6$ (i.e. $R^7$) becomes a double bond. (For instance, in the case of $R^4$=$R^5$=O, a carbonyl group (—CO—) may be formed.)

Among compounds that are represented by the general formula (1-1), as preferable examples, compounds that are represented by the following general formula (1-1-b) can be cited.

General formula (1-1-b)

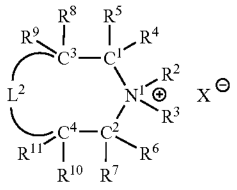

In the general formula (1-1-b), $R^2$, $R^3$ and $X^-$ each have the same definition respectively as $R^2$, $R^3$ or $X^-$ in the general formula (1-1), and the preferable ranges are also the same.

In the general formula (1-1-b), $R^4$ through $R^{11}$ each independently represent a hydrogen atom or a substituent. As the substituent, substituents that are cited as examples of $R^2$ and $R^3$ in the general formula (1-1) can be cited. Any two of $R^4$ through $R^{11}$ may be the same as or different from each other and may combine with each other to form a ring structure. $R^4$ through $R^{11}$ each may combine with $L^2$, $R^2$ or $R^3$ to form a ring structure. The bond between $C^3$ carbon atom and $C^1$ carbon atom, between $C^4$ carbon atom and $C^2$ carbon atom, between $C^3$ carbon atom and $L^2$, or between $C^4$ carbon atom and $L^2$ may be a double bond or a triple bond. In such a case, some of $R^4$ through $R^{11}$ do/does not exist in accordance with the existence of such double or triple bond. Further, $L^2$ itself may be a double bond connecting $C^3$ carbon atom and $C^4$ carbon atom. Also in this case, some of $R^4$ through $R^{11}$ do/does not exist in accordance with the existence of the double bond.

In the general formula (1-1-b), $L^2$ represents a divalent linkage group that, together with —$C^3$—$C^1$—$N^1$—$C^2$—$C^4$—, forms a ring structure, a single bond connecting $C^3$ and $C^4$ or a double bond connecting $C^3$ and $C^4$. In the case where $L^2$ represents a divalent linkage group, $L^2$ may have substituent(s). As preferable examples of the ring structure that contains $L^2$, 5- to 10-membered rings can be cited. From the viewpoint of the efficiency of removing the dissolution inhibition, 5- to 8-membered rings are preferable, and when further considering the suitability for synthesis, 5- and 6-membered rings are preferable.

In the general formula (1-1-b), two substituents which are selected from $R^4$ through $R^{11}$ and are bonded to the same atom may be an identical atom or substituent so that a double bond is formed. (For instance, provided $R^4$=$R^5$=O, a carbonyl group (—CO—) may be formed.)

In the general formula (1-1-b), two substituents which are selected from $R^4$ through $R^{11}$ and are bonded to atoms adjoining each other may be an identical atom or substituent so that a 3-membered ring is formed. (For instance, provided $R^4$=$R^8$=oxygen atom, an epoxy group may be formed.)

Among compounds that are represented by the general formula (1-1), as preferable examples, compounds that are represented by the following general formula (1-1-c) can be cited.

General formula (1-1-c)

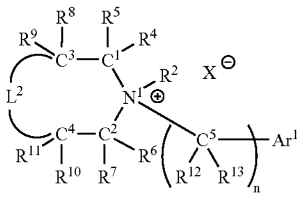

In the general formula (1-1-c), $R^2$ and $X^-$ each have the same definition respectively as $R^2$ or $X^-$ in the general formula (1-1), and the preferable range is also the same. As $R^2$ in the general formula (1-1-c), more preferably, an alkyl group, an aryl group, an alkenyl group, an alkynyl group, or a group obtained by allowing one of these groups to be substituted by arbitrary substituent(s) can be cited. From the viewpoint of the dissolution inhibition, $R^2$ has preferably no less than 2 carbon atoms, more preferably no less than 3 carbon atoms and particularly preferably, no less than 4 carbon atoms.

In the general formula (1-1-c), $R^4$ through $R^{13}$ each independently represent a hydrogen atom or a substituent. As the substituent, substituents that are cited as examples of $R^2$ and $R^3$ in the general formula (1-1) can be cited. Any two of $R^4$ through $R^{13}$ may be the same as each other or different from each other and may combine with each other to form a ring structure. $R^4$ through $R^{13}$ each may combine with $L^2$ or $R^2$ to form a ring structure. The bond between $C^3$ carbon atom and $C^1$ carbon atom, between $C^4$ carbon atom and $C^2$ carbon atom, between $C^3$ carbon atom and $L^2$, or between $C^4$ carbon atom and $L^2$ may be a double bond or a triple bond. In such a case, some of $R^4$ through $R^{11}$ do/does not exist in accordance with the existence of such double or triple bond. Further, $L^2$ itself may be a double bond connecting $C^3$ carbon atom and $C^4$ carbon atom. Also in this case, some of $R^4$ through $R^{11}$ do/does not exist in accordance with the existence of the double bond.

In the general formula (1-1-c), $Ar^1$ represents an aromatic ring group, preferably represents a substituted and non-substituted phenyl group, naphthyl group, anthranyl group, phenanthrenyl group, pyridyl group, pyrazyl group, imidazolyl group, quinolyl group, indolyl group, isoquinolyl group, pyrrolyl group, furanyl group, pyrazolyl group, triazolyl group, tetrazolyl group, oxazolyl group, oxadiazolyl group, thiazolyl group, pyrimidinyl group or the like. $Ar^1$ may combine with any one of $L^2$, $R^2$, $R^4$ through $R^{13}$ to form a ring structure.

In the general formula (1-1-c), n represents an integer which is no less than 0, preferably 0, 1, 2 or 3, more preferably 0, 1 or 2, and particularly preferably 0 or 1. When n is no less than 2, there are a plurality of $R^{12}$s and a plurality of $R^{13}$s. Any two of such a plurality of $R^{12}$s and a plurality of $R^{13}$s may be the same as each other or different from each other and may combine with each other to form a ring structure.

In the general formula (1-1-c), $L^2$ represents a divalent linkage group that, together with —$C^3$—$C^1$—$N^1$—$C^2$—$C^4$—, forms a ring structure, a single bond connecting $C^3$ and $C^4$, or a double bond connecting $C^3$ and $C^4$. In the case where $L^2$ represents a divalent linkage group, $L^2$ may have a substituent. As preferable examples of the ring structure containing $L^2$, 5- to 10-membered rings can be preferably cited. In view of the efficiency of removing dissolution inhibiting effect, 5- to 8-membered rings are preferable, and in view of the suitability for synthesis, 5- and 6-membered rings are preferable.

In the general formula (1-1-c), two substituents which are selected from $R^4$ through $R^{13}$ and are bonded to the same atom may be an identical atom or substituent so that a double bond is formed. (For instance, provided $R^4$=$R^5$=O, a carbonyl group (—CO—) may be formed.)

In the general formula (1-1-c), two substituents which are selected from $R^4$ through $R^{13}$ and are bonded to atoms adjoining each other may be an identical atom or substituent so that a 3-membered ring is formed. (For instance, provided $R^4$=$R^8$=oxygen atom, an epoxy group may be formed.)

Among compounds represented by the general formula (1-1), as a preferable example, compounds represented by the following general formula (1-1-d) can be cited.

General formula (1-1-d)

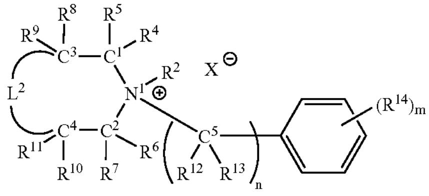

In the general formula (1-1-d), $R^2$ and $X^-$ each have the same definition respectively as $R^2$ or $X^-$ in the general formula (1-1), and the preferable range is also the same. As $R^2$ in the general formula (1-1-d), more preferably, an alkyl group, an aryl group, an alkenyl group, an alkynyl group, or a group obtained by allowing one of these groups to be substituted by arbitrary substituent(s) can be cited. From the viewpoint of the dissolution inhibition, $R^2$ has preferably no less than 2 carbon atoms, more preferably no less than 3 carbon atoms and particularly preferably, no less than 4 carbon atoms.

In the general formula (1-1-d), $R^4$ through $R^{14}$ each independently represent a hydrogen atom or a substituent. As the substituent, substituents that are cited as examples of $R^2$ and $R^3$ in the general formula (1-1) can be cited. Any two of $R^4$ through $R^{14}$ may be the same as each other or different from each other and may combine with each other to form a ring structure. $R^4$ through $R^{14}$ each may combine with $L^2$, $R^2$ or $R^3$ to form a ring structure. The bond between $C^3$ carbon atom and $C^1$ carbon atom, between $C^4$ carbon atom and $C^2$ carbon atom, between $C^3$ carbon atom and $L^2$, or between $C^4$ carbon atom and $L^2$ may be a double bond or a triple bond. In such a case, some of $R^4$ through $R^{11}$ do/does not exist in accordance with the existence of such double or triple bond. Further, $L^2$ itself may be a double bond connecting $C^3$ carbon atom and $C^4$ carbon atom. Also in this case, some of $R^4$ through $R^{11}$ do/does not exist in accordance with the existence of the double bond.

In the general formula (1-1-d), m represents an integer from 0 to 5. When m is no less than 2, there are a plurality of $R^{14}$s. Any two of such a plurality of $R^{14}$s may be the same as each other or different from each other and may combine with each other to form a ring structure.

In the general formula (1-1-d), n represents an integer which is no less than 0, preferably 0, 1, 2 or 3, more preferably 0, 1 or 2, and particularly preferably 0 or 1. When n is no less than 2, there are a plurality of $R^{12}$s and a plurality of $R^{13}$s. Any two of such a plurality of $R^{12}$s and a plurality of $R^{13}$s may be the same as each other or different from each other and may combine with each other to form a ring structure.

In the general formula (1-1-d), $L^2$ represents a divalent linkage group that, together with —$C^3$—$C^1$—$N^1$—$C^2$—$C^4$—, forms a ring structure, a single bond connecting $C^3$ and $C^4$, or a double bond connecting $C^3$ and $C^4$. In the case where $L^2$ represents a divalent linkage group, $L^2$ may have a substituent. As preferable examples of the ring structure containing $L^2$, 5- to 10-membered rings can be preferably cited. In view of the efficiency of removing dissolution inhibiting effect, 5- to 8-membered rings are preferable, and in view of the suitability for synthesis, 5- and 6-membered rings are preferable.

In the general formula (1-1-d), two substituents which are selected from $R^4$ through $R^{14}$ and are bonded to the same atom may be an identical atom or substituent so that a double bond is formed. (For instance, provided $R^4$=$R^5$=O, a carbonyl group (—CO—) may be formed.)

In the general formula (1-1-d), two substituents which are selected from $R^4$ through $R^{14}$ and are bonded to atoms adjoining each other may be an identical atom or substituent so that a 3-membered ring is formed. (For instance, provided $R^4$=$R^8$=oxygen atom, an epoxy group may be formed.)

Among compounds represented by the general formula (1-1), as a preferable example, compounds represented by the following general formula (1-1-e) can be cited.

General formula (1-1-e)

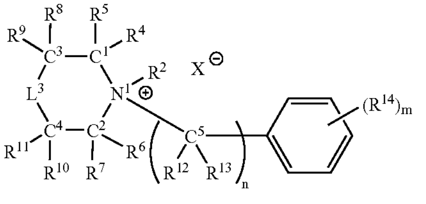

In the general formula (1-1-e), $R^2$ and $X^-$ each have the same definition respectively as $R^2$ or $X^-$ in the general formula (1-1), and the preferable range is also the same. As $R^2$ in the general formula (1-1-d), more preferably, an alkyl group, an aryl group, an alkenyl group, an alkynyl group, or a group obtained by allowing one of these groups to be substituted by arbitrary substituent(s) can be cited. From the viewpoint of the dissolution inhibition, $R^2$ has preferably no less than 2 carbon atoms, more preferably no less than 3 carbon atoms and particularly preferably, no less than 4 carbon atoms.

In the general formula (1-1-e), $R^4$ through $R^{14}$ each independently represent a hydrogen atom or a substituent. As the substituent, substituents that are cited as examples of $R^2$ and $R^3$ in the general formula (1-1) can be cited. Any two of $R^4$ through $R^{14}$ may be the same as each other or different from each other and may combine with each other to form a ring structure. $R^4$ through $R^{14}$ each may combine with $L^3$ or $R^2$ to form a ring structure. The bond between $C^3$ carbon atom and $C^1$ carbon atom, between $C^4$ carbon atom and $C^2$ carbon atom, between $C^3$ carbon atom and $L^3$, or between $C^4$ carbon atom and $L^3$ may be a double bond or a triple bond. In such a case, some of $R^4$ through $R^{11}$ do/does not exist in accordance with the existence of such double or triple bond. Further, $L^3$ itself may be a double bond connecting $C^3$ carbon atom and $C^4$ carbon atom. Also in this case, some of $R^4$ through $R^{11}$ do/does not exist in accordance with the existence of the double bond.

In the general formula (1-1-e), m represents an integer from 0 to 5. When m is no less than 2, there are a plurality of $R^{14}$s. Any two of such a plurality of $R^{14}$s may be the same as each other or different from each other and may combine with each other to form a ring structure.

In the general formula (1-1-e), n represents an integer which is no less than 0, preferably 0, 1, 2 or 3, more preferably 0, 1 or 2, and particularly preferably 0 or 1. When n is no less than 2, there are a plurality of $R^{12}$s and a plurality of $R^{13}$s. Any two of such a plurality of $R^{12}$s and a plurality of $R^{13}$s may be the same as each other or different from each other and may combine with each other to form a ring structure.

In the general formula (1-1-e), $L^3$ represents a divalent linkage group that, together with —$C^3$—$C^1$—$N^1$—$C^2$—$C^4$—, forms a ring structure, a single bond connecting $C^3$ and $C^4$, or a double bond connecting $C^3$ and $C^4$. As the divalent linkage group, —O—, —S—, —N($R^{L1}$)—, or —C($R^{L2}$)($R^{L3}$)— is preferable. $R^{L1}$ through $R^{L3}$ are selected from the group consisting of a hydrogen atom and the substituents that can be represented by $R^2$ or $R^3$ in the general formula (1-1). Each $R^{L1}$ through $R^{L3}$ may be bonded to any one of $R^2$ and $R^4$ through $R^{14}$ to form a ring structure. When the bond between $C^3$ and $L^3$ or between $C^4$ and $L^3$ is a double bond, some of $R^{L1}$ through $R^{L3}$ do/does not exist in accordance with the existence of the double bond.

In the general formula (1-1-e), two substituents which are selected from $R^4$ through $R^{14}$ and $R^{L1}$ through $R^{L3}$ and are bonded to the same atom may be an identical atom or substituent so that a double bond is formed. (For instance, provided $R^4$=$R^5$=O, a carbonyl group (—CO—) may be formed.)

In the general formula (1-1-e), two substituents which are selected from $R^4$ through $R^{14}$ and $R^{L1}$ through $R^{L3}$ and are bonded to atoms adjoining each other may be an identical atom or substituent so that a 3-membered ring is formed. (For instance, provided $R^4$=$R^8$=oxygen atom, an epoxy group may be formed.)

Among compounds represented by the general formula (1-1), as a preferable example, compounds represented by the following general formula (1-1-f) can be cited.

General formula (1-1-f)

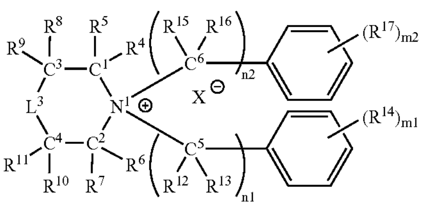

In the general formula (1-1-f), $R^4$ through $R^{17}$ each independently represent a hydrogen atom or a substituent. As the substituent, substituents that are cited as examples of $R^2$ and $R^3$ in the general formula (1-1) can be cited. Any two of $R^4$ through $R^{17}$ may be the same as each other or different from each other and may combine with each other to form a ring structure. $R^4$ through $R^{17}$ each may combine with $L^3$, $R^2$ or $R^3$ to form a ring structure. The bond between $C^3$ carbon atom and $C^1$ carbon atom, between $C^4$ carbon atom and $C^2$ carbon atom, between $C^3$ carbon atom and $L^3$, or between $C^4$ carbon atom and $L^3$ may be a double bond or a triple bond. In such a case, some of $R^4$ through $R^{11}$ do/does not exist in accordance with the existence of such double or triple bond. Further, $L^3$ itself may be a double bond connecting $C^3$ carbon atom and $C^4$ carbon atom. Also in this case, some of $R^4$ through $R^{11}$ do/does not exist in accordance with the existence of the double bond.

In the general formula (1-1-f), m1 and m2 each independently represent an integer from 0 to 5. When m1 or m2 is no less than 2, there are a plurality of $R^{14}$s or a plurality of $R^{17}$s. Any two of such a plurality of $R^{14}$s or $R^{17}$s may be the same as each other or different from each other and may combine with each other to form a ring structure.

In the general formula (1-1-f), n1 and n2 each independently represent an integer which is no less than 0, preferably 0, 1, 2 or 3, more preferably 0, 1 or 2, and particularly preferably 0 or 1. When n1 is no less than 2, there are a plurality of $R^{12}$s and a plurality of $R^{13}$s. Any two of such a plurality of $R^{12}$s and a plurality of $R^{13}$s may be the same as each other or different from each other and may combine with each other to form a ring structure. Similarly, when n2 is no less than 2, there are a plurality of $R^{15}$s and a plurality of $R^{16}$s. Any two of such a plurality of $R^{15}$s and a plurality of $R^{16}$s may be the same as each other or different from each other and may combine with each other to form a ring structure.

In the general formula (1-1-f), $L^3$ represents a divalent linkage group that, together with —$C^3$—$C^1$—$N^1$—$C^2$—$C^4$—, forms a ring structure, a single bond connecting $C^3$ and $C^4$, or a double bond connecting $C^3$ and $C^4$. As the divalent linkage group, —O—, —S—, —N($R^{L1}$)—, or —C($R^{L2}$)($R^{L3}$)— is preferable. $R^{L1}$ through $R^{L3}$ are selected from the group consisting of a hydrogen atom and the substituents that can be represented by $R^2$ or $R^3$ in the general formula (1-1). Each $R^{L1}$ through $R^{L3}$ may be bonded to any one of $R^2$ and $R^4$ through $R^{17}$ to form a ring structure. When the bond between $C^3$ and $L^3$ or between $C^4$ and $L^3$ is a double bond, some of $R^{L1}$ through $R^{L3}$ do/does not exist in accordance with the existence of the double bond.

In the general formula (1-1-f), two substituents which are selected from $R^4$ through $R^{17}$ and $R^{L1}$ through $R^{L3}$ and are bonded to the same atom may be an identical atom or substituent so that a double bond is formed. (For instance, provided $R^4$=$R^5$=O, a carbonyl group (—CO—) may be formed.)

In the general formula (1-1-f), two substituents which are selected from $R^4$ through $R^{17}$ and $R^{L1}$ through $R^{L3}$ and are bonded to atoms adjoining each other may be an identical atom or substituent so that a 3-membered ring is formed. (For instance, provided $R^4$=$R^8$=oxygen atom, an epoxy group may be formed.)

In the following, specific examples of compounds represented by the general formula (1-1) and preferably used in the invention are cited. However, any compounds that are represented by the general formula (1-1) can be selected and used. Accordingly, compounds usable in the invention are not limited to the compounds cited below. The compounds shown by the compound Nos. I-1 through I-62 are examples, whose N-containing rings are 6-membered rings, and the compounds shown by the compound Nos. II-1 through II-17 are examples, whose N-containing rings are 5-membered rings. The compounds shown by the compound Nos. III-1 through III-17 are examples, whose N-containing rings are 5-membered rings having methyl groups as substituents, and the compounds shown by the compound Nos. IV-1 through IV-17 are examples, whose N-containing rings are 6-membered rings also including O therein.

TABLE 1

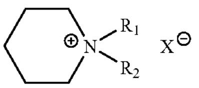

| Compound No. | $R^1$ | $R^2$ | $X^-$ |
| --- | --- | --- | --- |
| I-1 | 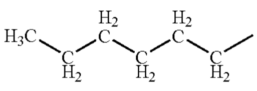 | 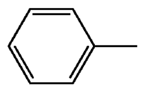 | $I^-$ |
| I-2 | 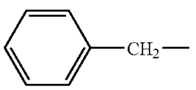 | 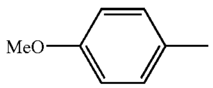 | $Br^-$ |

TABLE 1-continued
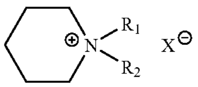
| Compound No. | $R^1$ | $R^2$ | $X^-$ |
|---|---|---|---|
| I-3 | 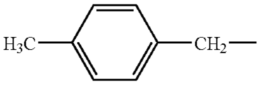 | 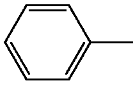 | $Br^-$ |
| I-4 | 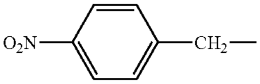 | 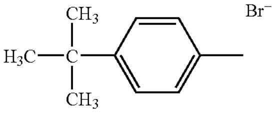 | $Br^-$ |
| I-5 | 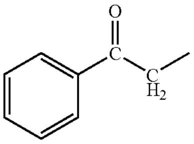 | 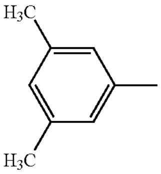 | $Br^-$ |
| I-6 | 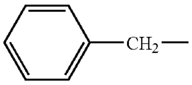 | 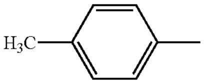 | $PF_6^-$ |
| I-7 | 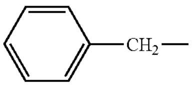 | 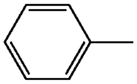 | $TsO^-$ |
| I-8 | 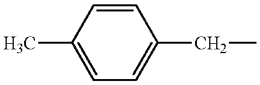 | 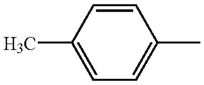 | $BF_4^-$ |
| I-9 | 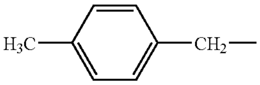 | 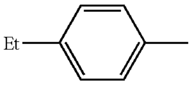 | $TsO^-$ |
| I-10 | 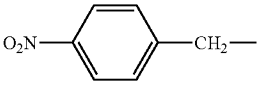 | 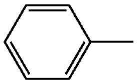 | $PF_6^-$ |
| I-11 | 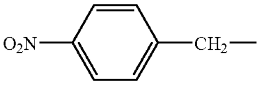 | 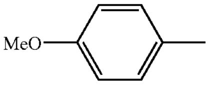 | $TsO^-$ |
| I-12 | 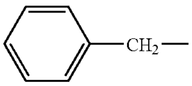 | 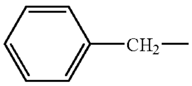 | $Br^-$ |
| I-13 | 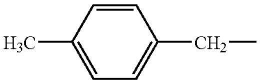 | 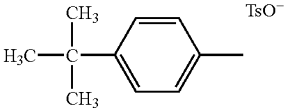 | $TsO^-$ |

TABLE 2
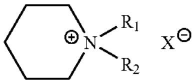
| Compound No. | $R^1$ | $R^2$ | $X^-$ |
|---|---|---|---|
| I-14 | 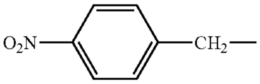 | 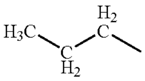 | $PF_6^-$ |
| I-15 | 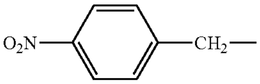 | 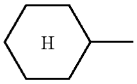 | $TsO^-$ |
| I-16 | 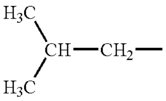 | 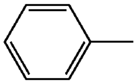 | $PF_6^-$ |
| I-17 | 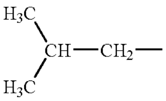 | 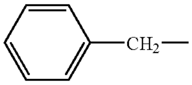 | $TsO^-$ |
| I-18 | 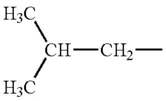 | 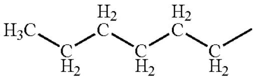 | $PF_6^-$ |
| I-19 | 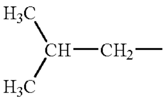 | 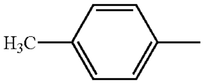 | $TsO^-$ |
| I-20 | 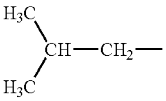 | 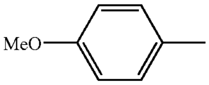 | $TsO^-$ |
| I-21 | 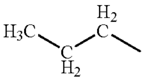 | 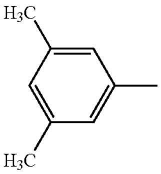 | $TsO^-$ |
| I-22 | 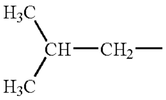 | 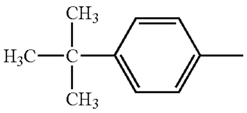 | $TsO^-$ |
| I-23 | 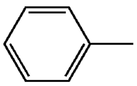 | 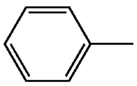 | $TsO^-$ |
| I-24 | 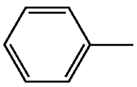 | 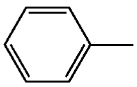 | $PF_6^-$ |
| I-25 | 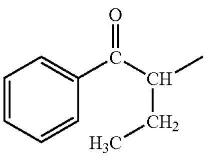 | 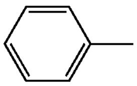 | $TsO^-$ |

TABLE 3
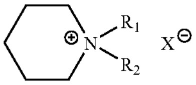
| Compound No. | $R^1$ | $R^2$ | $X^-$ |
| --- | --- | --- | --- |
| I-26 | 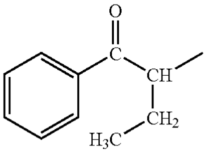 | 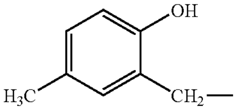 | $TsO^-$ |
| I-27 | 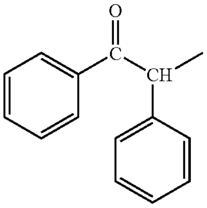 | 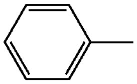 | $TsO^-$ |
| I-28 | 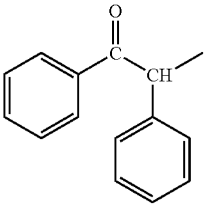 | 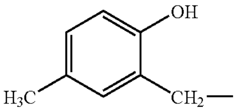 | $TsO^-$ |
| I-29 | 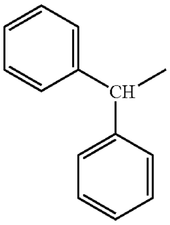 | 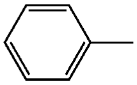 | $TsO^-$ |
| I-30 | 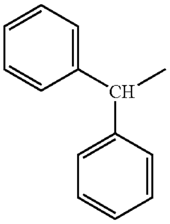 | 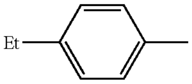 | $TsO^-$ |
| I-31 | 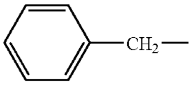 | 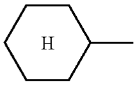 | $TsO^-$ |
| I-32 | 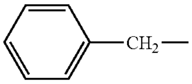 | 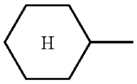 | $Br^-$ |
| I-33 | 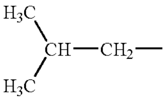 | 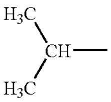 | $TsO^-$ |

TABLE 3-continued
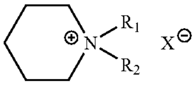
| Compound No. | $R^1$ | $R^2$ | $X^-$ |
|---|---|---|---|
| I-34 | 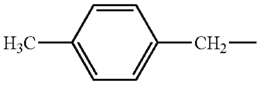 | 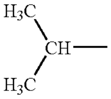 | $TsO^-$ |
TABLE 4
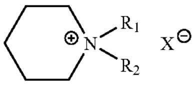
| Compound No. | $R^1$ | $R^2$ | $X^-$ |
|---|---|---|---|
| I-35 | 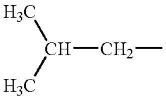 | 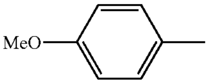 | $BF_4^-$ |
| I-36 | 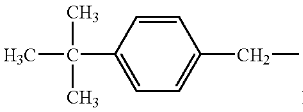 | 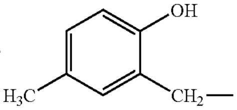 | $TsO^-$ |
| I-37 | 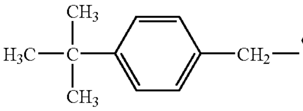 | 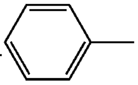 | $BF_4^-$ |
| I-38 | 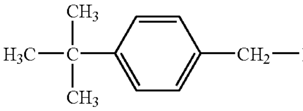 | 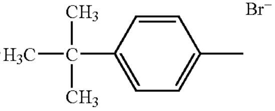 | $Br^-$ |
| I-39 | 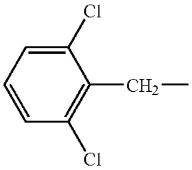 | 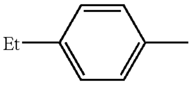 | $Br^-$ |
| I-40 | 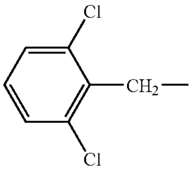 | 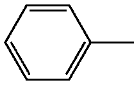 | $Br^-$ |
| I-41 | 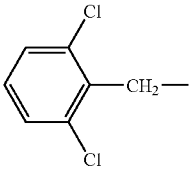 | 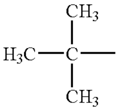 | $TsO^-$ |

TABLE 4-continued
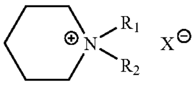
| Compound No. | $R^1$ | $R^2$ | $X^-$ |
|---|---|---|---|
| I-42 | 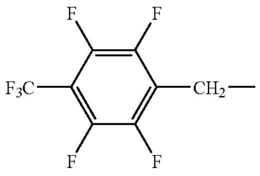 | 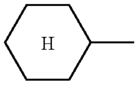 | $TsO^-$ |
| I-43 | 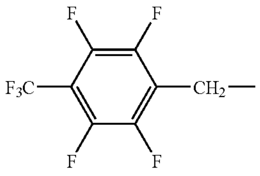 | 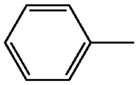 | $Br^-$ |
TABLE 5
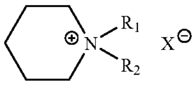
| Compound No. | $R^1$ | $R^2$ | $X^-$ |
|---|---|---|---|
| I-44 | 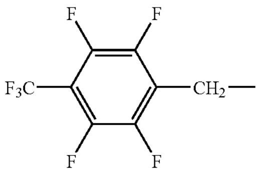 | 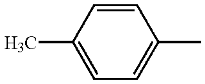 | $Br^-$ |
| I-45 | 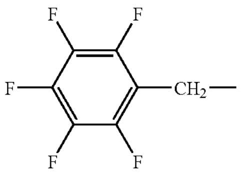 | 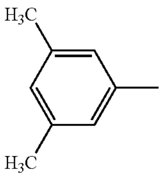 | $PF_6^-$ |
| I-46 | 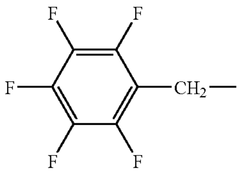 | 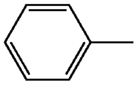 | $BF_4^-$ |
| I-47 | 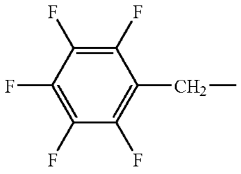 | 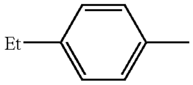 | $TsO^-$ |
| I-48 | 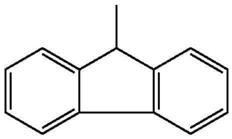 | 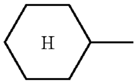 | $Br^-$ |

TABLE 5-continued
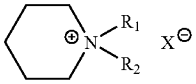
| Compound No. | $R^1$ | $R^2$ | $X^-$ |
|---|---|---|---|
| I-49 | 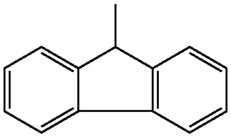 | 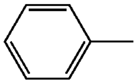 | $PF_6^-$ |
| I-50 | 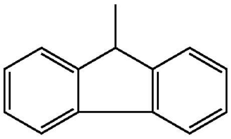 | 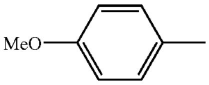 | $Br^-$ |
| I-51 | 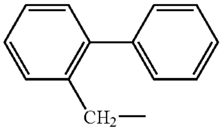 | 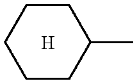 | $TsO^-$ |
| I-52 | 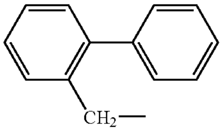 | 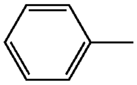 | $TsO^-$ |
TABLE 6
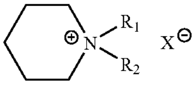
| Compound No. | $R^1$ | $R^2$ | $X^-$ |
|---|---|---|---|
| I-53 | 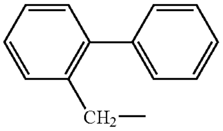 | 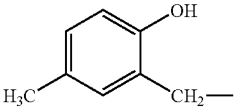 | $PF_6^-$ |
| I-54 | 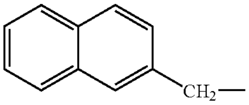 | 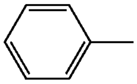 | $Br^-$ |
| I-55 | 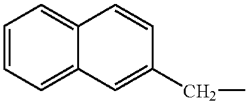 | 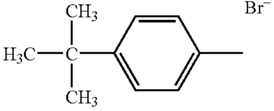 | $Br^-$ |
| I-56 | 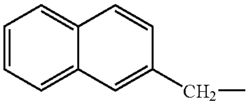 | 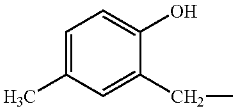 | $TsO^-$ |

TABLE 6-continued
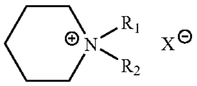
| Compound No. | $R^1$ | $R^2$ | $X^-$ |
|---|---|---|---|
| I-57 | 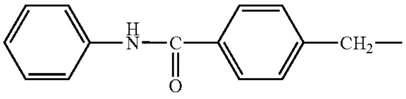 | 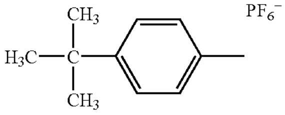 | $PF_6^-$ |
| I-58 | 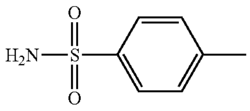 | 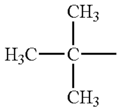 | $Br^-$ |
| I-59 | 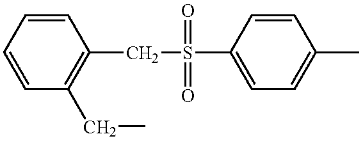 | 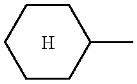 | $TsO^-$ |
| I-60 | 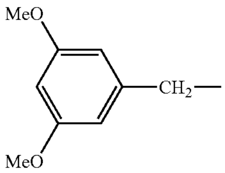 | 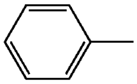 | $PF_6^-$ |
| I-61 | 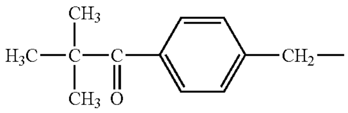 | 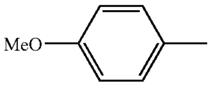 | $Br^-$ |
| I-62 | 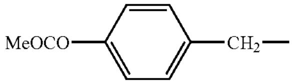 | 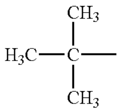 | $TsO^-$ |
TABLE 7
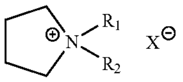
| Compound No. | $R^1$ | $R^2$ | $X^-$ |
|---|---|---|---|
| II-1 | 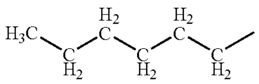 | 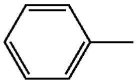 | $I^-$ |
| II-2 | 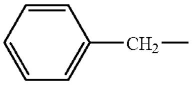 | 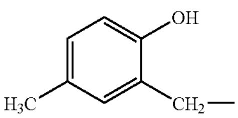 | $PF_6^-$ |
| II-3 | 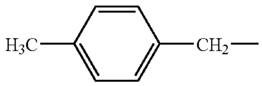 | 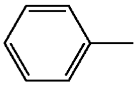 | $TsO^-$ |

TABLE 7-continued
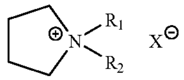
| Compound No. | $R^1$ | $R^2$ | $X^-$ |
|---|---|---|---|
| II-4 | 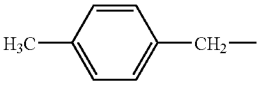 | 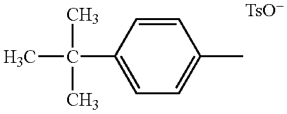 | $TsO^-$ |
| II-5 | 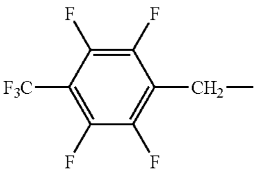 | 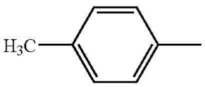 | $Br^-$ |
| II-6 | 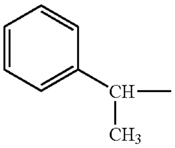 | 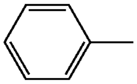 | $PF_6^-$ |
| II-7 | 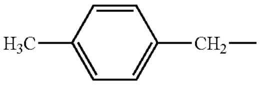 | 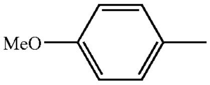 | $Br^-$ |
| II-8 | 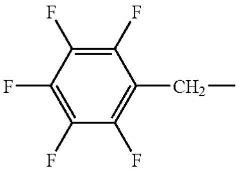 | 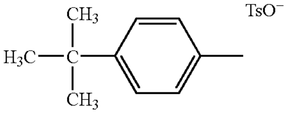 | $TsO^-$ |
| II-9 | 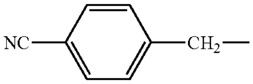 | 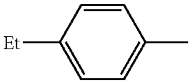 | $Br^-$ |
| II-10 | 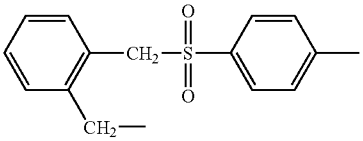 | 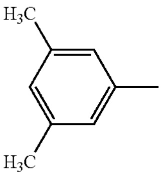 | $PF_6^-$ |
TABLE 8
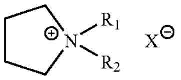
| Compound No. | $R^1$ | $R^2$ | $X^-$ |
|---|---|---|---|
| II-11 | 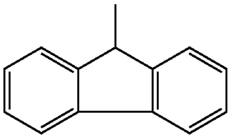 | 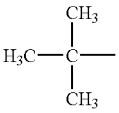 | $Br^-$ |

TABLE 8-continued
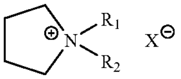
| Compound No. | $R^1$ | $R^2$ | $X^-$ |
|---|---|---|---|
| II-12 | 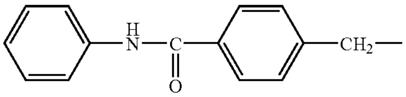 | 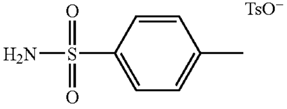 | $TsO^-$ |
| II-13 | 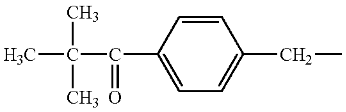 | 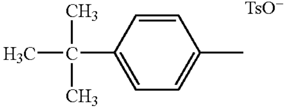 | $TsO^-$ |
| II-14 | 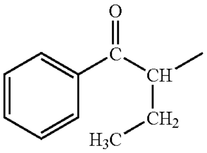 | 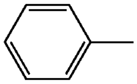 | $TsO^-$ |
| II-15 | 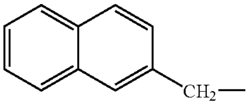 | 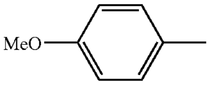 | $TsO^-$ |
| II-16 | 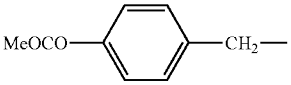 | 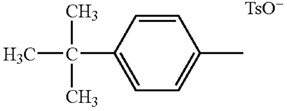 | $TsO^-$ |
| II-17 | 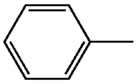 | 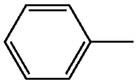 | $TsO^-$ |
TABLE 9
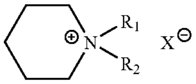
| Compound No. | $R^1$ | $R^2$ | $X^-$ |
|---|---|---|---|
| III-1 | 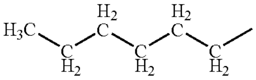 | 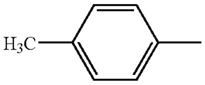 | $I^-$ |
| III-2 | 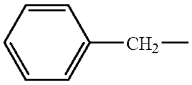 | 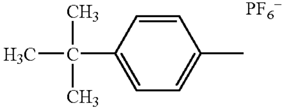 | $PF_6^-$ |
| III-3 | 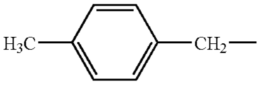 | 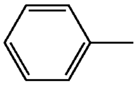 | $Br^-$ |
| III-4 | 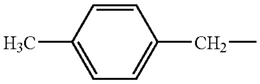 | 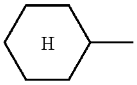 | $Br^-$ |

TABLE 9-continued
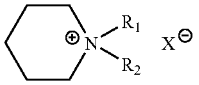
| Compound No. | $R^1$ | $R^2$ | $X^-$ |
|---|---|---|---|
| III-5 | 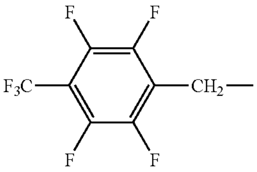 | 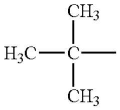 | $Br^-$ |
| III-6 | 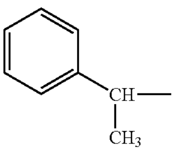 | 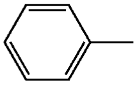 | $PF_6^-$ |
| III-7 | 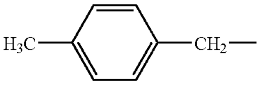 | 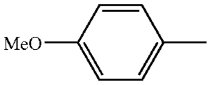 | $Br^-$ |
| III-8 | 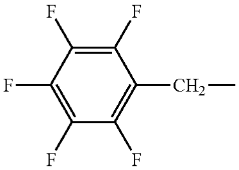 | 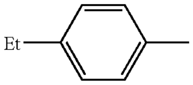 | $TsO^-$ |
| III-9 | 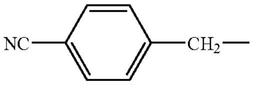 | 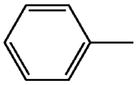 | $Br^-$ |
| III-10 | 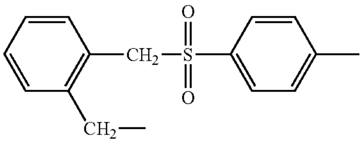 | 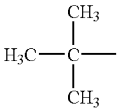 | $PF_6^-$ |
| III-11 | 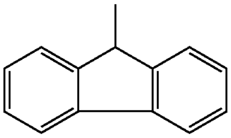 | 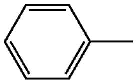 | $Br^-$ |
TABLE 10
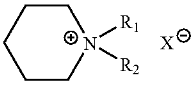
| Compound No. | $R^1$ | $R^2$ | $X^-$ |
|---|---|---|---|
| III-12 | 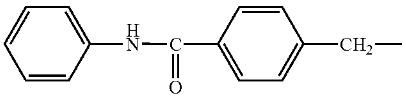 | 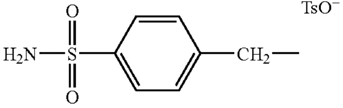 | $TsO^-$ |

TABLE 10-continued
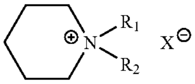
| Compound No. | $R^1$ | $R^2$ | $X^-$ |
|---|---|---|---|
| III-13 | 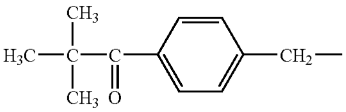 | 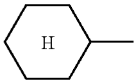 | $TsO^-$ |
| III-14 | 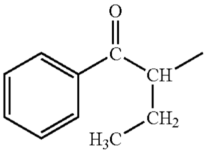 | 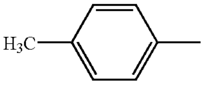 | $TsO^-$ |
| III-15 | 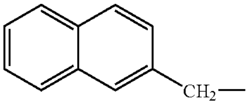 | 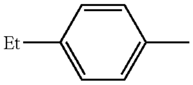 | $TsO^-$ |
| III-16 | 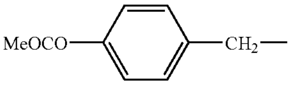 | 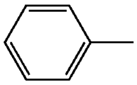 | $TsO^-$ |
| III-17 | 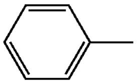 | 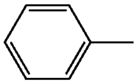 | $TsO^-$ |
TABLE 11
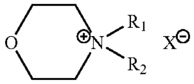
| Compound No. | $R^1$ | $R^2$ | $X^-$ |
|---|---|---|---|
| IV-1 | 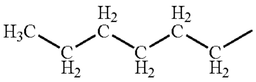 | 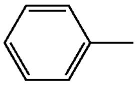 | $I^-$ |
| IV-2 | 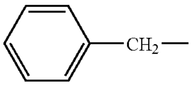 | 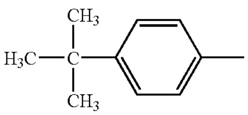 | $PF_6^-$ |
| IV-3 | 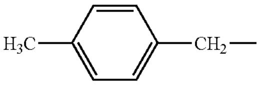 | 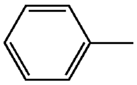 | $Br^-$ |
| IV-4 | 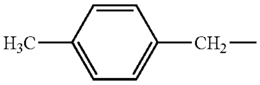 | 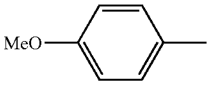 | $Br^-$ |
| IV-5 | 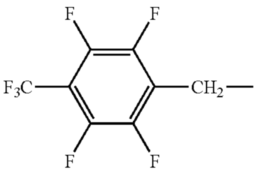 | 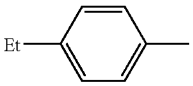 | $Br^-$ |

TABLE 11-continued
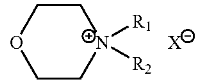
| Compound No. | R¹ | R² | X⁻ |
|---|---|---|---|
| IV-6 | 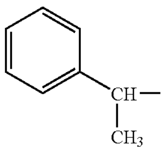 | 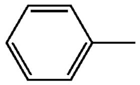 | $PF_6^-$ |
| IV-7 | 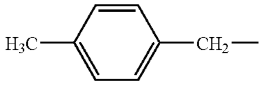 | 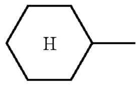 | $Br^-$ |
| IV-8 | 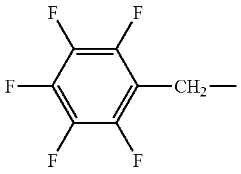 | 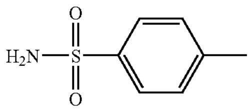 | $TsO^-$ |
| IV-9 | 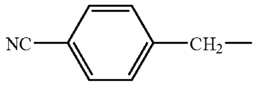 | 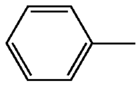 | $Br^-$ |
| IV-10 | 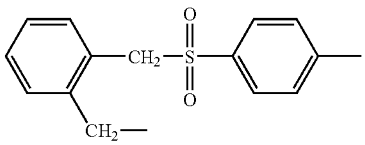 | 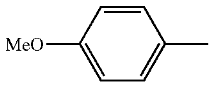 | $PF_6^-$ |
| IV-11 | 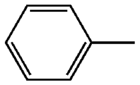 | 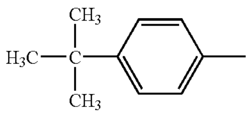 | $Br^-$ |
TABLE 12
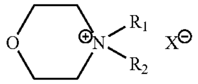
| Compound No. | R¹ | R² | X⁻ |
|---|---|---|---|
| IV-12 | 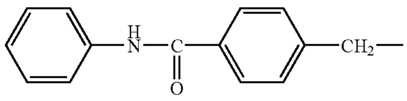 | 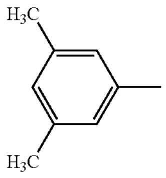 | $TsO^-$ |
| IV-13 | 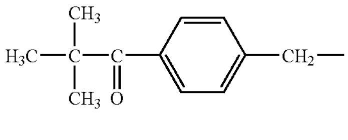 | 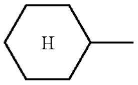 | $TsO^-$ |

TABLE 12-continued
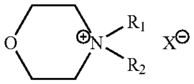
| Compound No. | $R^1$ | $R^2$ | $X^-$ |
|---|---|---|---|
| IV-14 | 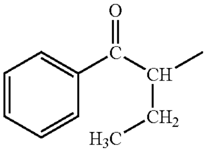 | 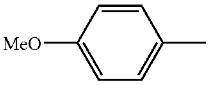 | $TsO^-$ |
| IV-15 | 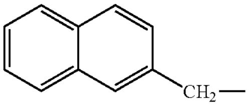 | 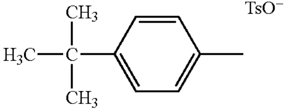 | $TsO^-$ |
| IV-16 | 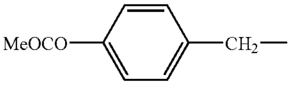 | 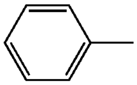 | $TsO^-$ |
| IV-17 | 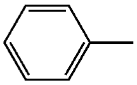 | 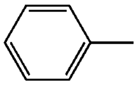 | $TsO^-$ |
Furthermore, the following various compounds shown by the compound Nos. V-1 through V-20 are also preferably used as the compounds that are represented by the general formula (1-1) and can exhibit an effect according to the invention.
V-1
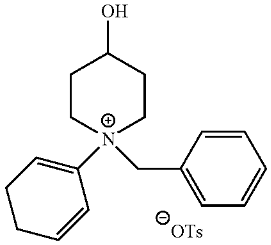
V-2
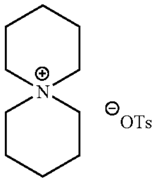
V-3
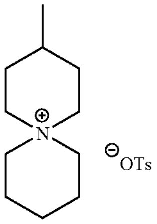
-continued
V-4
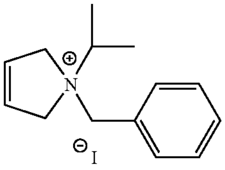
V-5
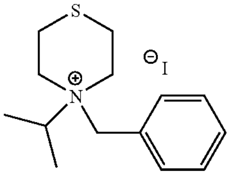
V-6
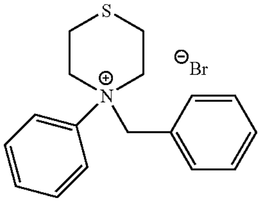
V-7
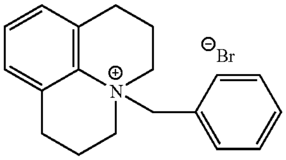

-continued

V-8

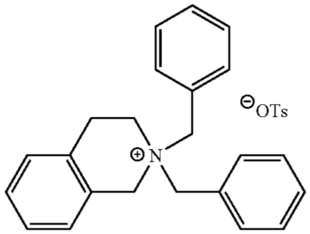

V-9

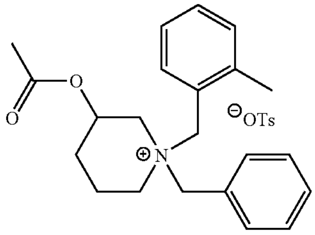

V-10

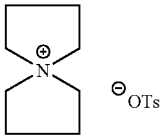

V-11

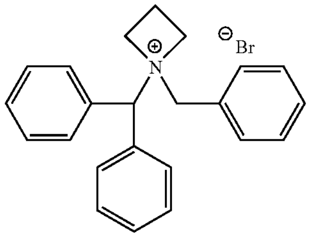

V-12

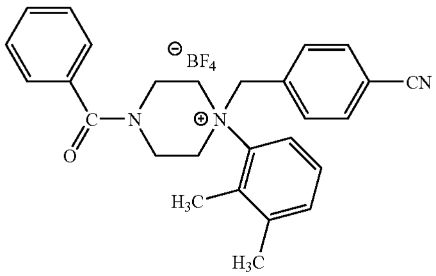

V-13

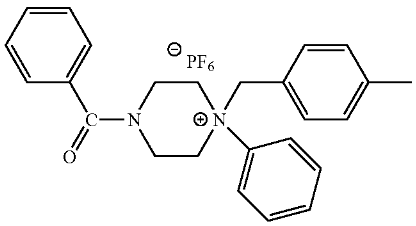

V-14

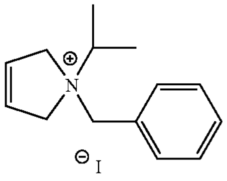

-continued

V-15

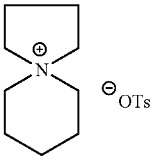

V-16

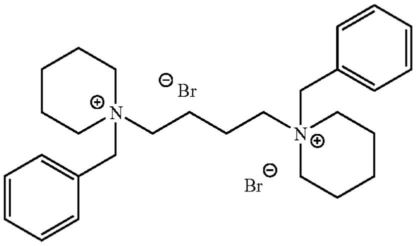

V-17

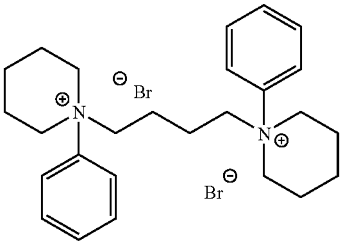

V-18

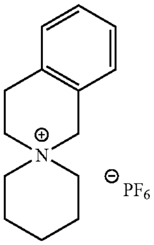

V-19

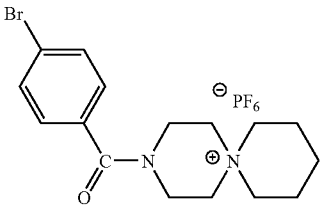

V-20

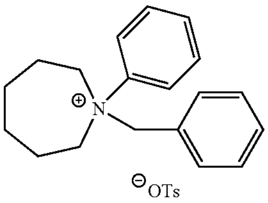

The compound represented by the general formula (1-1) that is used in an image forming material according to the invention may be used singly or a multiple kinds of the compounds represented by the general formula (1-1) may be used in combination. The content of the compound represented by the general formula (1-1) is, from the viewpoint of the film formability, preferably not higher than 50% based on the mass of a whole solids content in an image forming layer. From the viewpoint of excellent image formability, the content is preferably in the range of from 0.1 to 30% based on the mass of a whole solids content in an image forming layer. And from the viewpoint of providing both of excellent image formability and excellent printing properties such as printing durability, the content is most preferably in the range of from 0.5 to 15% based on the mass of a whole solids content in an image forming layer.

((C) Onium Salts Represented by General Formula (1-2))

A second image forming layer according to the invention includes an onium salt (particular onium salt) represented by the following general formula (1-2).

$X^-M^+$ General formula (1-2)

(In the general formula (1-2), $X^-$ represents an anion that has at least one substituent having an alkali dissociative proton. $M^+$ represents a counter cation selected from sulfonium, iodonium, ammonium, phosphonium and oxonium.)

It is considered that when an onium salt represented by the general formula (1-2) is added to an image forming layer, the onium salt can achieve a solubility improvement only in an exposed portion without substantially damaging the dissociation inhibition power due to a structure of an onium mother nucleus in an unexposed portion and that this effect of the onium salt is caused by the alkali dissociative substituent on the counter anion. Further, it is considered that in the heat-example exposure system, the flexibility of the matrix is improved owing to strong heat generation during the exposure, and, at this moment, the degree of freedom of movement in the film is improved. The counter anion, not fixed to the cation mother nucleus through a covalent bond, has high degree of freedom of movement during the exposure and tends to cause a large positional change. It is inferred that the resultant change, that is, removing of the dissolution inhibiting effect in an exposed portion, can be maintained even after the instantaneous heat generated by the exposure disappears, and the storability after exposure is improved thereby.

Accordingly, it is considered that such particular onium salt in an image forming layer, together with the action of the particular novolac resin, contributes to the excellent effect of the invention.

In the following, the onium salt represented by the general formula (1-2) will be detailed.

As the substituent having an alkali dissociative proton in an anion expressed by the $X^-$, a phenolic hydroxyl group (Ar—OH), a carboxyl group (—COOH), a mercapto group (—SH), a phosphonic acid group ($—PO_3H_2$), a phosphoric acid group ($—OPO_3H_2$), a sulfonamide group ($—SO_2NH_2$, $—SO_2NHR$), a substituted sulfonamide type acidic group (hereinafter, referred to as "active imide group"; such as $—SO_2NHCOR$, $—SO_2NHSO_2R$, $—CONHSO_2R$), a sulfonic acid group ($—SO_3H$), a sulfinic acid group ($—SO_2H$), a $—C(CF_3)_2OH$, or a $—COCH_2COCF_3$ can be preferably used. Here, Ar represents an aryl group that may have a substituent, and R represents a hydrocarbon group that may have a substituent. As the substituents that provide excellent balance between the dissolution inhibiting effect and the sensitivity, a phenolic hydroxyl group, a carboxyl group, a mercapto group, a sulfonamide group, an active imide group, a $—C(CF_3)_2OH$ and $—COCH_2COCF_3$ can be cited. A phenolic hydroxyl group and a carboxyl group are most preferable.

$X^-$ preferably represents an anion which is a conjugate base of Broensted acid and more preferably represents an anion which is a conjugate base of an organic acid. The organic acid can be selected from sulfonic acids, carboxylic acids, phosphonic acids, phenols, active imides and sulfinic acids. The organic acid has pKa which is preferably smaller than 3 and more preferably smaller than 1. The organic acid is particularly preferably a sulfonic acid.

The counter cation expressed by $M^+$ is selected from sulfonium ions, iodonium ions, ammonium ions, phosphonium ions, and oxonium ions. From the viewpoint of the dissolution inhibiting effect, sulfonium ions, iodonium ions and quaternary ammonium ions are preferable, and quaternary ammonium ions are most preferable.

As a preferable example of the quaternary ammonium, a structure represented by the following general formula (M) can be cited.

General formula (M)

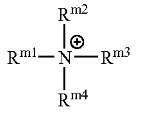

In the general formula (M), $R^{m1}$ through $R^{m4}$ each independently represent a substituent that contains one or more carbon atoms and any two of $R^{m1}$ through $R^{m4}$ may combine with each other to form a ring structure.

As the substituents including one or more carbon atoms represented by the $R^{m1}$ through $R^{m4}$, the following ones can be exemplified.

For instance, alkyl groups (each preferably having 1 to 20 carbon atoms, more preferably 1 to 16 carbon atoms, and particularly preferably 1 to 12 carbon atoms; specifically, such as a methyl group, an ethyl group, an n-butyl group, an iso-propyl group, a tert-butyl group, an n-octyl group, an n-decyl group, an n-hexadecyl group, a cyclopropyl group, a cyclopentyl group, a cyclohexyl group, and a 2-cyclohexylethyl group), alkenyl groups (each preferably having 2 to 20 carbon atoms, more preferably 2 to 12 carbon atoms, and particularly preferably 2 to 8 carbon atoms; such as a vinyl group, an allyl group, a 2-butenyl group, a 3-pentenyl group, a 2-cyclohexenylmethyl group), alkynyl groups (each preferably having 2 to 20 carbon atoms, more preferably 2 to 12 carbon atoms, and particularly preferably 2 to 8 carbon atoms; such as a propargyl group and a 3-pentynyl group), aryl groups (each preferably having 6 to 30 carbon atoms, more preferably 6 to 20 carbon atoms, and particularly preferably 6 to 12 carbon atoms; such as a phenyl group, a p-methyl phenyl group, and a naphthyl group) can be cited.

These substituents may be further substituted. When a substituent represented by $R^{m1}$ through $R^{m4}$ has a plurality of such further substituents, any two of such further substituents may be same as each other or different from each other, and may be bonded to form a ring.

Each $R^{m1}$ through $R^{m4}$ is preferably an alkyl group, an aryl group, or a group obtained by allowing an alkyl group or an aryl group to be substituted by arbitrary substituent(s). From the viewpoint of the alkali-resistance of an image portion, a sum of the numbers of carbon atoms of the $R^{m1}$ through $R^{m4}$ is preferably from 8 to 80, more preferably from 10 to 64 and particularly preferably from 12 to 48. When the sum of the numbers of the carbon atoms is too few, since the hydrophilicity of the molecule becomes too high, the water resistance sometimes becomes poor. On the other hand, when the sum of the numbers of the carbon atoms is too much, the influence of the cation portion is diminished, and the dissolution inhibiting effect is sometimes deteriorated.

As a preferable example of the quaternary ammonium, a structure represented by the following general formula (M-1) can be cited.

General formula (M-1)

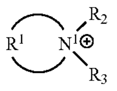

In the general formula (M-1), $R^1$ represents a residue that, together with $N^1$ atom, forms a ring structure. $R^2$ and $R^3$ each independently represent an organic group and may be bonded to each other to form a ring structure. At least one of $R^2$ and $R^3$ may be bonded to $R^1$ to form a ring structure.

The residue represented by $R^1$ may be any divalent organic group that, together with forms $N^1$ atom, forms a ring structure. The ring structure is not limited to a hydrocarbon-based ring structure and may contain a plurality of nitrogen atoms or may include another hetero atom such as an oxygen atom or a sulfur atom. The ring structure may include a double bond therein and may be polycyclic.

As a preferable example of the ring structure formed by $R^1$ and $N^1$, 3- to 10-membered rings can be cited. From the viewpoint of efficiently removing the dissolution inhibiting effect, 3- to 8-membered rings are preferable. And in view of the suitability for synthesis, 5- and 6-membered rings are preferable.

The ring structure formed by $R^1$ and $N^1$ may have a substituent and as the substituent that can be introduced, an alkyl group, an aryl group, a halogen atom or the like can be cited.

Each $R^2$ and $R^3$ may be same or different and may be arbitrarily selected from organic groups. However, in view of the inhibition, that is, in view of exhibiting a strong dissolution inhibiting effect, it is preferable that $R^2$ and $R^3$ each independently represent an aryl group, a group represented by the following general formula (2-2), or such an alkyl group that the sum of the numbers of the carbon atoms of $R^2$ and $R^3$ is no less than 6. Preferably, at least one of $R^2$ and $R^3$ has a branched structure or a ring structure. Furthermore, in view of the efficiency of removing the dissolution inhibiting effect, preferably, at least one of $R^2$ and $R^3$ contains an aromatic ring, and more preferably, both $R^2$ and $R^3$ contain aromatic rings.

General formula (2-2)

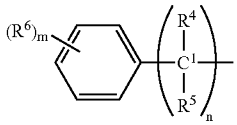

In the general formula (2-2), each $R^4$, $R^5$ and $R^6$ represents any possible substituent and may be same or different. Any two of $R^4$, $R^5$, and $R^6$ may be bonded to each other to form a ring. The bond between $R^4$ or $R^5$ and $C^1$ may be a double bond and in such a case, $R^4$ and $R^5$ represent an identical group. And n represents an integer of 0 or 1. Further, m represents an integer from 0 to 5. When there are a plurality of $R^6$s, any two of such $R^6$s may be the same as each other or different from each other, and may combine with each other to form a ring structure. In the case where n is 1, from the viewpoint of the suitability for synthesis, it is preferable that at least one of $R^4$ and $R^5$ is a hydrogen atom and it is most preferable that both of $R^4$ and $R^5$ are hydrogen atoms.

As the substituents represented by the $R^2$ and $R^3$, the followings can be cited. For instance, alkyl groups (preferably having 1 to 20 carbon atoms, more preferably 1 to 16 carbon atoms, and particularly preferably 1 to 12 carbon atoms, specifically, such as a methyl group, an ethyl group, an n-butyl group, an iso-propyl group, a tert-butyl group, an n-octyl group, an n-decyl group, an n-hexadecyl group, a cyclopropyl group, a cyclopentyl group, a cyclohexyl group, and a 2-cyclohexylethyl group), alkenyl groups (preferably having 2 to 20 carbon atoms, more preferably 2 to 12 carbon atoms, and particularly preferably 2 to 8 carbon atoms, such as a vinyl group, an allyl group, a 2-betenyl group, a 3-pentenyl group, and a 2-cyclohexenylmethyl group), alkynyl groups (preferably having 2 to 20 carbon atoms, more preferably 2 to 12 carbon atoms, and particularly preferably 2 to 8 carbon atoms, such as a propargyl group and a 3-pentynyl group), aryl groups (preferably having 6 to 30 carbon atoms, more preferably 6 to 20 carbon atoms, and particularly preferably 6 to 12 carbon atoms, such as a phenyl group, a p-methyl phenyl group, and a naphthyl group), amino groups (preferably having 0 to 20 carbon atoms, more preferably 0 to 12 carbon atoms, and particularly preferably 0 to 6 carbon atoms, such as an amino group, a methylamino group, a dimethylamino group, a diethylamino group, a diphenylamino group, and a dibenzylamino group), alkoxy groups (preferably having 1 to 20 carbon atoms, more preferably 1 to 12 carbon atoms, and most preferably 1 to 8 carbon atoms, such as a methoxy group, an ethoxy group, and a butoxy group), aryloxy groups (preferably having 6 to 20 carbon atoms, more preferably 6 to 16 carbon atoms, and particularly preferably 6 to 12 carbon atoms, such as a phenyloxy group and a 2-naphthyloxy group), acyl groups (preferably having 1 to 20 carbon atoms, more preferably 1 to 16 carbon atoms, and particularly preferably 1 to 12 carbon atoms, such as an acetyl group, a benzoyl group, a formyl group, and a pivaloyl group), alkoxycarbonyl groups (preferably having 2 to 20 carbon atoms, more preferably 2 to 16 carbon atoms, and particularly preferably 2 to 12 carbon atoms, such as a methoxycarbonyl group and an ethoxycarbonyl group), aryloxycarbonyl groups (preferably having 7 to 20 carbon atoms, more preferably 7 to 16 carbon atoms, and particularly preferably 7 to 10 carbon atoms, such as a phenyloxycarbonyl group), acyloxy groups (preferably having 2 to 20 carbon atoms, more preferably 2 to 16 carbon atoms, and particularly preferably 2 to 10 carbon atoms, such as an acetoxy group and a benzoyloxy group), acylamino groups (preferably having 2 to 20 carbon atoms, more preferably 2 to 16 carbon atoms, and particularly preferably 2 to 10 carbon atoms, such as an acetylamino group and a benzoylamino group), alkoxycarbonylamino groups (preferably having 2 to 20 carbon atoms, more preferably 2 to 16 carbon atoms, and particularly preferably 2 to 12 carbon atoms, such as a methoxycarbonylamino group), aryloxycarbonylamino groups (preferably having 7 to 20 carbon atoms, more preferably 7 to 16 carbon atoms, and particularly preferably 7 to 12 carbon atoms, such as a phenyloxycarbonylamino group), sulfonylamino groups (preferably having 1 to 20 carbon atoms, more preferably 1 to 16 carbon atoms, and particularly preferably 1 to 12 carbon atoms, such as a methanesulfonylamino group and a benzenesulfonylamino group), sulfamoyl groups (preferably having 0 to 20 carbon atoms, more preferably 0 to 16 carbon atoms, and particularly preferably 0 to 12 carbon atoms, such as a sulfamoyl group, a methylsulfamoyl group, a dimethylsulfamoyl group, and a phenylsulfamoyl group), carbamoyl groups (preferably having 1 to 20 carbon atoms, more preferably 1 to 16 carbon atoms, and particularly preferably 1 to 12 carbon atoms, such as a carbamoyl group, a methylcarbamoyl group, a diethylcarbamoyl group, and a phenylcarbamoyl group), alkylthio groups (preferably having 1 to 20 carbon atoms, more preferably 1 to 16 carbon atoms, and particularly preferably 1 to 12 carbon atoms, such as a methylthio group and an ethylthio group), arylthio groups (preferably having 6 to 20 carbon atoms, more preferably 6 to 16 carbon atoms, and particularly preferably 6 to 12 carbon atoms, such as a phenylthio group), sulfonyl groups (preferably having 1 to 20 carbon atoms, more preferably 1 to 16 carbon atoms, and particularly preferably 1 to 12 carbon atoms, such as a mesyl group and a tosyl group), sulfinyl groups (preferably having 1 to 20 carbon atoms, more preferably 1 to 16 carbon atoms, and particularly preferably 1 to 12 carbon atoms, such as a methanesulfinyl group and a benzenesulfinyl group), ureido groups (preferably having 1 to 20 carbon atoms, more preferably 1 to 16 carbon atoms, and particularly preferably 1 to 12 carbon atoms, such as a ureido group, a methylureido group, and a phenylureido group), phosphoric acid amide groups (preferably having 1 to 20 carbon atoms, more preferably 1 to 16 carbon atoms and particularly preferably 1 to 12 carbon atoms, such as a diethylphosphoric acid amide group and a phenylphosphoric acid amide group), a hydroxyl group, a mercapto group, halogen atoms (for instance, a fluorine atom, a chlorine atom, a bromine atom and an iodine atom), a cyano group, a sulfo group, a carboxyl group, a nitro group, a hydroxamic acid group, a sulfino group, a hydrazino group, an imino group, a heterocyclic groups (preferably including 1 to 30 carbon atoms and more preferably 1 to 12 carbon atoms and further including a nitrogen atom, an oxygen atom or a sulfur atom as a heteroatom, such as an imidazolyl group, a pyridyl group, a quinolyl group, a furyl group, a thienyl group, a piperidyl group, a morpholino group, a benzoxazolyl group, a benzoimidazolyl group, a benzothiazolyl group, a carbazolyl group, an azepinyl group, and an oxiranyl group), and silyl groups (preferably having 3 to 40 carbon atoms, more preferably 3 to 30 carbon atoms and particularly preferably 3 to 24 carbon atoms, such as a trimethylsilyl group and a triphenylsilyl group) can be cited.

These substituents may be further substituted. Furthermore, when two or more such further substituents are present, these may be the same as or different from one another. Still furthermore, if possible, such plural substituents may combine with each other to form a ring.

$R^2$ and $R^3$ are each preferably an alkyl group, an aryl group, an alkenyl group, an alkynyl group, or a group obtained by allowing one of these groups to be substituted by arbitrary substituent(s). Furthermore, in view of the dissolution inhibiting effect, a sum of the numbers of carbon atoms of $R^2$ and $R^3$ is preferably 6 or more, more preferably 8 or more, and most preferably 10 or more.

As a preferable example of the quaternary ammonium, a structure represented by the following general formula (M-2) can be cited.

General formula (M-2)

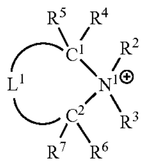

In the general formula (M-2), $R^2$ and $R^3$ each have the same definition as that of $R^2$ or $R^3$ in the general formula (M-1) and preferable ranges thereof are also the same. $R^2$ and $R^3$ in the general formula (M-2) are each preferably an alkyl group, an aryl group, an alkenyl group, an alkynyl group, or a group obtained by allowing one of these groups to be substituted by arbitrary substitutent(s). In view of the dissolution inhibiting effect, a sum of the numbers of carbon atoms of $R^2$ and $R^3$ is preferably 6 or more, more preferably 8 or more, and most preferably 10 or more.

Furthermore, in the general formula (M-2), $R^4$ through $R^7$ each independently represent a hydrogen atom or a substituent. The substituent may be any of the substituents cited as examples of $R^2$ and $R^3$ in the general formula (M-1). Any two of $R^4$ through $R^7$ may be the same as or different from each other, and may combine with each other to form a ring structure. $R^4$ through $R^7$ each may combine with $L^1$, $R^2$ or $R^3$ to form a ring structure. In the case where the bond between $L^1$ and $C^1$ carbon atom or between $L^1$ and $C^2$ carbon atom is a double bond or triple bond, some of $R^4$ through $R^7$ may not exist in accordance with the existence of the double or triple bond.

In the general formula (M-2), $L^1$ represents a divalent linkage group or a single bond, which, together with $—C^1—N^1—C^2—$, forms a ring structure. In the case where $L^1$ is a divalent linkage group, $L^1$ may have a substituent. Preferred examples of a ring structure containing $L^1$ are 3- to 10-membered ring structure. From the viewpoint of efficiency of removing dissolution inhibiting effect, 3- to 8-membered rings are preferable. In view of the suitability for synthesis, 5-memberd rings and 6-membered rings are preferable.

In the general formula (M-2), two substituents which are selected from $R^4$ through $R^7$ and are bonded to the same atom may be an identical atom or substituent so that a double bond is formed. (For instance, provided $R^4$=$R^5$=O, a carbonyl group (—CO—) may be formed.)

Among quaternary ammonium structures that are represented by the general formula (1-1), as preferable examples, a structure represented by the following general formula (M-3) can be cited.

General formula (M-3)

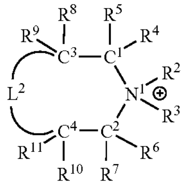

In the general formula (M-3), $R^2$, $R^3$ and $X^-$ each have the same definition respectively as $R^2$, $R^3$ or $X^-$ in the general formula (M-1), and the preferable ranges thereof are also the same.

In the general formula (M-3), $R^4$ through $R^{11}$ each independently represent a hydrogen atom or a substituent. As the substituent, substituents that are cited as examples of $R^2$ and $R^3$ in the general formula (M-1) can be cited. Any two of $R^4$ through $R^{11}$ may be the same as each other or different from each other and may combine with each other to form a ring structure. $R^4$ through $R^{11}$ each may combine with $L^2$, $R^2$ or $R^3$ to form a ring structure. The bond between $C^3$ carbon atom and $C^1$ carbon atom, between $C^4$ carbon atom and $C^2$ carbon atom, between $C^3$ carbon atom and $L^2$, or between $C^4$ carbon atom and $L^2$ may be a double bond or a triple bond. In such a case some of $R^4$ through $R^{11}$ do/does not exist in accordance with the existence of such double or triple bond. Further, $L^2$ itself may be a double bond connecting $C^3$ carbon atom and $C^4$ carbon atom. Also in this case, some of $R^4$ through $R^{11}$ do/does not exist in accordance with the existence of the double bond.

In the general formula (M-3), $L^2$ represents a divalent linkage group that, together with —$C^3$—$C^1$—$N^1$—$C^2$—$C^4$—, forms a ring structure, a single bond connecting $C^3$ and $C^4$ or a double bond connecting $C^3$ and $C^4$. In the case where $L^2$ represents a divalent linkage group, $L^2$ may have substituent(s). As preferable examples of the ring structure that contains $L^2$, 5- to 10-membered rings can be cited. From the viewpoint of the efficiency of removing the dissolution inhibition, 5- to 8-membered rings are preferable, and when further considering the suitability for synthesis, 5- and 6-membered rings are preferable.

In the general formula (M-3), two substituents which are selected from $R^4$ through $R^{11}$ and are bonded to the same atom may be an identical atom or substituent so that a double bond in formed. (For instance, provided $R^4$=$R^5$=O, a carbonyl group (—CO—) may be formed.)

In the general formula (M-3), two substituents which are selected from $R^4$ through $R^{11}$ and are bonded to atoms adjoining each other may be an identical atom or substituent so that a 3-membered ring is formed. (For instance, provided $R^4$=$R^8$=oxygen atom, an epoxy group may be formed.)

Among the quaternary ammonium structures represented by the general formula (1-1), as a more preferable example, a structure represented by the following general formula (M-4) can be cited.

General formula (M-4)

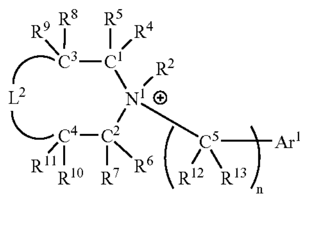

In the general formula (M-4), $R^2$ has the same definition as that of $R^2$ in the general formula (M-1), and the preferable range is also the same. As $R^2$ in the general formula (M-4), more preferably, an alkyl group, an aryl group, an alkenyl group, an alkynyl group, or a group obttained by allowing one of these groups to be substituted by arbitrary substituent (s) can be cited. From the viewpoint of the dissolution inhibition, $R^2$ has preferably no less than 2 carbon atoms, more preferably no less than 3 carbon atoms and particularly preferably, no less than 4 carbon atoms.

In the general formula (M-4), $R^4$ through $R^{13}$ each independently represent a hydrogen atom or a substituent. As the substituent, substituents that are cited as examples of $R^2$ and $R^3$ in the general formula (M-1) can be cited. Any two of $R^4$ through $R^{13}$ may be the same as each other or different from each other and may combine with each other to form a ring structure. $R^4$ through $R^{13}$ each may combine with $L^2$, $R^2$ or $R^3$ to form a ring structure. The bond between $C^3$ carbon atom and $C^1$ carbon atom, between $C^4$ carbon atom and $C^2$ carbon atom, between $C^3$ carbon atom and $L^2$, or between $C^4$ carbon atom and $L^2$ may be a double bond or a triple bond. In such a case some of $R^4$ through $R^{11}$ do/does not exist in accordance with the existence of such double or triple bond. Further, $L^2$ itself may be a double bond connecting $C^3$ carbon atom and $C^4$ carbon atom. Also in this case, some of $R^4$ through $R^{11}$ do/does not exist in accordance with the existence of the double bond.

In the general formula (M-4), $Ar^1$ represents an aromatic ring group. Preferable examples of the aromatic ring group include a phenyl group, a naphthyl group, an anthranyl group, a phenanthrenyl group, a pyridyl group, a pyrazyl group, an imidazolyl group, a quinolinyl group, an indolyl group, an isoquinolinyl group, a pyrrolyl group, a furanyl group, a pyrazolyl group, a triazolyl group, a tetrazolyl group, an oxazolyl group, an oxadiazolyl group, a thiazolyl group, and a pyrimidinyl group, each of which may be substituted. $Ar^1$ may combine with any one of $L^2$, $R^2$, $R^4$ through $R^{13}$ to form a ring structure.

In the general formula (M-4), n represents 0 or a positive integer, and is preferably 0, 1, 2 or 3, more preferably 0, 1 or 2, and particularly preferably 0 or 1. When n is no less than 2, there are a plurality of $R^{12}$s and a plurality of $R^{13}$s. Any two of such a plurality of $R^{12}$s and a plurality of $R^{13}$s may be the same as each other or different from each other and may combine with each other to form a ring structure.

In the general formula (M-4), $L^2$ represents a divalent linkage group that, together with —$C^3$—$C^1$—$N^1$—$C^2$—$C^4$—, forms a ring structure containing, a single bond connecting $C^3$ and $C^4$, or a double bond connecting $C^3$ and $C^4$. In the case where $L^2$ represents a divalent linkage group, $L^2$ may have a substituent. As a preferable example of a ring structure containing $L^2$, 5- to 10-membered rings can be preferably cited. In view of the efficiency of removing dissolution inhibiting effect, 5- to 8-membered rings are preferable, and in view of the suitability for synthesis, 5- and 6-membered rings are preferable.

In the general formula (M-4), two substituents which are selected from $R^4$ through $R^{13}$ and are bonded to the same atom may be an identical atom or substituent so that a double bond is formed. (For instance, provided $R^4$=$R^5$=O, a carbonyl group (—CO—) may be formed.)

In the general formula (M-4), two substituents which are selected from $R^4$ through $R^{13}$ and are bonded to atoms adjoining each other may be an identical same atom or substituent so that a 3-membered ring is formed. (For instance, provided $R^4$=$R^8$=O, an epoxy group may be formed.)

Among the quaternary ammonium structures, as a preferable example, a structure represented by the following general formula (M-5) can be cited.

General formula (M-5)

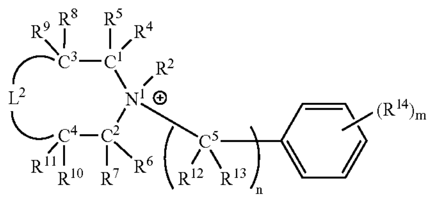

In the general formula (M-5), $R^2$ has the same definition as that of $R^2$ in the general formula (M-1), and the preferable range is also the same. As $R^2$ in the general formula (M-5), more preferably, an alkyl group, an aryl group, an alkenyl group, an alkynyl group, or a group obtained by allowing one of these groups to be substituted by arbitrarily substituent(s) can be cited. From the viewpoint of the dissolution inhibition, $R^2$ has preferably no less than 2 carbon atoms, more preferably no less than 3 carbon atoms and particularly preferably no less than 4 carbon atoms.

In the general formula (M-5), $R^4$ through $R^{14}$ each independently represent a hydrogen atom or a substituent. As the substituent, substituents that are cited as examples of $R^2$ and $R^3$ in the general formula (M-1) can be preferably cited. Any two of $R^4$ through $R^{14}$ be the same as each other or different from each other and may combine with each other to form a ring structure. $R^4$ through $R^{14}$ each may combine with $L^2$, $R^2$, or $R^3$ to form a ring structure. The bond between $C^3$ carbon atom and $C^1$ carbon atom, between $C^4$ carbon atom and $C^2$ carbon atom, between $C^3$ carbon atom and $L^2$, or between $C^4$ carbon atom and $L^2$ may be a double bond or a triple bond. In such a case some of $R^4$ through $R^{11}$ do/does not exist in accordance with the existence of such double or triple bond. Further, $L^2$ itself may be a double bond connecting $C^3$ carbon atom and $C^4$ carbon atom. Also in this case, some of $R^4$ through $R^{11}$ do/does not exist in accordance with the existence of the double bond.

In the general formula (M-5), m represents an integer from 0 to 5. When m is no less than 2, there are a plurality of $R^{14}$s. Any two of such a plurality of $R^{14}$s may be the same as each other or different from each other and may combine with each other to form a ring structure.

In the general formula (M-5), n represents 0 or a positive integer, and is preferably 0, 1, 2 or 3, more preferably 0, 1 or 2, and particularly preferably 0 or 1. When n is no less than 2, there are a pluralities of $R^{12}$s and a plurality of $R^{13}$s. Any two of such a plurality of $R^{12}$s and a plurality of $R^{13}$s may be the same as each other or different from each other and may combine with each other to form a ring structure.

In the general formula (M-5), $L^2$ represents a divalent linkage group that, together with —$C^3$—$C^1$—$N^1$—$C^2$—$C^4$—, forms a ring structure, a single bond connecting $C^3$ and $C^4$ or a double bond connecting $C^3$ and $C^4$. When $L^2$ represents a divalent linkage group, $L^2$ may have substituent(s). As preferable examples of the ring structure containing $L^2$, 5- to 10-membered rings can be cited. In view of the efficiency of removing dissolution inhibiting effect, 5- to 8-membered rings are preferable, and in view of the suitability for synthesis, 5- and 6-membered rings are preferable.

In the general formula (M-5), two substituents which are selected from $R^4$ through $R^{14}$ and is bonded to the same atom may be an identical atom or substituent so that a double bond is formed. (For instance, provided $R^4$=$R^5$=O, a carbonyl group (—CO—) may be formed.)

In the general formula (M-5), two substituents which are selected from $R^4$ through $R^{14}$ and are bonded to atoms adjoining each other may be an identical atom or substituent so that a 3-membered ring is formed. (For instance, provided $R^4$=$R^8$=O, an epoxy group may be formed.)

Among the quaternary ammonium structures, as a further preferable example, a structure represented by the following general formula (M-6) can be cited.

General formula (M-6)

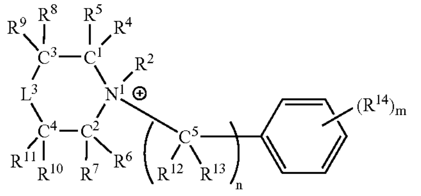

In the general formula (M-6), $R^2$ has the same definition as that of $R^2$ in the general formula (M-1), and the preferable range is also the same. As $R^2$ in the general formula (M-6), more preferably, an alkyl group, an aryl group, an alkenyl group, an alkynyl group, or a group obtained by allowing one of these groups by arbitrarily substituent(s) can be cited. From the viewpoint of the dissolution inhibition, $R^2$ has preferably no less than 2 carbon atoms, more preferably no less than 3 carbon atoms, and particularly preferably, no less than 4 carbon atoms.

In the general formula (M-6), $R^4$ through $R^{14}$ each independently represent a hydrogen atom or a substituent. As the substituent, substituents that are cited as examples of $R^2$ and $R^3$ in the general formula (M-1) can be cited. Any two of $R^4$ through $R^{14}$ may be the same as each other or different from each other and may combine with each other to form a ring structure. $R^4$ through $R^{14}$ each may combine with $L^3$ or $R^2$ to form a ring structure. The bond between $C^3$ carbon atom and $C^1$ carbon atom, between $C^4$ carbon atom and $C^2$ carbon atom, between $C^3$ carbon atom and $L^3$, or between $C^4$ carbon atom and $L^3$ may be a double bond or a triple bond. In such a case some of $R^4$ through $R^{11}$ do/does not exist in accordance with the existence of such double or triple bond. Further, $L^3$ itself may be a double bond connecting $C^3$ carbon atom and $C^4$ carbon atom. Also in this case, some of $R^4$ through $R^{11}$ do/does not exist in accordance with the existence of the double bond.

In the general formula (M-6), m represents an integer from 0 to 5. When m is no less than 2, there are a plurality $R^{14}$s. Any two of such a plurality of $R^{14}$s may be the same as each other or different from each other and may combine with each other to form a ring structure.

In the general formula (M-6), n represents 0 or a positive integer, and is preferably 0, 1, 2 or 3, more preferably 0, 1 or 2, and particularly preferably 0 or 1. When n is no less than 2, there are a plurality of $R^{12}$s and a plurality of $R^{13}$s. Any two of such a plurality of $R^{12}$s and a plurality of $R^{13}$s may be the same as each other or different from each other and may combine with each other to form a ring structure.

In the general formula (M-6), $L^3$ represents a divalent linkage group that, together with —$C^3$—$C^1$—$N^1$—$C^2$—

$C^4$—, forms a ring structure, a single bond connecting $C^3$ and $C^4$ or a double bond connecting $C^3$ and $C^4$. As the divalent linkage group, —O—, —S—, —N ($R^{L1}$)—, and —C ($R^{L2}$) ($R^{L3}$)— can be preferably cited. $R^{L1}$ through $R^{L3}$ are selected from the group consisting of a hydrogen atom and the substituents that can be represented by $R^2$ and $R^3$ in the general formula (M-1). Each $R^{L1}$ through $R^{L3}$ may be bonded to any one of $R^2$ and $R^4$ through $R^{14}$ to form a ring structure. When the bond between $C^3$ and $L^3$ or between $C^4$ and $L^3$ is a double bond, some of $R^{L1}$ through $R^{L3}$ do/does not exist in accordance with the existence of the double bond.

In the general formula (M-6), two substituents which are selected from $R^4$ through $R^{14}$ and $R^{L1}$ through $R^{L3}$ and are bonded to the same atom may be an identical atom or substituent so that a double bond is formed. (For instance, provided $R^4$=$R^5$=O, a carbonyl group (—CO—) may be formed.)

In the general formula (M-6), two substituents which are selected from $R^4$ through $R^{14}$ and $R^{L1}$ through $R^{L3}$ and are bonded to atoms adjoining each other may be an identical atom or substituent so that a 3-membered ring is formed. (For instance, provided $R^4$=$R^8$=O, an epoxy group may be formed.)

Among the quaternary ammonium structures, as a further preferable example, a structure represented by the following general formula (M-7) can be cited.

General formula (M-7)

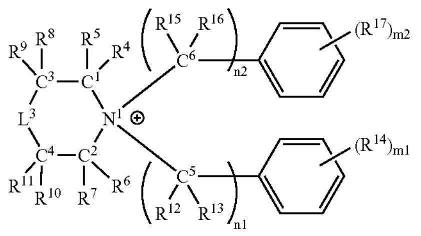

In the general formula (M-7), $R^4$ through $R^{17}$ each independently represent a hydrogen atom or a substituent. As the substituent, substituents that were cited as examples of $R^2$ and $R^3$ in the general formula (M-1) can be cited. Any two of $R^4$ through $R^{17}$ may be the same as each other or different from each other and may combine with each other to form a ring structure. $R^4$ through $R^{17}$ each may combine with $L^3$, $R^2$ or $R^3$ to form a ring structure. The bond between $C^3$ carbon atom and $C^1$ carbon atom, between $C^4$ carbon atom and $C^2$ carbon atom, between $C^3$ carbon atom and $L^3$, or between $C^4$ carbon atom and $L^3$ may be a double bond or a triple bond. In such a case some of $R^4$ through $R^{11}$ do/does not exist in accordance with the existence of such double or triple bond. Further, $L^3$ itself may be a double bond connecting $C^3$ carbon atom and $C^4$ carbon atom. Also in this case, some of $R^4$ through $R^{11}$ do/does not exist in accordance with the existence of the double bond.

In the general formula (M-7), m1 and m2 each independently represent an integer from 0 to 5. When m1 or m2 is no less than 2, there are a plurality of $R^{14}$s or a plurality of $R^{17}$s. Any two of such a plurality of $R^{14}$s or a plurality of $R^{17}$s may be the same as each other or different from each other, and may combine with each other to form a ring structure.

In the general formula (M-7), n1 and n2 each independently represent 0 or a positive integer, and are preferably 0, 1, 2 or 3, more preferably 0, 1 or 2, and particularly preferably 0 or 1. When n1 is no less than 2, there are a plurality of $R^{12}$s and a plurality of $R^{13}$s. Any two of such a plurality of $R^{12}$s and a plurality of $R^{13}$s may be the same as each other or different from each other and may combine each other to form a ring structure. When n2 is no less than 2, there are a plurality of $R^{12}$s and a plurality of $R^{13}$s. Any two of such a plurality of $R^{15}$s and a plurality of $R^{16}$s may be the same as or different from each other to form a ring structure. These may be the same each other or different from each other or may combine with each other to form a ring structure.

In the general formula (M-7), $L^3$ represents a divalent linkage group that, together with —$C^3$—$C^1$—$N^1$—$C^2$—$C^4$—, forms a ring structure, a single bond connecting $C^3$ and $C^4$, or a double bond connecting $C^3$ and $C^4$. As the divalent linkage group, —O—, —S—, —N ($R^{L1}$)—, and —C ($R^{L2}$) ($R^{L3}$)— is preferable. $R^{L1}$ through $R^{L3}$ are selected from the group consisting of a hydrogen atom or the substituents that can be represented by $R^2$ or $R^3$ in the general formula (M-1). $R^{L1}$ through $R^{L3}$ each may be bonded to any one of $R^2$, $R^4$ through $R^{14}$ to form a ring structure. When the bond between $C^3$ and $L^3$ or between $C^4$ and $L^3$ is a double bond, some of $R^{L1}$ through $R^{L3}$ do/does not exist in accordance with the existence of the double bond.

In the general formula (M-7), two substituents which are selected from $R^4$ through $R^{17}$ and $R^{L1}$ through $R^{L3}$ and are bonded to the same atom may be an identical atom or substituent so that a double bond is formed. (For instance, provided $R^4$=$R^5$=O, a carbonyl group (—CO—) may be formed.)

In the general formula (M-7), two substituents which are selected from $R^4$ through $R^{17}$ and $R^{L1}$ through $R^{L3}$ and are bonded to atoms adjoining each other may be an identical atom or substituent so that a 3-membered ring is formed. (For instance, provided $R^4$=$R^8$=O, an epoxy group may be formed.)

Among the onium salts represented by the general formula (1-2), as a further preferable example, an onium salt represented by the following general formula (1-2-A) can be cited.

$R^A$—$SO_3^-M^+$ General formula (1-2-A)

In the general formula (1-2-A), $R^A$ represents a substituent having at least one substituent that has an alkali dissociative proton, and $M^+$ represents a counter cation selected from a sulfonium, iodonium, ammonium, phosphonium and oxonium.

As the substituent having an alkali dissociative proton on $R^A$, a phenolic hydroxyl group (Ar—OH), a carboxyl group (—COOH), a mercapto group (—SH), a phosphonic acid group (—$PO_3H_2$), a phosphoric acid group (—$OPO_3H_2$), a sulfonamide group (—$SO_2NH_2$, —$SO_2NHR$), a substituted sulfonamide type acidic group (hereinafter, referred to as "active imide group". For example, —$SO_2NHCOR$, —$SO_2NHSO_2R$, or —$CONHSO_2R$), a sulfonic acid group (—$SO_3H$), a sulfinic acid group (—$SO_2H$), a —$C(CF_3)_2OH$, or a —$COCH_2COCF_3$ is preferable. In the above, Ar represents an aryl group that may have a substituent, and R represents a hydrocarbon group that may have a substituent. Furthermore, as examples each having an excellent balance between the dissolution inhibiting effect and the sensitivity, a phenolic hydroxyl group, a carboxyl group, a mercapto group, a sulfonamide group, an active imide group, a —$C(CF_3)_2OH$ and a —$COCH_2COCF_3$ can be cited. A phenolic hydroxyl group and a carboxyl group are most preferable.

In $R^A$, the skelton having the substituent that has an alkali dissociative proton may be a hydrocarbon group that may have a further substituent. Although there is no particular restriction on a structure of the hydrocarbon group, the hydrocarbon group preferably comprises an aromatic ring. The aromatic ring may be an aromatic hydrocarbon such as a benzene ring, a naphthalene ring, an anthracene ring, or a phenanthrene ring, or an aromatic heterocycle such as a pyrrole ring, a piridine ring, a quinoline ring, an acridine ring, an imidazole ring, a furan ring, a thiophene ring, and a thiazole ring. Among them, an aromatic hydrocarbon is preferable and a benzene ring is particularly preferable.

In the general formula (1-2-A), $M^+$ is preferably a sulfonium ion, an iodonium ion or a quaternary ammonium, in view of the dissolution inhibiting effect. A quaternary ammonium ion is most preferable. Preferable examples of the quaternary ammonium ion are the quarternary ammonium ions cited as preferable examples in the explanation of the general formula (1-2).

In the general formula (1-2), as a more preferable example, an onium salt represented by the following general formula (1-2-B) can be cited.

$Ar^B—SO_3^-M^+$ General formula (1-2-B)

In the general formula (1-2-B), $Ar^B$ represents an aryl group that has at least one substituent having an alkali dissociative proton. $M^+$ represents a counter cation selected from a sulfonium ion, an iodonium ion, an ammonium ion, a phosphonium ion and an oxonium ion.

In the general formula (1-2-B), the substituent having an alkali dissociative proton is preferably a phenolic hydroxyl group (Ar—OH), a carboxyl group (—COOH), a mercapto group (—SH), a phosphonic acid group ($—PO_3H_2$), a phosphoric acid group ($—OPO_3H_2$), a sulfonamide group ($—SO_2NH_2$, $—SO_2NHR$), a substituted sulfonamide type acidic group (hereinafter, referred to as "active imide group". For example, $—SO_2NHCOR$, $—SO_2NHSO_2R$, or $—CONHSO_2R$), a sulfonic acid group ($—SO_3H$), a sulfinic acid group ($—SO_2H$), a $—C(CF_3)_2OH$, or a $—COCH_2COCF_3$ is preferable. In the above, Ar represents an aryl group that may have a substituent, and R represents a hydrocarbon group that may have a substituent. As examples each having an excellent balance between the dissolution inhibiting effect and the sensitivity, a phenolic hydroxyl group, a carboxyl group, a mercapto group, a sulfonamide group, an active imide group, a $—C(CF_3)_2OH$ and a $—COCH_2COCF_3$ can be cited. A phenolic hydroxyl group and a carboxyl group are most preferable.

In the general formula (1-2-B), $M^+$ is preferably a sulfonium ion, an iodonium ion and a quaternary ammonium ion, in view of the dissolution inhibiting effect. A quaternary ammonium ion is most preferable. Preferable examples of the quaternary ammonium ion are the quaternary ammonium ions cited as preferable examples in the explanation of the general formula (1-2).

Onium salts represented by the general formula (1-2) according to the invention preferably does not have substantial absorption between from 500 to 600 nm and more preferably does not have substantial absorption in the visible light region.

One kind of the onium salt represented by the general formula (1-2) may be used in the image forming material according to the invention. Alternatively, a plurality kinds of the onium salts represented by the general formula (1-2) may be used in combination. A content of an onium salt represented by the general formula (1-2) is preferably 50% by mass or less based on the whole solids content in the image forming layer, from the viewpoint of the film formability. In order to obtain excellent image formability, the content of the onium salt is preferably in the range of from 0.1 to 30% by mass. Further, in order to satisfies simultaneously the printing characteristics such as the press life and the image formability at a high level, the content is most preferably in the range of from 0.5 to 15%.

In the following, specific examples (exemplary compounds C-1 to C-30) of the onium salts that are preferably used in the invention and represented by the general formula (1-2) are cited. However, any onium salts represented by the general formula (1-2) can be selected and used, thus, the onium salts usable in the invention are not restricted to the exemplary compounds.

TABLE 13

| Compound No. | Anion moiety | Cation moiety |
|---|---|---|
| C-1 | 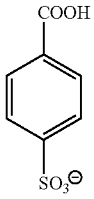 | 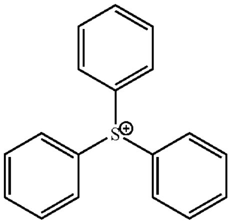 |
| C-2 | 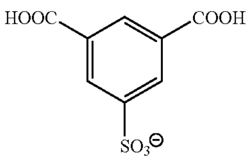 | 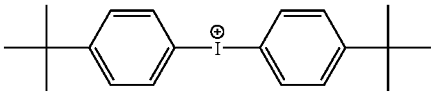 |

TABLE 13-continued
| Compound No. | Anion moiety | Cation moiety |
|---|---|---|
| C-3 | 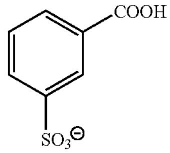 | 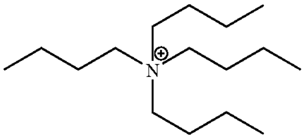 |
| C-4 | 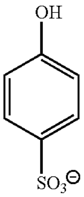 | 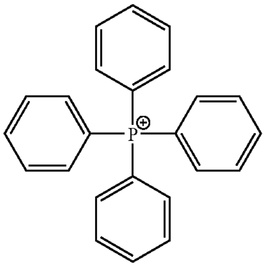 |
| C-5 | 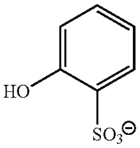 | 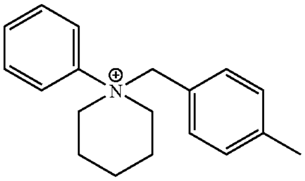 |
| C-6 | 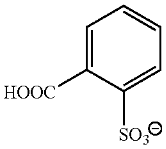 | 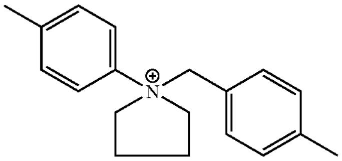 |
TABLE 14
| Compound No. | Anion Moiety | Cation Moiety |
|---|---|---|
| C-7 | 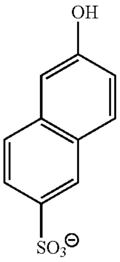 | 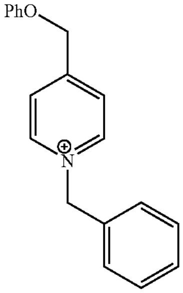 |
| C-8 | 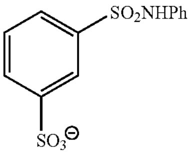 | 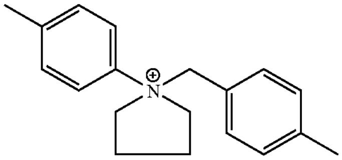 |

TABLE 14-continued
| Compound No. | Anion Moiety | Cation Moiety |
|---|---|---|
| C-9 | 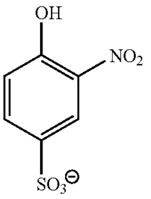 | 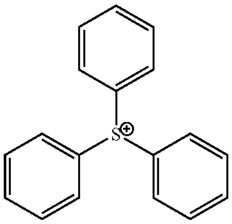 |
| C-10 | 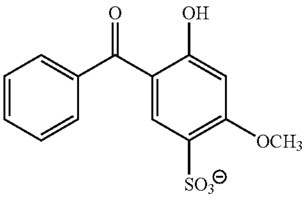 | 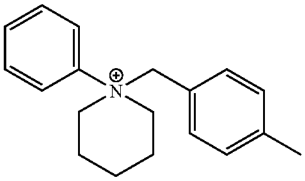 |
| C-11 | 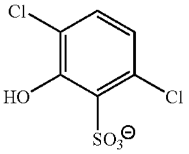 | 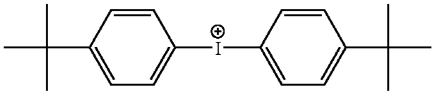 |
TABLE 15
| Compound No. | Anion Moiety | Cation Moiety |
|---|---|---|
| C-12 | 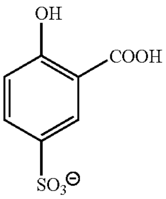 | 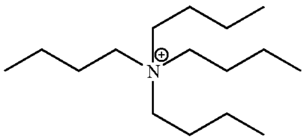 |
| C-13 | 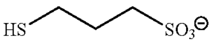 | 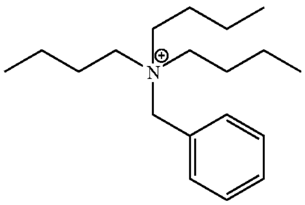 |
| C-14 | 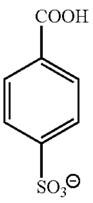 | 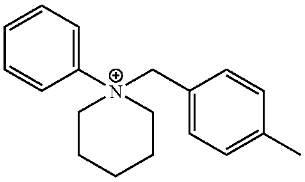 |
| C-15 | 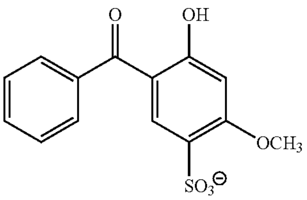 | 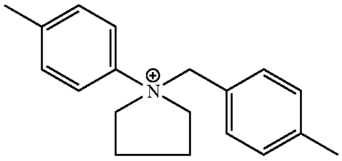 |

TABLE 15-continued
| Compound No. | Anion Moiety | Cation Moiety |
|---|---|---|
| C-16 | 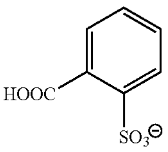 | 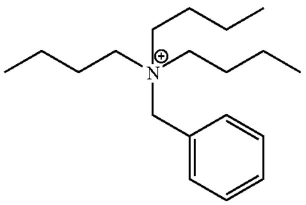 |
| C-17 | 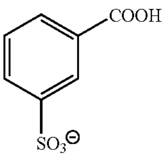 | 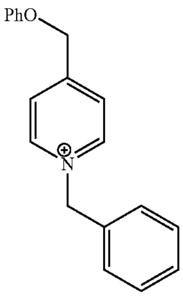 |
| C-18 | 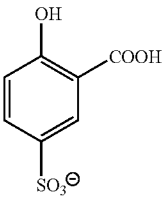 | 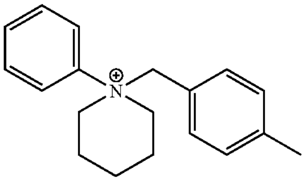 |
TABLE 16
| Compound No. | Anion Moiety | Cation Moiety |
|---|---|---|
| C-19 | 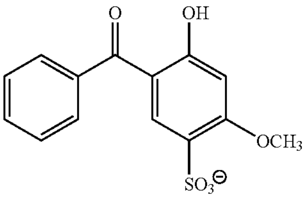 | 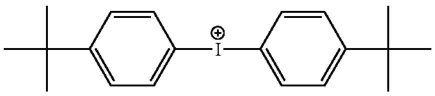 |
| C-20 | 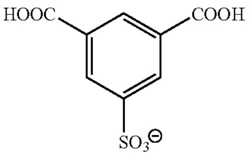 | 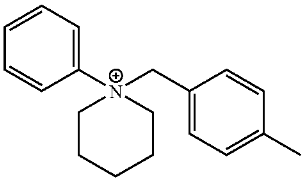 |
| C-21 | 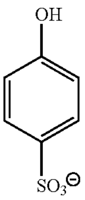 | 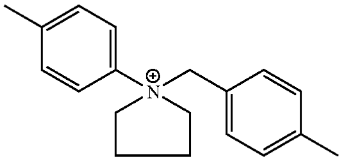 |

TABLE 16-continued
| Compound No. | Anion Moiety | Cation Moiety |
|---|---|---|
| C-22 | 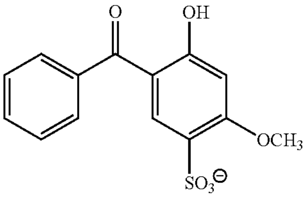 | 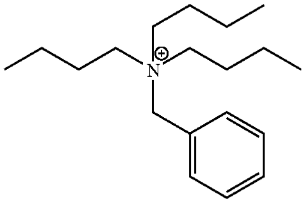 |
| C-23 | 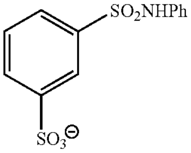 | 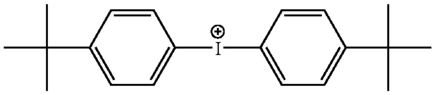 |
| C-24 | 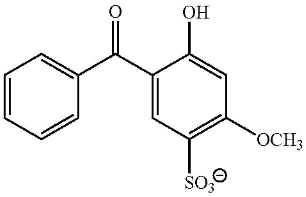 | 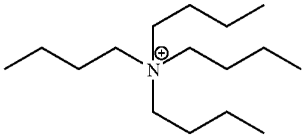 |
| C-25 | 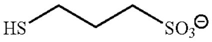 | 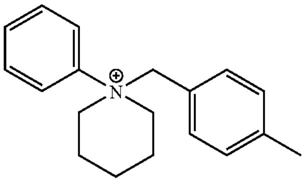 |
TABLE 17
| Compound No. | Anion Moiety | Cation Moiety |
|---|---|---|
| C-26 | 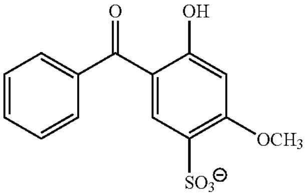 | 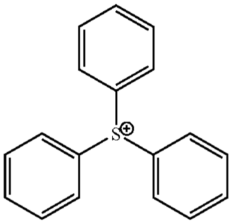 |
| C-27 | 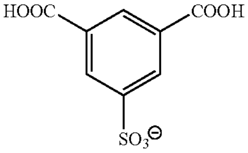 | 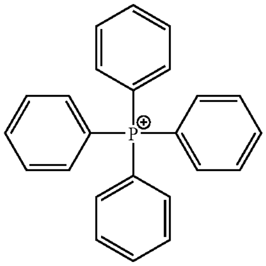 |

TABLE 17-continued

| Compound No. | Anion Moiety | Cation Moiety |
|---|---|---|
| C-28 | 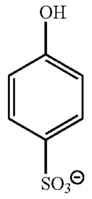 | 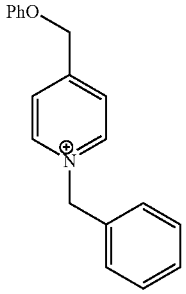 |
| C-29 | 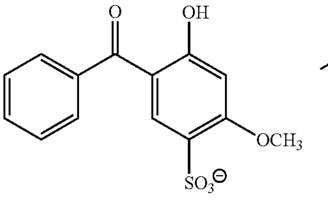 | 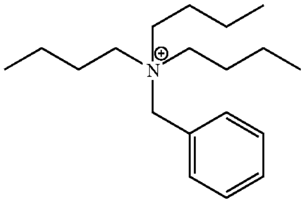 |
| C-30 | 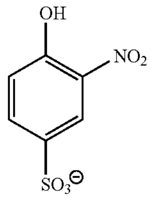 | 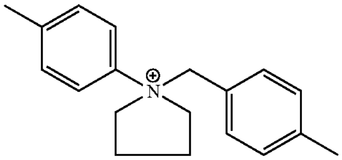 |

In the following, a configuration common to both of the above-mentioned image forming layers will be explained.

((B) Photo-Thermal Converting Agent)

An image forming layer according to the invention includes (B) a photo-thermal converting agent.

The (B) photo-thermal converting agent used in the invention may be any substance that absorbs radiation for recording and generates heat, without particular restriction on an absorption wavelength region thereof. However, from the viewpoint of suitability for exposure with an easily available high power laser, an infrared light absorbing dye or pigment having the absorption maximum in wavelength region of 760 to 1200 nm is preferable.

(Infrared Absorbing Dye or Pigment)

The dye used in the invention may be a commercially available dye or a well-known dye described in literatures such as The Society of Synthetic Organic Chemistry, ed., *Senryou Binran* (Handbook of Dyes) (1970). Specific examples of the dye include azo dyes, metal complex azo dyes, pyrazolone azo dyes, naphthoquinone dyes, anthraquinone dyes, phthalocyanine dyes, naphthalocyanine dyes, carbonium dyes, quinonimine dyes, methine dyes, cyanine dyes, squalirium dyes, (thio)pyrilium salts, metal-thiolate complexes, indoaniline metal complex dyes, oxonol dyes, diimonium dyes, aminium dyes, croconium dyes and inter-molecular type CT dyes.

Preferred examples include the cyanine dyes disclosed in JP-A Nos. 58-125246, 59-84356, 59-202829, and 60-78787; the methine dyes disclosed in JP-A Nos. 58-173696, 58-181690, and 58-194595; the naphthoquinone dyes disclosed in JP-A Nos. 58-112793, 58-224793, 59-48187, 59-73996, 60-52940, and 60-63744; the squarylium dyes disclosed in JP-A No. 58-112792; and the cyanine dyes disclosed in BP No. 434,875.

Further, the near-infrared absorbing sensitizers disclosed in U.S. Pat. No. 5,156,938 can be preferably used. Furthermore, the substituted arylbenzo (thio) pyrylium salts disclosed in U.S. Pat. No. 3,881,924: the trimethine thiapyrylium salts disclosed in JP-A No. 57-142645 (corresponding to U.S. Pat. No. 4,327,169); the pyrylium-based compounds disclosed in JP-A Nos. 58-181051, 58-220143, 59-41363, 59-84248, 59-84249, 59-146063, and 59-146061; the cyanine dyes disclosed in JP-A No. 59-216146; the pentamethine thiopyrilium salts disclosed in U.S. Pat. No. 4,283,475; and the pyrilium compounds disclosed in JP-B Nos. 5-13514 and 5-19702 also can be preferably used.

Other preferable examples of the dye include near-infrared absorbing dyes represented by the formulas (I) and (II) in U.S. Pat. No. 4,756,993.

Particularly preferable dyes among these dyes are cyanine dyes, phthalocyanine dyes, oxonol dyes, squarylium dyes, pyrylium salts, thiopyrilium dyes and nickel-thiolate complexes.

Dyes represented by the following general formulas (a) through (f) are preferable because of excellent photo-thermal conversion efficiency thereof. In particular, when a cyanine dye represented by the following general formula (a) is used in the invention, the cyanine dye interacts strongly with an alkali-soluble resin, and has excellent stability and economic efficiency. Accordingly, the cyanine dyes represented by the general formula (a) are most preferable.

General formula (a)

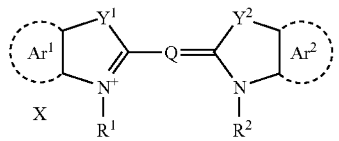

In the general formula (a), $R^1$ and $R^2$ each independently represent an alkyl group having 1 to 12 carbon atoms, and the alkyl group may have a substituent selected from an alkoxy group, an aryl group, an amide group, an alkoxycarbonyl group, a hydroxyl group, a sulfo group or a carboxyl group. $Y^1$ and $Y^2$ each independently represent an oxygen atom, a sulfur atom, a selenium atom, a dialkylmethylene group or a —CH═CH—. $Ar^1$ and $Ar^2$ each independently represent an aromatic hydrocarbon group and may have a substituent selected from an alkyl group, an alkoxy group, a halogen atom, or an alkoxy carbonyl group. In $Ar^1$, the carbon atom adjacent to $Y^1$ and a carbon atom adjacent to said carbon atom may belong to another ring that is condensed with $Ar^1$. In $Ar^2$, the carbon atom adjacent to $Y^2$ and a carbon atom adjacent to said carbon atom may be members of another ring that is condensed with $Ar^2$.

In the general formula (a), X represents a counter ion necessary for neutralizing an electric charge, which is not required when the cation moiety of the dye has an anionic substituent. Q represents a polymethine group selected from a trimethine group, a pentamethine group, a heptamethine group, a nonamethine group or an undecamethine group. From the viewpoints of the stability and wavelength aptitude for an infrared light used for exposure, a pentamethine group, a heptamethine group or a nonamethine group is preferable. From the viewpoint of the stability, Q preferably comprises, in the methine chain thereof, three consecutive carbon atoms that are members of a cyclohexene ring or a cyclopentene ring.

In the general formula (a), Q may be substituted by a substituent selected from an alkoxy group, an aryloxy group, an alkylthio group, an arylthio group, a dialkylamino group, a diarylamino group, a halogen atom, an alkyl group, an aralkyl group, a cycloalkyl group, an aryl group, an oxy group, an iminium group or a substituent represented by the following general formula (i). As preferable substituents, halogen atoms such as a chlorine atom, diarylamino groups such as a diphenylamino group, and arylthio groups such as a phenylthio group can be cited.

(i)

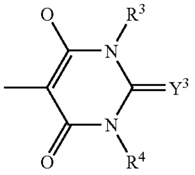

In the general formula (i), $R^3$ and $R^4$ each independently represent a hydrogen atom, an alkyl group having 1 to 8 carbon atoms, or an aryl group having 6 to 10 carbon atoms. $Y^3$ represents an oxygen atom or a sulfur atom.

When infrared light having a wavelength from 800 to 840 nm is used for expose, heptamethine cyanine dyes represented by the following general formulas (a-1) through (a-4) can be cited as particularly preferably examples among cyanine dyes represented by the general formula (a).

General formula (a-1)

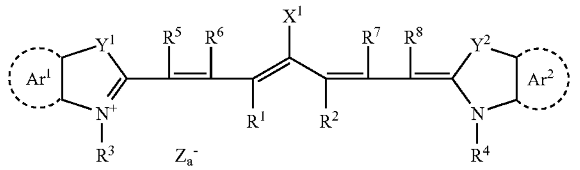

In the general formula (a-1), $X^1$ represents a hydrogen atom or a halogen atom. $R^1$ and $R^2$ each independently represent a hydrocarbon group having 1 to 12 carbon atoms. In view of the storage stability of an image forming layer coating solution, $R^1$ and $R^2$ each preferably represent a hydrocarbon group having 2 or more carbon atoms. $R^1$ and $R^2$ particularly preferably combine with each other to form a 5- or 6-membered ring.

In the general formula (a-1), $Ar^1$ and $Ar^2$ may be the same as each other or different from each other and each independently represent an aromatic hydrocarbon group that may have a substituent. The aromatic hydrocarbon group is preferably a benzene ring or a naphthalene ring. The substituent on the aromatic hydrocarbon is preferably a hydrocarbon group having 12 or less carbon atoms, a halogen atom, or an alkoxy group having 12 or less carbon atoms. $Y^1$ and $Y^2$ may be the same as each other or different from each other and each independently represent a sulfur atom or dialkyl methylene group having 12 or less carbon atoms. $R^3$ and $R^4$ may be the same as each other or different from each other and each independently represent a hydrocarbon group which has 20 or less carbon atoms and may have a substituent. The substituent is preferably an alkoxy group having 12 or less carbon atoms, a carboxyl group or a sulfo group. $R^5$, $R^6$, $R^7$ and $R^8$ may be the same as each other or different from each other and each independently represent a hydrogen atom or hydrocarbon group having 12 or less carbon atoms. From the viewpoint of availability of raw materials, $R^5$, $R^6$, $R^7$ and $R^8$ each preferably represent a hydrogen. $Za^-$ represents a counter anion necessary for neutralizing an electric charge. When the dye comprises an anionic substituent in its structure and there is no need of neutralizing an electric charge, $Za^-$ is not required. From the storage stability of a recording layer coating solution, $Za^-$ preferably represents a halogen ion, a perchlorate ion, a tetrafluoroborate ion, a hexafluorophosphate ion or a sulfonic ion. $Za^-$ particularly preferably represents a perchlorate ion, a tetrafluoroborate ion, a hexafluorophosphate ion or a sulfonic ion. Heptamethine dyes represented by the above general formula (a-1) can be preferably used in a positive image forming material, and can be particularly preferably used in a so-called interaction removing type positive photosensitive material, in which a photothermal converting agent is combined with an alkali-soluble resin having a phenolic hydroxyl group.

General formula (a-2)

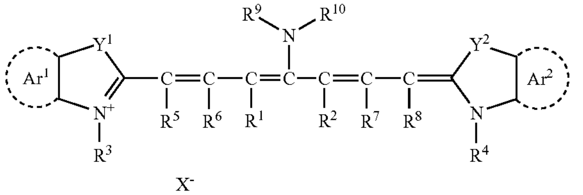

In the general formula (a-2), $R^1$ and $R^2$ each independently represent a hydrogen atom or a hydrocarbon group having 1 to 12 carbon atoms. $R^1$ and $R^2$ may be bonded to each other to form a ring structure. The ring structure is preferably a 5- or 6-membered ring, and particularly preferably, a 5-membered ring. $Ar^1$ and $Ar^2$ may be the same as each other or different from each other and each independently represent an aromatic hydrocarbon group that may have a substituent. The aromatic hydrocarbon group is preferably a benzene ring or a naphthalene ring. The substituent on the aromatic hydrocarbon is preferably a hydrocarbon group having 12 or less carbon atoms, a halogen atom, an alkoxy group having 12 or less carbon atoms, an alkoxycarbonyl group, an alkylsulfonyl group, or a halogenated alkyl group. The substituent on the aromatic hydrocarbon is particularly preferably an electron attracting substituent. $Y^1$ and $Y^2$ may be the same as each other or different from each other and each independently represent a sulfur atom or a dialkylmethylene group having 12 or less carbon atoms. $R^3$ and $R^4$ may be the same as each other or different from each other and each independently represent a hydrocarbon group which has 20 or less carbon atoms and may have a substituent. The substituent on the hydrocarbon in $R^3$ or $R^4$ is preferably an alkoxy group having 12 or less carbon atoms, a carboxyl group, or a sulfo groups. $R^5$, $R^6$, $R^7$ and $R^8$ may be the same as one another or different from one another and each independently represent a hydrogen atom or a hydrocarbon group having 12 or less carbon atoms. From the viewpoint of availability of raw materials, $R^5$, $R^6$, $R^7$ and $R^8$ each preferably represent a hydrogen atom. $R^9$ and $R^{10}$ may be the same as each other or different from each other. $R^9$ and $R^{10}$ each independently represent an aromatic hydrocarbon group having 6 to 10 carbon atoms, an alkyl group having 1 to 8 carbon atoms, each of which may have a substituent, or a hydrogen atom, or $R^9$ and $R^{10}$ may combine with each other to form the following rings.

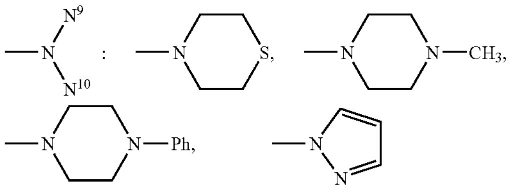

$R^9$ and $R^{10}$ in the general formula (a-2) each particularly preferably represent an aromatic hydrocarbon group such as a phenyl group.

$X^-$ is a counter anion necessary for neutralizing an electric charge. Its definition is the same as that of $Za^-$ in the general formula (a-1).

General formula (a-3)

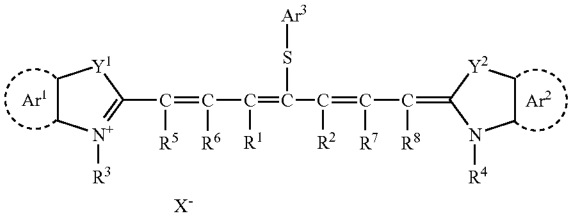

In the general formula (a-3), $R^1$ through $R^8$, $Ar^1$, $Ar^2$, $Y^1$, $Y^2$ and $X^-$ each have the same definition as that in the general formula (a-2). $Ar^3$ represents an aromatic hydrocarbon group such as a phenyl group and a naphthyl group, or a monocyclic or polycyclic heterocyclic ring each containing at least one of a nitrogen atom, an oxygen atom and a sulfur atom. $Ar^3$ represents preferably a heterocyclic ring selected from a group consisting of a thiazole ring, a benzothiazole ring, a naphtothiazole ring, a thianaphtheno-7,6,4,5-thiazole ring, an oxazole ring, a benzoxazole ring, a naphthoxazole ring, a selenazole ring, a benzoselenazole ring, a naphtoselenazole ring, a thiazoline ring, a 2-quinoline ring, a 4-quinoline ring, a 1-isoquinoline ring, a 3-isoquinoline ring, a benzimidazole ring, a 3,3-dialkylbenzindolenine ring, a 2-pyridine ring, a 4-pyridine ring, a 3,3-dialkylbenz[e]indole ring, a tetrazole ring, a triazole ring, a pyrimidine ring and a thiadiazole ring. $Ar^3$ represents particularly preferably a heterocyclic group having one of the following structures.

$Ar^3$:

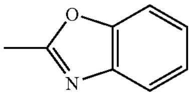
,

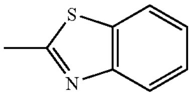
,

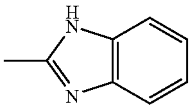
,

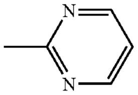
,

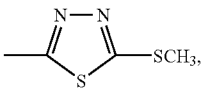

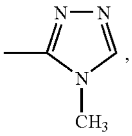
,

-continued

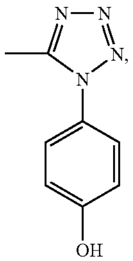

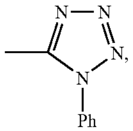

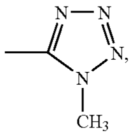

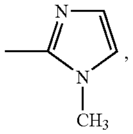

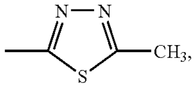

-continued

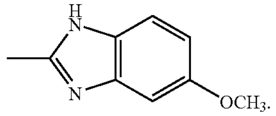

General formula (a-4)

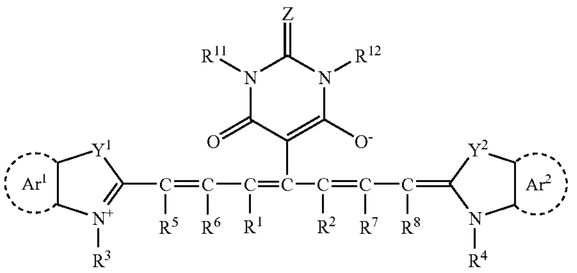

In the general formula (a-4), $R^1$ through $R^8$, $Ar^1$, $Ar^2$, $Y^1$ and $Y^2$ each have the same definition as that in the above general formula (a-2). $R^{11}$ and $R^{12}$ may be the same as each other or different from each other, and each independently represent a hydrogen atom, an aryl group, a cyclohexyl group or an alkyl group having 1 to 8 carbon atoms. Z represents an oxygen atom or a sulfur atom.

According to the invention, preferably examples of the cyanine dye represented by the general formula (a) include the following compounds, the compounds described in JP-A No. 2001-133969, paragraph Nos. [0017] to [0019], JP-A No. 2002-40638, paragraph Nos. [0012] to [0038] and JP-A No. 2002-23360, paragraph Nos. [0012] to [0023].

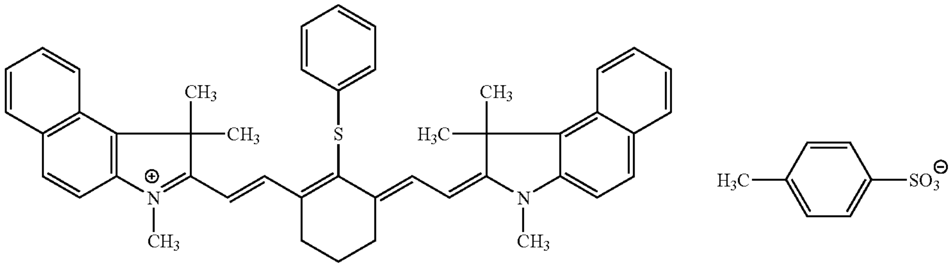

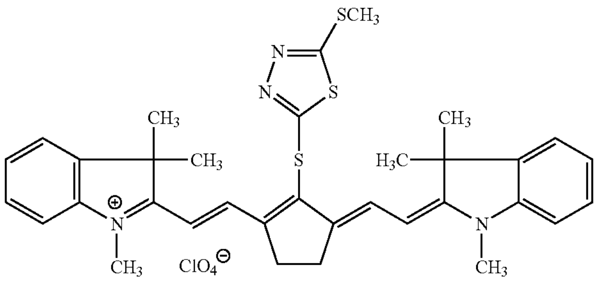

-continued
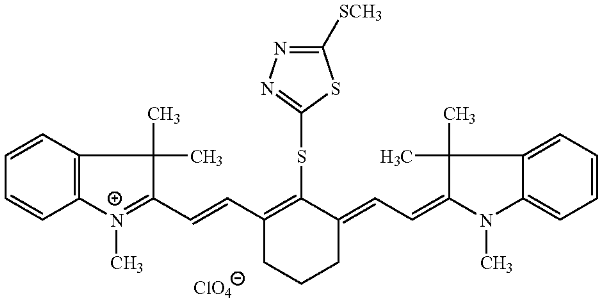
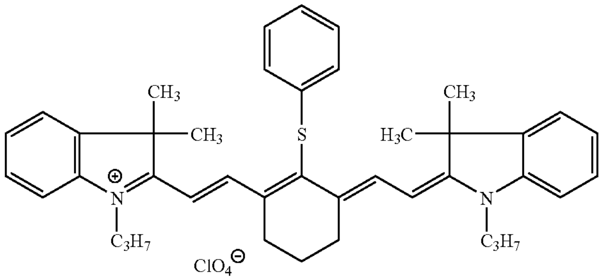
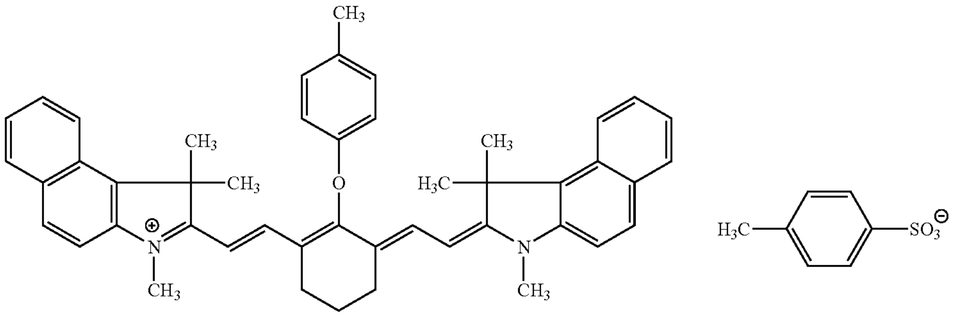
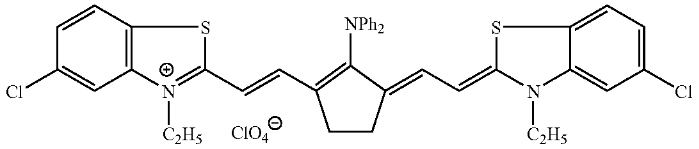
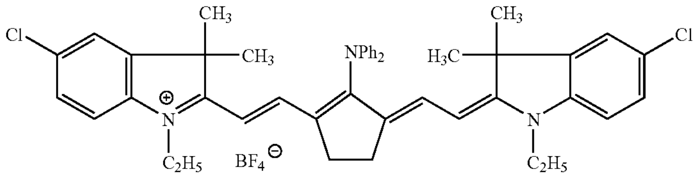
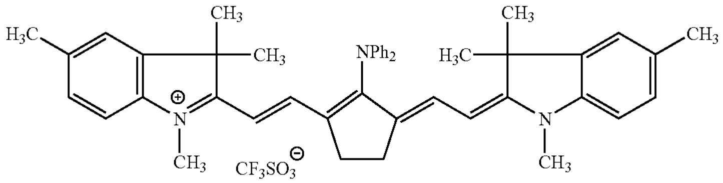
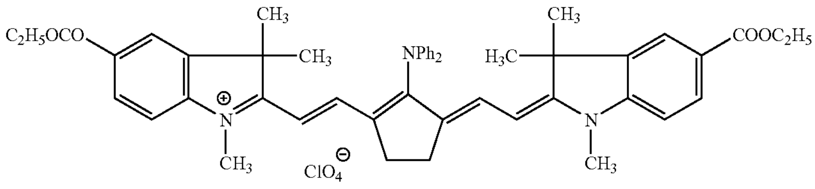

-continued
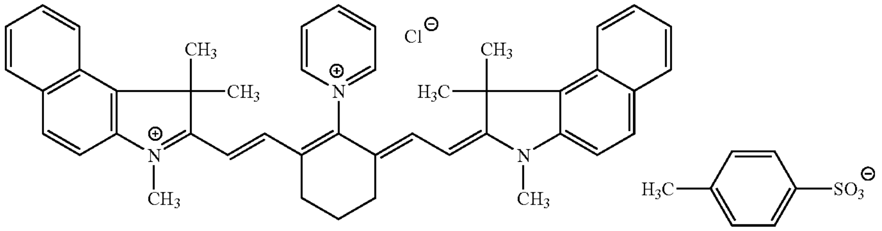
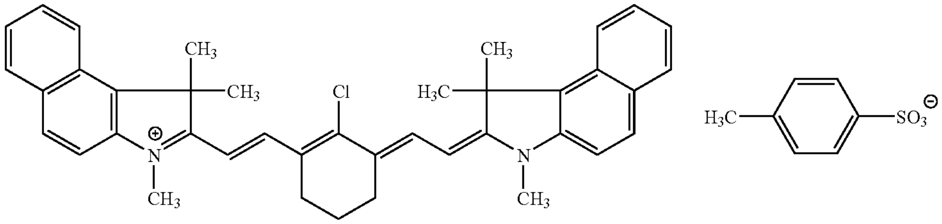
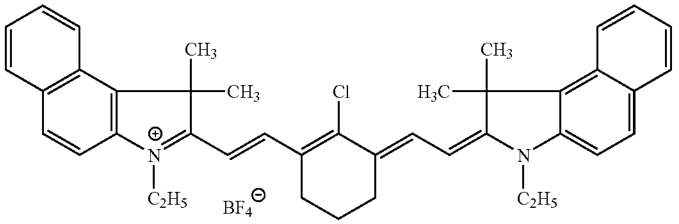
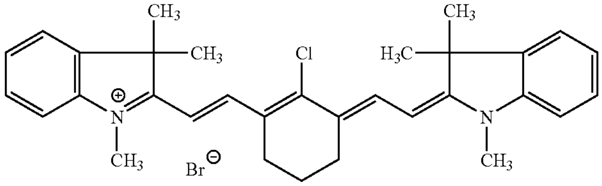
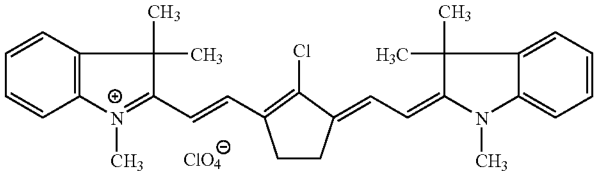
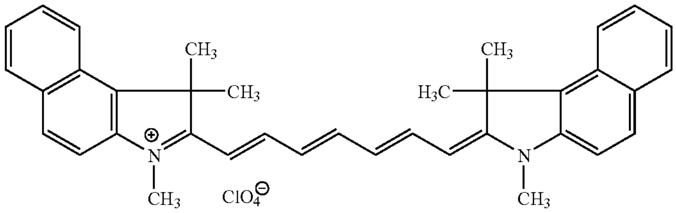
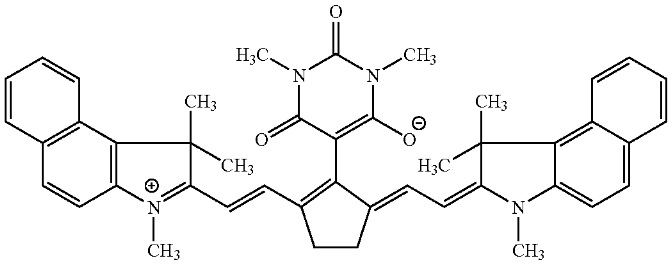

-continued
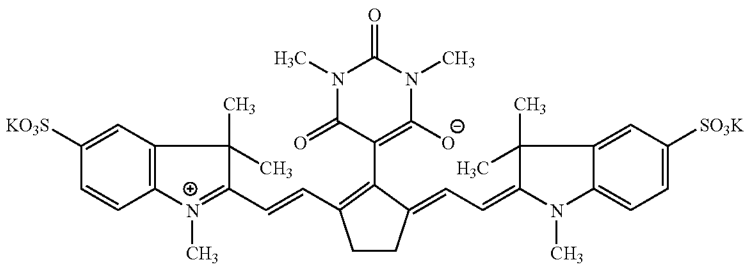
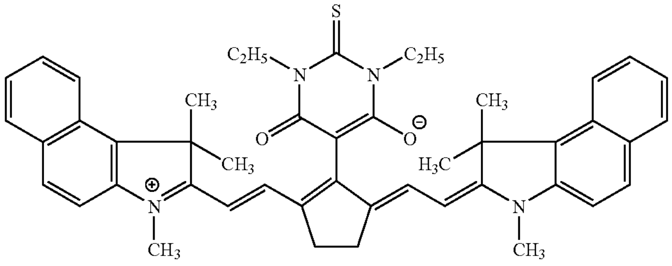
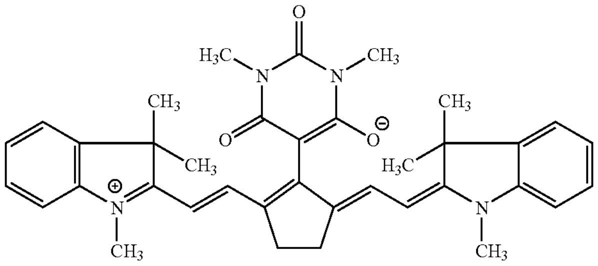
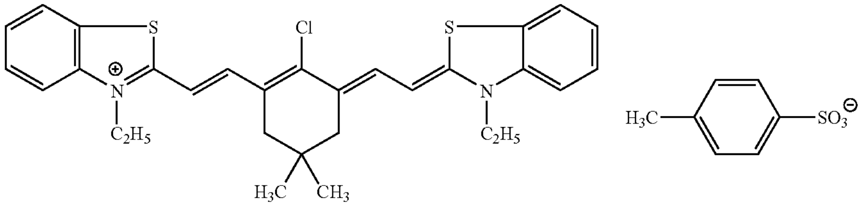
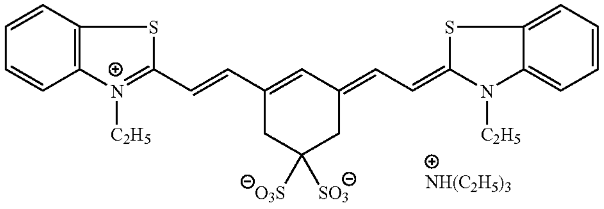
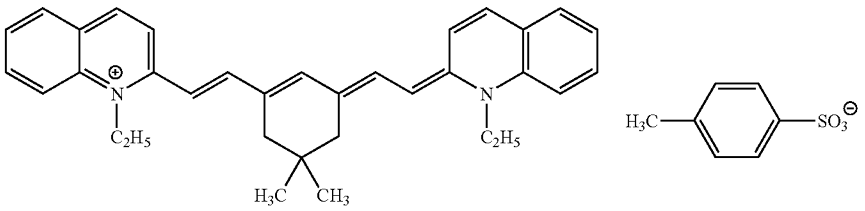
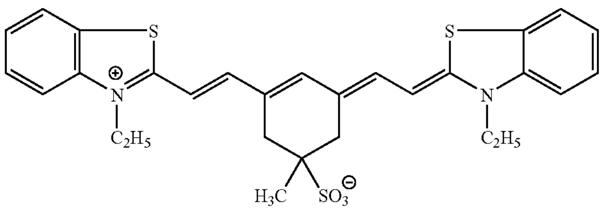

-continued

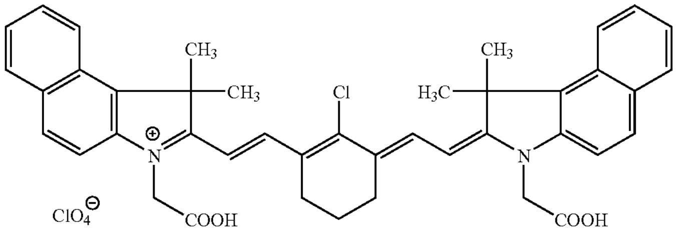

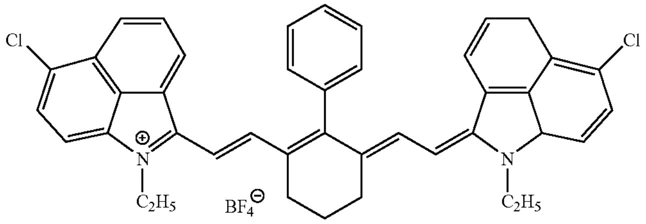

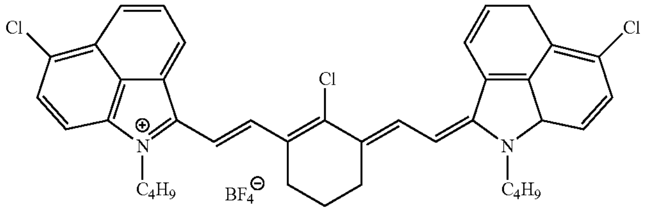

General formula (b)

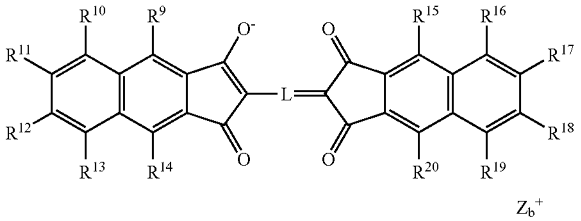

In the general formula (b), L represents a methine chain having 7 or more conjugate carbon atoms, and the methane chain may have substituent(s). If there are a plurality of substituents on the methine chaing, the substituents may combine with each other to form a ring structure. $Zb^+$ represents a counter cation. $Zb^+$ preferably represents an ammonium ion, an iodonium ion, a sulfonium ion, a phosphonium ion, a pyridium ion, or an alkali metal cation ($Na^+$, $K^+$, or $Li^+$). $R^9$ through $R^{14}$ and $R^{15}$ through $R^{20}$ each independently represent a hydrogen atom or a substituent selected from a halogen atom, a cyano group, an alkyl group, an aryl group, an alkenyl group, an alkynyl group, a carbonyl group, a thio group, a sulfonyl group, a sulfinyl group, an oxy group and an amino group, or a substituent obtained by combining two or three of these substituents. Any two of $R^9$ through $R^{14}$ and $R^{15}$ through $R^{20}$ may combine with each other to form a ring structure. Among the compounds represented by the general formula (b), compounds in which L represents a methine chain comprising 7 conjugate carbon atoms, and compounds in which all of $R^9$ through $R^{14}$ and $R^{15}$ through $R^{20}$ represent hydrogen atoms are preferable from the viewpoint of availability and effect thereof.

In the invention, as preferable examples of dyes represented by the general formula (b), the dyes exemplified below can be cited.

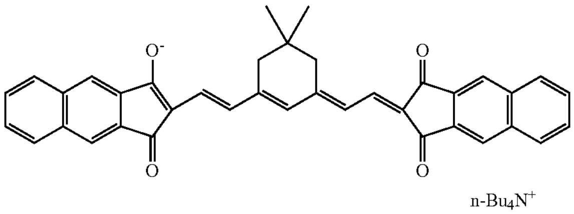

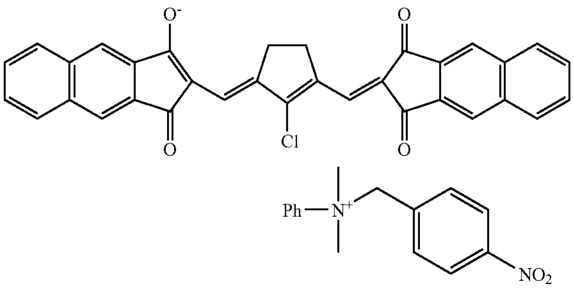

-continued

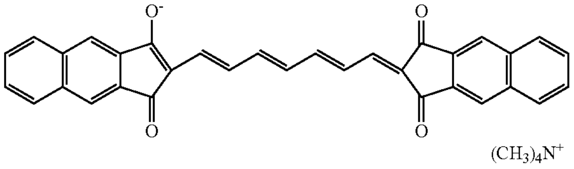

General formula (C)

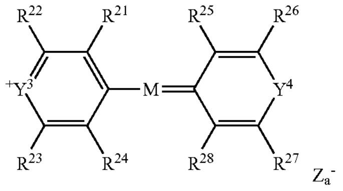

In the general formula (c), $Y^3$ and $Y^4$ each independently represent an oxygen atom, a sulfur atom, a selenium atom or a tellurium atom. M represents a methine chain comprising 5 or more conjugate carbon atoms. $R^{21}$ through $R^{24}$ and $R^{25}$ through $R^{28}$ may be the same as each other or different from each other. $R^{21}$ through $R^{24}$ and $R^{25}$ through $R^{28}$ each independently represent a hydrogen atom, a halogen atom, a cyano group, an alkyl group, an aryl group, an alkenyl group, an alkynyl group, a carbonyl group, a thio group, a sulfonyl group, a sulfinyl group, an oxy group or an amino group. In the general formula (c), $Za^-$ represents a counter anion and has the same definition as that of $Za^-$ in the general formula (a-1).

In the invention, as preferable examples of dyes represented by the general formula (c), the dyes exemplified below can be cited.

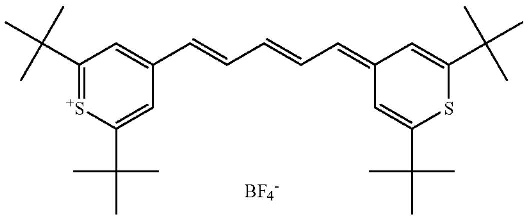

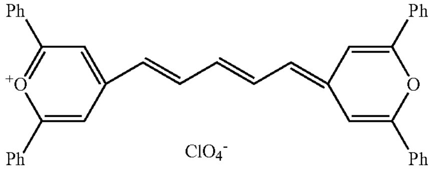

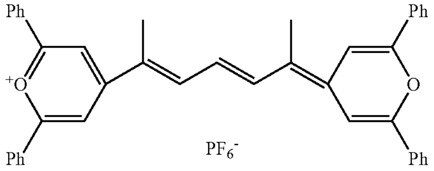

-continued

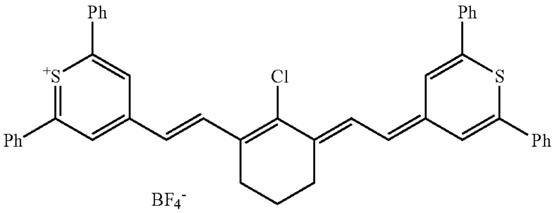

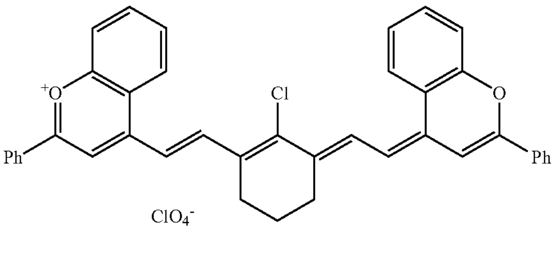

General formula (d)

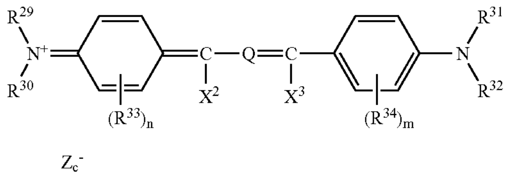

In the general formula (d), $R^{29}$ through $R^{32}$ each independently represent a hydrogen atom, an alkyl group, or an aryl group. $R^{33}$ and $R^{34}$ each independently represent an alkyl group, a substituted oxy group, or a halogen atom. In the general formula (d), n and m each independently represent an integer from 0 to 4. $R^{29}$ and $R^{30}$, or $R^{31}$ and $R^{32}$ may combine with each other to form a ring. $R^{29}$ and/or $R^{30}$ may combine with $R^{33}$ to form a ring. $R^{31}$ and/or $R^{32}$ may combine with $R^{34}$ to form a ring. When there are a plurality of $R^{33}$s, any two of such a plurality of $R^{33}$s may combine with each other to form a ring. When there are a plurality of $R^{34}$s, any two of such a plurality of $R^{34}$s may combine with each other to form a ring. $X^2$ and $X^3$ each independently represent a hydrogen atom, an alkyl group, or an aryl group. Q represents a trimethine group whci may have a substituent or a pentamethine group which may have a substituent, and, together with a divalent organic group, may form a ring structure. $Zc^-$ represents a counter anion and has the same definition as that of $Za^-$ in the general formula (a-1).

In the invention, as preferable examples of dyes represented by the general formula (d), the dyes exemplified below can be cited.

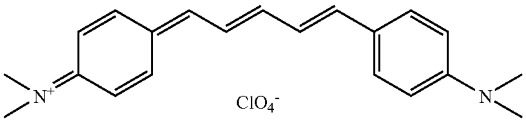

-continued

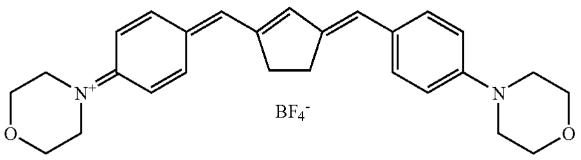

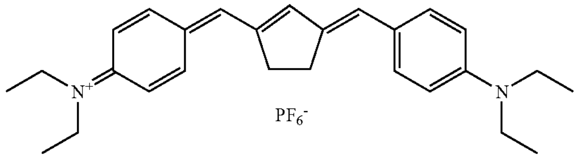

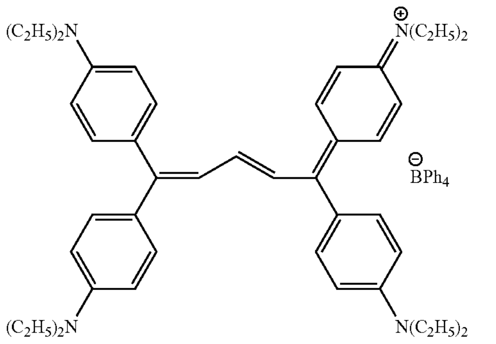

General formula (e)

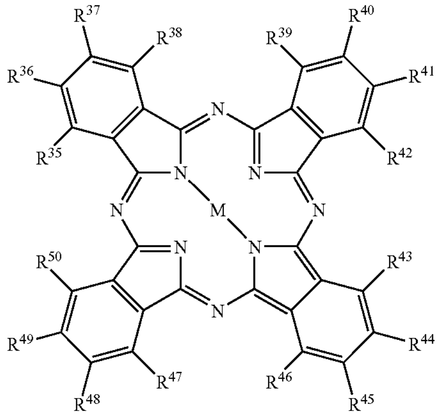

In the general formula (e), $R^{35}$ through $R^{50}$ each independently represent a hydrogen atom, a halogen atom, a cyano group, an alkyl group, an aryl group, an alkenyl group, an alkynyl group, a hydroxyl group, a carbonyl group, a thio group, a sulfonyl group, a sulfinyl group, an oxy group, an amino group or an onium salt structure, all of which may have a substituent. M represents two hydrogen atoms or a metal atom, a halometal group, or an oxymetal group. As the metal contained therein, IA, IIA, IIIB and IVB group atoms, first, second and third period transition metals, and lanthanide elements in the periodic table can be cited. Among these metals, copper, nickel, magnesium, iron, zinc, tin, cobalt, aluminum, titanium, and vanadium are preferable. Vanadium, nickel, zinc and tin are particularly preferable. These metal atoms each may combine with an oxygen atom, a halogen atom, or the like to satisfy its valence number.

In the invention, preferable examples of the dye represented by the general formula (e) include the dyes exemplified below.

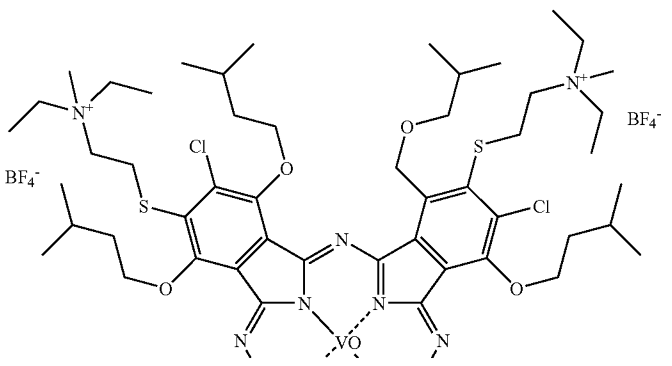

-continued
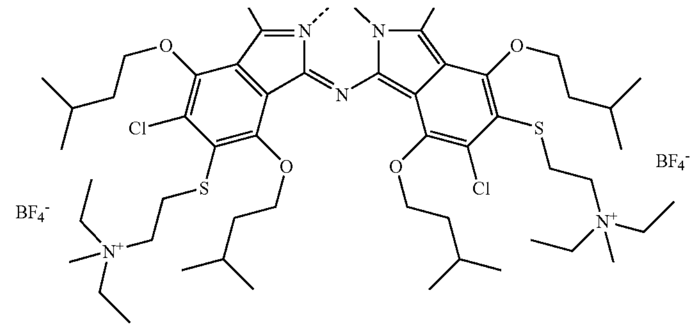
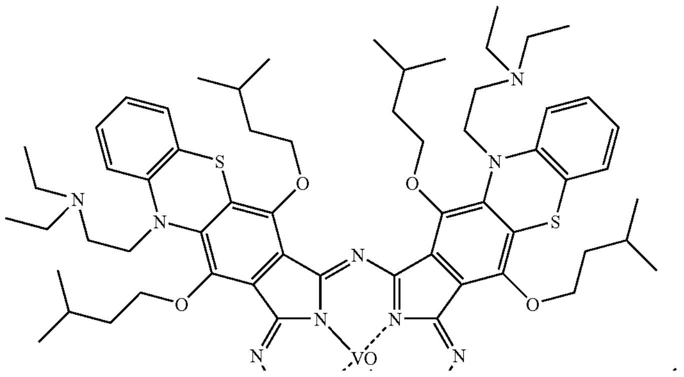
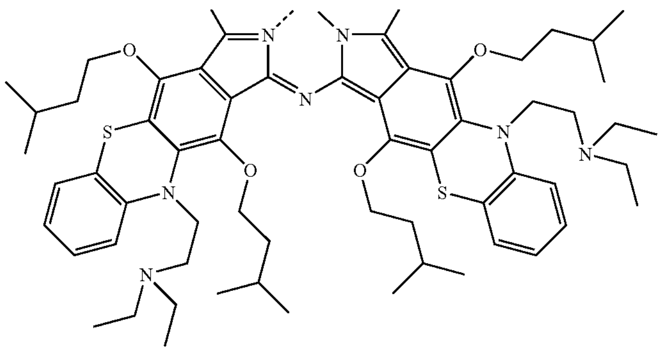
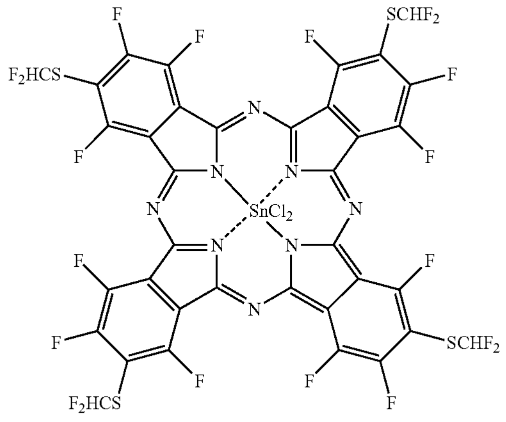

-continued

General formula (f-1)

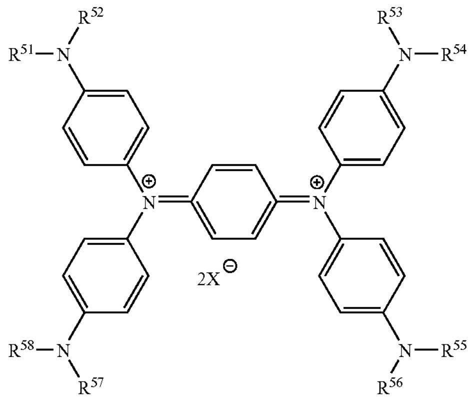

General formula (f-2)

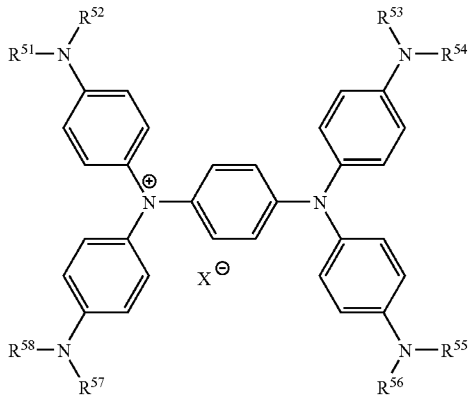

In the general formulas (f-1) and (f-2), $R^{51}$ through $R^{58}$ each independently represent a hydrogen atom, an alkyl group which may have a substituent, or an aryl group which may have a substituent. $X^-$ has the same definition as that in the above general formula (a-2).

In the invention, preferable examples of the dye represented by the general formula (d) include the dyes exemplified below.

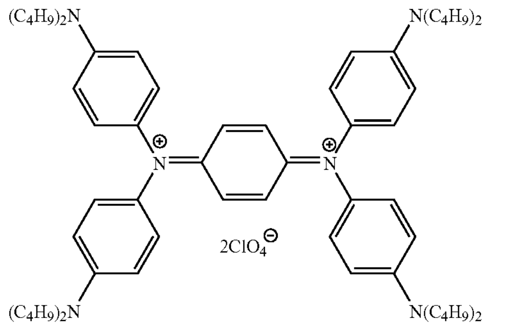

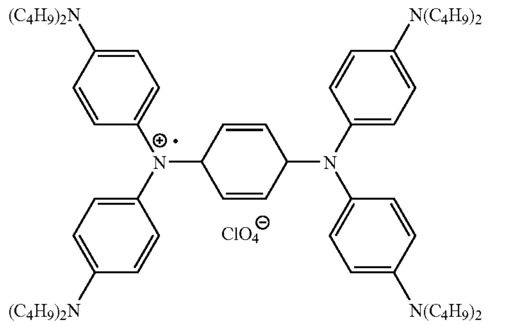

As photo-thermal converting agents other than the above-cited examples, the dyes which have a plurality of chromophoric groups and are described in JP-A No. 2001-242613, the dyes which each have a chromophoric group covalently linked to a polymer compound and are described in JP-A No. 2002-97384 and U.S. Pat. No. 6,124,425, the anionic dyes described in U.S. Pat. No. 6,248,893, and the dyes that each have a surface orienting group and are described in JP-A No. 2001-347765 can be preferably used.

As pigments that can be used as a photo-thermal converting agent in the invention, commercially available pigments and pigments described in "Color Index (C. I.) Handbook", Nippon ganryou gijutsu kyoukai ed., *Saishin ganryou binran* (Current Pigment Handbook, 1977), *Saishin ganryou ouyou gijutsu* (Current Pigment Application Technology) (CMC, 1986), and *Insatsu inki gijutsu* (Printing Ink Technology)(CMC, 1984) can be cited.

Examples of kinds of the pigments include black pigments, yellow pigments, orange pigments, brown pigments, red pigments, violet pigments, blue pigments, green pigments, fluorescent pigments, metal powder pigments, and polymer bonding pigments. Specifically, insoluble azo pigments, azo-lake pigments, condensed azo pigments, chelate azo pigments, phthalocyanine pigments, anthraquinone pigments, perylene pigments, perinone pigments, thioindigo pigments, quinacridone pigments, dioxazine pigments, isoindolinone pigments, quinophthalone pigments, dyeing lake pigments, azine pigments, nitroso pigments, nitro pigments, natural pigments, inorganic pigments and carbon black can be used. Among them, carbon black is preferable.

These pigments may be used after or without being subjected to a surface treatment. The surface treatment may be conducted by a method such as a method of coating the surface of the pigment with a resin or wax, a method of adhering a surfactant to the surface, an a method of combining a reactive substance (for example, a silane coupling agent, an epoxy compound, or a polyisocyanate) with the surface of the pigment. The above-mentioned surface treatment methods are described in *Kinzoku sekken no seishitsu to Ouyou* (Properties of Metallic Soaps and their Applications) (Saiwai Shobou), *Insatsu Inki Gijutsu* (Printing Ink Technology) (CMC, 1984), and *Saishin ganryou ouyou gijutsu* (Current Pigment Application Technology) (CMC, 1986).

The particle diameter of the pigment is preferably in the range of from 0.01 to 10 μm, more preferably from 0.05 to 1 μm, and particularly preferably from 0.1 to 1 μm. When the particle diameter of the pigment is less than 0.01 μm, the stability of the material dispersed in an image forming layer coating solution is unsatisfactory, and when the particle diameter is greater than 10 μm, the uniformity of the image forming layer is unsatisfactory.

As the method for dispersing the pigment, a known dispersing technology that is used in production of ink, toner or the like can be used. Examples of the dispersing machine include an ultrasonic disperser, a sand mill, an attriter, a pearl mill, a super mill, a ball mill, an impeller, a disperser, a KD mill, a colloid mill, a dynatron, a three roll mill, and a press kneader. The details thereof are described in *Saishin ganryou Ouyou gijutsu* (Current Pigment Application Technology) (CMC, 1986).

The pigment or the dye can be added in an amount of 0.01 to 50% by mass, preferably 0.1 to 10% by mass, based on the total mass of all solids content of the image forming layer (recording layer). In the case of a dye, an amount of 0.5 to 10% by mass is particularly preferable. In the case of a pigment, an amount of 0.1 to 10% by mass is particularly preferable. When an amount of the pigment or dye added is less than 0.01% by mass, the sensitivity tends to decrease. When the amount is more than 50% by mass, with an increase of an amount compounded, the uniformity of the recording layer is lost, and durability of the recording layer may be deteriorated. Single kind of dye or pigment may be used or a multiple kinds of dyes or pigments may be used in combination. In order to support exposure machines each having a different wavelength, dyes or pigments each having a different absorption wavelength can be preferably used in combination.

(Other Components)

When the positive image forming layer according to the invention is formed, in accordance with necessity, an additive can be further added. It is preferable, from the viewpoint of improving the effect of inhibiting an image portion from being dissolved by a developer, to use a substance that is thermally decomposable and substantially reduces the solubility of the alkaline water-soluble polymer compound in the intact state. Examples of such a substance include other onium salts, o-quinonediazide compounds, aromatic sulfone compounds, and aromatic sulfonic acid esters. Such other onium salts are, in the case of the first image forming layer according to the invention, onium salts other than the onium salts represented by the general formula (1-1). In the case of the second image forming layer according to the invention, such other onium salts are onium salts other than the onium salts represented by the general formula (1-2). Examples of the other onium salt include diazonium salts, ammonium salts, phosphonium salts, iodonium salts, sulfonium salts, selenonium salts, arsonium salts and azinium salts.

Preferable examples of the other onium salts used in the invention include the diazonium salts described in S. I. Schlesinger, "Photogr. Sci. Eng.", 18 (1974), 387, T. S. Bal et al., "Polymer", 21 (1980), 423 and JP-A No. 5-158230; the ammonium salts described in U.S. Pat. Nos. 4,069,055 and 4,069,056, and JP-A No. 3-140140; the phosphonium salts described in D. C. Necker et al., "Macromolecules", 17 (1984), 2468, C. S. Wen et al, "Teh, Proc. Conf. Rad. Curing ASIA", Tokyo, October (1988), p. 478, and U.S. Pat. Nos. 4,069,055 and 4,069,056; the iodonium salts described in J. V. Crivello et al., "Macromolecules", 10(6), (1977) 1307, "Chem. & Eng. News", Nov. 28 (1988), p. 31, EP Patent No. 104,143, U.S. Pat. Nos. 5,041,358 and 4,491,628 and JP-A Nos. 2-150848 and 2-296514; the sulfonium salts described in J. V. Crivello et al, "Polymer J." 17 (1985), 73, J. V. Crivello et al, "J. Org. Chem.", 43 (1978), 3055, W. R. Watt et al, "J. Polymer Sci.", "Polymer Chem. Ed.", 22 (1984), 1789, J. V. Crivello et al, "Polymer Bull.", 14 (1985), 279, J. V. Crivello et al, "Macromolecules", 14(5) (1981), 1141, J. V. Crivello et al, "J. Polymer Sci.", "Polymer Chem. Ed.", 17 (1979), 2877, EP Patent Nos. 370,693, 233,567, 297,443 and 297,442, U.S. Pat. Nos. 4,933,377, 3,902,114, 5,041,358, 4,491,628, 4,760,013, 4,734,444 and 2,833,827, DE Patent Nos. 2,904,626, 3,604,580 and 3,604,581; the selenonium salts described in J. V. Crivello et al, "Macromolecules", 10(6) (1977), 1307, and J. V. Crivello et al, "J. Polymer Sci.", "Polymer Chem. Ed.", 17 (1979), 1047; and the arsonium salts described in C. S. Wen et al, "Teh, Proc. Conf. Rad. Curing ASIA", p. 478 Tokyo, October (1988), and the like.

Among other onium salts, diazonium salts are particularly preferable. Furthermore, as particularly preferable diazonium salts, the compounds described in JP-A No. 5-158230 can be cited.

Examples of the counter ion in the other onium salt include tetrafluoroboric acid, hexafluorophosphoric acid, triisopropylnaphthalene sulfonic acid, 5-nitro-o-toluene sulfonic acid, 5-sulfosalicylic acid, 2,5-dimethylbenzene sulfonic acid, 2,4,6-trimethylbenzene sulfonic acid, 2-nitrobenzene sulfonic acid, 3-chlorobenzene sulfonic acid, 3-bromobenzene sulfonic acid, 2-fluorocaprylnaphthalene sulfonic acid, dodecylbenzene sulfonic acid, 1-naphthol-5-sulfonic acid, 2-methoxy-4-hydroxy-5-benzoyl-benzene sulfonic acid, and p-toluene sulfonic acid. Among them, hexafluorophosphoric acid, and alkylaromatic sulfonic acids such as triisopropylnaphthlene sulfonic acid and 2,5-dimethylbenzene sulfonic acid are particularly preferable.

As preferable quinonediazides, o-quinonediazide compounds can be cited. The o-quinonediazide compound used in the invention is a compound that has at least one o-quinonediazide group and increases the alkali-solubility thereof owing to thermal decomposition, and o-quinonediazide compounds of various structures can be used. That is, o-quinonediazide helps the dissolution of a photosensitive material since, when the o-quinonediazide is thermally decomposed, the o-quinonediazide ceases to inhibit a binder from being dissolved and the o-quinonediazide itself transforms to alkali-soluble substance. Examples of the o-quinonediazide compound usable in the invention include the compounds described in J. Coser *Light-sensitive Systems* (John Wiley & Sons. Inc.), pp. 339 to 352. Particularly preferable examples of the o-quinonediazide include sulfonic acid esters or sulfonic acid amides of o-quinonediazide obtained by reacting o-quinonediazindes with various aromatic polyhydroxy compounds or aromatic amino compounds. An ester of benzoquinone-(1,2)-diazidesulfonic acid chloride or naphthoquinone-(1,2)-diazide-5-sulfonic acid chloride with a pyrogallol-acetone resin as described in JP-B No. 43-28403, or an ester of benzoquinone-(1,2)-diazidesulfonic acid chloride or naphthoquinone-(1,2)-diazide-5-sulfonic acid chloride with a phenol-formaldehyde resin as described in U.S. Pat. Nos. 3,046,120 and 3,188,210 can also be suitably used.

An ester of naphthoquinone-(1,2)-diazide-4-sulfonic acid chloride with a phenol-formaldehyde resin or a cresol-formaldehyde resin, and an ester of naphthoquinone-(1,2)-diazide-4-sulfonic acid chloride with a pyrogallol-acetone resin can also be suitably used. Other useful o-quinonediazide compounds are known and reported in a number of patents. For example, o-quinonediazide compounds described in JP-A Nos. 47-5303, 48-63802, 48-63803, 48-96575, 49-38701 and 48-13354, JP-B Nos. 41-11222, 45-9610 and 49-17481, U.S. Pat. Nos. 2,797,213, 3,454,400, 3,544,323, 3,573,917, 3,674,495 and 3,785,825, U.K.Patent Nos. 1,227,602, 1,251,345, 1,267,005, 1,329,888 and 1,330,932, and German patent DE 854,890 can be used.

An amount of the o-quinonediazide compound added is preferably from 1 to 50% by mass, more preferably from 5 to 30% by mass, and particularly preferably from 10 to 30% by mass, based on the total solids content of the image forming material. Single kind of o-quinonediazide compound can be used, or a multiple kinds of o-quinonediazinde compounds can be used in combination.

An addition amount of an additive other than the o-quinonediazide compound is preferably from 1 to 50% by mass, more preferably from 5 to 30% by mass, and particularly preferably from 10 to 30% by mass, based on the total solids content of the image forming material. An additive and a binder used in the invention are preferably contained in the same layer.

In order to improve sensitivity further, a cyclic acid anhydride, a phenol and an organic acid can be further used. The cyclic acid anhydride may be a phthalic anhydride, a tetrahydrophthalic anhydride, a hexahydrophthalic anhydride, a 3,6-endooxy-Δ4-tetrahydrophthalic anhydride, tetrachlorophthalic anhydride, maleic anhydride, chloromaleic anhydride, α-phenylmaleic anhydride, succinic anhydride, or pyromellitic anhydride, all of which are described in U.S. Pat. No. 4,115,128. Examples of the phenol include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, and 4,4',3",4"-tetrahydroxy-3,5,3',5'-tetramethyltriphenylmethane. Examples of the organic acid include the sulfonic acids, the sulfinic acids, the alkylsulfuric acids, the phosphonic acids, the phosphoric acid esters, and the carboxylic acids described in JP-A Nos. 60-88942 and 2-96755. Specific examples the organic acid include p-toluene sulfonic acid, dodecylbenzene sulfonic acid, p-toluene sulfinic acid, ethylsulfuric acid, phenylphosphonic acid, phenylphophinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid. A total proportion of the above-mentioned cyclic acid anhydrides, phenols and organic acids in an image forming material is preferably from 0.05 to 20% by mass, more preferably from 0.1 to 15% by mass, and particularly preferably from 0.1 to 10% by mass.

In an image forming layer coating solution in the invention, in order to ensure stability of development under broader variety of development conditions, it is possible to add at least one of nonionic surfactants such as ones described in JP-A Nos. 62-251740 and 3-208514, amphoteric surfactants such as ones described in JP-A Nos. 59-121044 and 4-13149, siloxane-based compounds such as ones described in EP No. 950517, and fluorine-containing monomer copolymers such as ones described in JP-A No. 11-288093.

Specific examples of the nonionic surfactant include sorbitan tristearate, sorbitan monopalmitate, sorbitan trioleate, monostearin, and polyoxyethylene nonylphenyl ether. Specific examples of the amphoteric surfactant include alkyldi(aminoethyl)glycine, alkylpolyaminoethylglycine hydrochloride, 2-alkyl-N-carboxyethyl-N-hydroxyethyl imidazolynium betaine, and N-tetradecyl-N,N-betaine type surfactant (for example, trade name “AMOGEN K”, manufactured by Dai-ichi Kogyo Corporation.).

As the siloxane-based compound, a block copolymer of dimethylsiloxane and polyalkylene oxide is preferable, and specific examples thereof include polyalkylene oxide modified silicones such as DBE-224, DBE-621, DBE-712, DBP-732 and DBP-534 manufactured by Chisso Corporation, TEGO GLIDE 100 manufactured by Tego Corporation (Germany).

A total proportion of the above-mentioned nonionic surfactants and the amphoteric surfactants in an image forming material is preferably from 0.05 to 15% by mass, and more preferably from 0.1 to 5% by mass.

The image forming layer according to the invention may comprise a printing-out agent for obtaining a visible image immediately after heating by exposure, or a dye or pigment as an image coloring agent.

A combination of a compound (light acid releasing agent) that release an acid owing to heat which is generated by exposure and an organic dye capable of forming a salt is a typical example of the print-out agent. Specific examples of the combination include a combination of o-naphthoquinonediazide-4-sulfonic acid halogenide and a salt-forming organic dye described in JP-A Nos. 50-36209 and 53-8128, and a combination of a trihalomethyl compound and a salt-forming organic dye described in JP-A Nos. 53-36223, 54-74728, 60-3626, 61-143748, 61-151644 and 63-58440. Examples of the trihalomethyl compound include oxazole-based compounds and triazine-based compounds. Both types of compounds have excellent temporal stability and give clear print-out image.

As the image coloring agent, a dye other than the above-mentioned salt-forming organic dyes can also be used. An oil-soluble dye or a basic dye is preferably used as such another dye or the salt-forming organic dye. Specific examples thereof include OIL YELLOW #101, OIL YELLOW #103, OIL PINK #312, OIL GREEN BG, OIL BLUE BOS, OIL BLUE #603, OIL BLACK BY,OIL BLACK BS, OIL BLACK T-505 (all of these are manufactured by Orient Chemical Industries, Ltd.), Victoria Pure Blue, Crystal Violet (CI42555), Methyl Violet (CI42535), Ethyl Violet, Rhodamine B (CI145170B), Malachite Green (CI42000) and Methylene Blue (CI52015). The dyes described in JP-A No. 62-293247 are particularly preferable. These dyes can be added in an image forming material in an amount of 0.01 to 10% by mass, and preferably 0.1 to 3% by mass based on the total solids content of the image forming material. In accordance with necessity, a plasticizer is added to an image forming material according to the invention to provide a film with flexibility. Examples of the plasticizer include oligomers and polymers of butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, acrylic acid, and methacrylic acid.

Further, epoxy compounds, vinyl ethers, the phenol compounds each having a hydroxymethyl group described in JP-A No. 8-276558, phenol compounds each having an alkoxymethyl group, and the cross-linking compounds having alkali-dissolution inhibiting effect described in JP-A No. 11-160860, which has been proposed by the present inventors, can be appropriately added in accordance with an object.

The image forming material according to the invention, which is formed by forming an image forming layer on a suitable substrate, can be used for various applications such as a planographic printing plate precursor, color proof, and display material. The image forming material according to the invention is particularly useful as a heat-mode type planographic printing plate precursor that can be subjected to direct plate-making with infrared laser exposure.

(Planographic Printing Plate Precursor)

In the following, specific examples will be explained with examples in which an image forming material according to the invention is used as a planographic printing plate precursor.

(Image Forming Layer)

A planographic printing plate precursor utilizing the image forming material according to the invention can be produced by dissolving ingredients of a photosensitive layer (image forming layer) coating solution in a solvent followed by coating the obtained photosensitive layer coating solution on a suitable substrate. In addition, in accordance with an object, a protective layer, a resin intermediate layer, a back coat layer, or the like can be provided in a similar manner.

Example of the solvent include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone and toluene. A single kind of solvent may be used or a plurality kinds of solvents may be used in combination.

A concentration of the above components (a total solids content including additives) in the solvent is preferably in the range of from 1 to 50% by mass.

A coated amount (solids content) on the substrate after coating and drying varies based on applications of the image forming layer. In the case of an image forming layer of a planographic printing plate precursor, the coated amount is generally preferably in the range of from 0.5 to 5.0 $g/m^2$. As the coated amount becomes smaller, apparent sensitivity becomes larger, however the film characteristics of the image forming layer deteriorate.

Further, a single image forming layer may be provided, or a multiple image forming layers may be provided.

Various coating methods can be employed. For instance, bar coater coating, rotary coating, spray coating, curtain coating, dip coating, air knife coating, blade coating and roll coating can be cited.

In order to improve coating properties, the image forming layer according to the invention may contain a surfactant such as a fluorine-type surfactant described in JP-A No. 62-170950. An addition amount is preferably in the range of from 0.01 to 1% by mass and more preferably from 0.05 to 0.5% by mass relative to a total solids content in the image forming layer.

(Resin Intermediate Layer)

In the planographic printing plate precursor according to the invention, a resin intermediate layer may be provided between an image forming layer and a substrate in accordance with necessity.

When a resin intermediate layer is provided, the image forming layer whose solubility in an alkali developer increases by exposure to an infrared radiation is still on the exposure surface or close to the exposure surface, and has good sensitivity to an infrared laser beam. A resin intermediate layer made of a polymer provided between a substrate and an image forming layer functions as a heat-insulating layer so that heat generated by exposure to an infrared laser beam is not diffused to the substrate and used efficiently for formation of image, thereby attaining higher sensitivity. It is considered that in an unexposed portion, since the image forming layer, which is impermeable to an alkali developer, functions as a layer protecting the resin intermediate layer, development stability is improved. Therefore, an image having excellent discrimination is formed, and a periodical stability is ensured. On the other hand, in an exposed portion, the component of the image forming layer, which are no longer inhibited from dissolving in an alkali developer, readily dissolve and disperse in the developer. Further, since the resin intermediate layer, which is made of an alkali-soluble polymer, has a high solubility in the developer, the intermediate layer dissolves in the developer well. Accordingly, even when a developer having a decreased activity is used, an image portion dissolves quickly without leaving a residual film. In this way an intermediate layer contributes also to improve developability. For the reasons recited above, it is considered that the resin intermediate layer is useful.

(Substrate)

Examples of the substrate that can be used in the invention include dimensionally stable plate materials, such as paper, paper laminated with plastic (such as polyethylene, polypropylene and polystyrene), metal plates (such as aluminum, zinc and copper), plastic films (such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinylacetal), paper or plastic films laminated with or metallized with metals such as the above metals.

The substrate according to the invention is preferably a polyester film or an aluminum plate particularly when it is used in a planographic printing plate precursor. Among these materials, an aluminum plate, which has high dimensional stability and is relatively inexpensive, is particularly preferable. A preferable aluminum plate is a pure aluminum plate, an alloy plate containing aluminum as a major component and trace amount(s) of foreign element(s), or a plastic film laminated with or metallized with aluminum. Examples of foreign elements contained in the aluminum alloy include silicon, iron, manganese, copper, magnesium, chromium, zinc, bismuth, nickel and titanium. A total content of these foreign elements in the alloy is no more than 10% by mass. Particularly preferable aluminum in the invention is pure aluminum. However, since it is difficult to produce perfectly pure aluminum from the viewpoint of refining technology, the aluminum plate may contain trace foreign elements.

As aforementioned, the composition of the aluminum plate used in the invention is not specified, and aluminum plates which have been well known or commonly used may be used appropriately. A thickness of the aluminum plate used in the invention is substantially from 0.1 to 0.6 mm, preferably from 0.15 to 0.4 mm and particularly preferably from 0.2 to 0.3 mm.

Prior to roughing an aluminum plate, in accordance with necessity, degreasing treatment with, for instance, a surfactant, an organic solvent, or an aqueous alkaline solution is carried out to remove rolling oil on the surface. The surface roughing treatment of the surface of the aluminum plate is carried out by any of various methods. For example, the surface roughing treatment is carried out by mechanically roughening surface, by electrochemically dissolving and roughening a surface, or by dissolving a surface chemically and selectively. As the mechanical methods, known methods such as ball polishing methods, brush polishing methods, blast polishing methods and buff polishing methods may be used. Further, as the electrochemical surface roughing method, a surface may be roughened with alternating current or direct current in a hydrochloric acid or nitric acid electrolytic solution. Also, as disclosed in JP-A No. 54-63902, a method in which both the mechanical surface-roughening and the electrochemical surface-roughening are combined may be employed. Thus surface roughened aluminum plate is, in accordance with necessity, subjected to an alkali etching and a neutralizing treatment, and thereafter, optionally, subjected to an anodic oxidation treatment in order to improve the moisture retention and wear resistance of the surface. The electrolyte used for the anodic oxidation treatment of the aluminum plate is selected from the various electrolytes that form a porous oxidation film. The electrolyte may be, generally, sulfuric acid, phosphoric acid, oxalic acid, chromic acid or a mixture thereof. A concentration of the electrolyte is appropriately determined based on the kind of the electrolyte.

The treating conditions of the anodic oxidation cannot be uniquely specified because a suitable condition varies based on the kind of the electrolyte. However, in general, regarding the anodic oxidation conditions, it is suitable that a concentration of the electrolyte should be from 1 to 80% by mass in the solution, a solution temperature should be 5 to 70 degree centigrade, a current density should be from 5 to 60 $A/dm^2$, a voltage should be from 1 to 100 V, and an electrolyzation time should be from 10 seconds to 5 minutes. When an amount of the anodic oxidation film is less than 1.0 $g/m^2$, press life is insufficient and a non-image portion of the planographic printing plate tends to be scarred. Hence, a so-called "scar-stain", that is, an adherence of ink to a scar during printing, tends to occur. After the anodic oxidation treatment is conducted, the surface of the aluminum plate may be optionally subjected to a hydrophilicity-imparting treatment. The method for imparting hydrophilicity to the aluminum surface may be selected from an alkali metal silicate (for instance, aqueous sodium silicate solution) method such as the methods described in U.S. Pat. Nos. 2,714,066, 3,181,461, 3,280,734 and 3,902,734. In this method, the substrate is dipped or electrolytically treated in an aqueous sodium silicate solution. Alternatively, a method in which the substrate is treated with potassium fluorozirconate disclosed in JP-B No. 36-22063 or a method in which the substrate is treated with polyvinylphosphonic acid disclosed in U.S. Pat. Nos. 3,276,868, 4,153,461 or 4,689,272 can be used.

In the planographic printing plate precursor according to the invention, a positive-type image forming layer is provided on a substrate; however, in accordance with necessity, an undercoat layer may be disposed between the positive-type image forming layer and the substrate.

Various organic compounds can be used as the components for the undercoat layer. The undercoat layer may include an organic compound selected from, for example, carboxymethyl cellulose; dextrin; gum arabic; phosphonic acids having an amino group, such as 2-aminoethylphosphonic acid; organic phosphonic acids such as phenylphosphonic acid, naphthylphosphonic acid, alkylphosphonic acid, glycerophosphonic acid, methylenediphosphonic acid and ethylenediphosphonic acid, all of which may have a substituent; organic phosphoric acids such as phenylphosphoric acid, naphthylphosphoric acid, alkylphosphoric acid and glycerophosphoric acid, all of which may have a substituent; organic phosphinic acids such as phenylphosphinic acid, naphthylphosphinic acid, alkylphosphinic acid and glycerophosphinic acid, all of which may have a substituent; amino acids such as glycine and β-alanine; and hydrochlorides of amines each having a hydroxyl group, such as hydrochloride of triethanolamine. Two or more of these compounds may be used in combination.

The organic undercoat layer may be provided by the following method. That is, a solution obtained by dissolving component(s) of the undercoat layer in water or an organic solvent such as methanol, ethanol or methyl ethyl ketone or a mixture solvent thereof is coated on the aluminum plate and dried to form an undercoat layer. Alternatively the organic under coat layer may be provided by a method in which the aluminum plate is dipped in a solution obtained by dissolving component(s) in water or an organic solvent such as methanol, ethanol and methyl ethyl ketone or a mixture solvent thereof to allow the components to be adsorbed by the aluminum plate, followed by washing with water or the like and by drying to form an organic undercoat layer. In the former method, a solution containing the organic compound (component of the undercoat layer) in an amount of 0.005 to 10% by mass may be applied by any one of various methods.

Furthermore, in the latter method, a concentration of the solution is from 0.01 to 20% by mass and preferably from 0.05 to 5% by mass; a dipping temperature is from 20 to 90° C. and preferably from 25 to 50° C.; and a dipping time is from 0.1 seconds to 20 minutes and preferably from 2 seconds to 1 minute. A pH of the solution may be adjusted in the pH range of 1 to 12 by using a basic material such as ammonia, triethylamine or potassium hydroxide or an acidic material such as hydrochloric acid or phosphoric acid. Further, a yellow dye may be added to improve tone reproducibility of the image recording material.

A coated amount of the organic undercoat layer is properly from 2 to 200 $mg/m^2$ and preferably 5 to 100 $mg/m^2$. When the above coating amount is less than 2 $mg/m^2$, a sufficient press life is not obtained. Also when the coating amount is greater than 200 $mg/m^2$, a sufficient press life is not obtained.

(Exposure Development)

The positive planographic printing plate precursor obtained above is usually subjected to an image-wise exposure process and a developing process.

A light source of beam of rays used in the image-wise exposure process has an emission wavelength preferably in a range from the near-infrared region to the infrared region. The light source is particularly preferably a solid laser or a semiconductor laser.

As a developer and a replenisher of the planographic printing plate precursor according to the invention, a conventionally known aqueous alkali solution can be used.

Examples of the alkali include inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide and lithium hydroxide. Alternatively, organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine may be used. A single alkali agent may be used or a multiple alkali agents may be used in combination.

Particularly preferable developers are aqueous solutions of silicates such as sodium silicate and potassium silicate. This is because the developability can be controlled by changing concentrations of silicon oxide $SiO_2$, which is a component of a silicate, and an alkali metal oxide $M_2O$, and by changing a ratio between the $SiO_2$ and the $M_2O$. Alkali metal silicates such as the alkali metal silicates described in JP-A No. 54-62004 and JP-B No. 57-7427 may be used effectively.

When an automatic processor is used in the development, it is known that, by adding an aqueous solution (replenisher) having higher alkalinity than a developer to the developer, a large number of planographic printing plate precursors can be developed without exchanging the developer in a developing tank for a long period of time. This replenishing system is also preferable in the invention.

Various surfactants or organic solvents may be optionally added to a developer and a replenisher with the intention of promoting or suppressing developability, dispersing developing refuse and improving affinity of an image portion on the printing plate to ink.

Preferable examples of the surfactant include anionic, cationic, nonionic and amphoteric surfactants. In accordance with necessity, a reducing agent such as a sodium salt or a potassium salt of an inorganic acid such as hydroquinone, resorcinol, sulfurous acid, or hydrogensulfurous acid; an organic carboxylic acid; an antifoaming agent; or a water softener may be further added to a developer or to a replenisher.

The printing plate that has been developed with the foregoing developer and replenisher is subjected to post-treatment with rinsing water, a rinsing solution containing a surfactant or the like, or a desensitizing solution containing gum arabic or a starch derivative. These treatments may be variously combined and used in the post-treatment when the image recording material according to the invention is used as a printing plate.

In recent years, in plate-making and printing fields, automatic processors for printing plates have been widely used for rationalization and standardization of plate-making works. This automatic processor can be generally divided into a developing section and a post-treating section. The automatic processor generally comprises an apparatus for transporting a printing plate, respective processing solution tanks, and a spraying unit, wherein each processing solution which is pumped up by a pump is sprayed from a spray nozzle while an exposed plating plate is transported horizontally. Recently, a method has been known in which a printing plate is dipped and transported by in-liquid guide rolls in a processing solution tank which is filled with a processing solution. In such an automatic processing, a printing plate can be processed while a replenisher is supplied to each processing solution in accordance with a processed amount and an operating time. Alternatively, a so-called disposable processing system in which development is carried out with a substantially unused processing solution can be employed.

In the invention, when there is an unnecessary image portion (for example, a trace corresponding to a film edge of a original picture film) on a planographic printing plate which is obtained through image-wise exposure, development, washing with water and/or rinsing and/or gumming, the unnecessary image portion is erased. The unnecessary image portion is erased preferably by a method in which an erasing solution is coated on the unnecessary image portion, allowed to stand for a predetermined time, then washed with water, as described in JP-B No. 2-13293. Alternatively, the unnecessary portion may be erased by a method as described in JP-A No. 59-174842 in which the unnecessary image portion is irradiated with active rays propagated through an optical fiber, followed by development.

Thus-obtained planographic printing plate may be used for printing after optionally coated with desensitizing gum. In order to improve a press life of the planographic printing plate further, baking treatment is carried out. If the planographic printing plate is subjected to the baking, it is preferably subjected, in advance of the baking, to a treatment with a surface conditioner such as the surface conditioners described in JP-B Nos. 61-2518, 55-28062, JP-A Nos. 62-31859 and 61-159655.

When such a surface conditioner is used, the surface conditioner may be applied to a surface of the planographic printing plate with a sponge or absorbent cotton impregnated with the solution, or the printing plate may be dipped in a vat filled with the surface conditioner to be coated with the surface conditioner, or the surface conditioner may be applied to a surface of the printing plate by an automatic coater. In order to obtain a better result, after the planographic printing plate is coated with a surface conditioner, a coated amount of the surface conditioner is preferably equalized with a squeegee or a squeegee roller.

Generally, the coating amount of the surface regulating solution may adequately be from 0.03 to 0.8 $g/m^2$ (dry mass). The planographic printing plate coated with the surface conditioner is, if necessary, heated to a high temperature by a baking processor (for example, Baking Processor: “BP-1300”, commercially available from Fuji Photo Film Co., Ltd.) after dried. A heating temperature in baking process is preferably in the range of 180 to 300° C. A heating time in baking process is preferably in the range of 1 to 20 minutes. However, suitable heating time and heating temperature vary based on type(s) of component(s) that form(s) an image.

The planographic printing plate after the baking treatment may be optionally subjected to conventional treatments such as washing with water and gumming. However, when a surface conditioner containing a water-soluble polymer compound is used, a so-called desensitizing treatment such as gumming may be omitted. The planographic printing plate obtained in this way is set in an offset printer and used for making a large number of prints.

EXAMPLES

In the following, the present invention will be specifically explained by using examples. However, the invention is by no means restricted to the examples.

(Preparation of Substrate)

Combinations of the following processes were applied to 0.3 mm thick JIS-A-1050 aluminum plates, whereby substrates A, B, C and D were prepared.

(a) Mechanical Surface Roughening

While a suspension of abrasive (siliceous sand) having a specific gravity of 1.12 in water was supplied to a surface of the aluminum plate as a polishing slurry, the surface of the aluminum plate was mechanically roughened by using a rotating roller-like nylon brush. The average particle diameter of the abrasive was 8 μm and the maximum particle diameter thereof was 50 μm. Material of the nylon brush was 6,10 nylon, a hair length was 50 mm, and a diameter of the hair was 0.3 mm. A stainless steel barrel having a diameter of 300 mm was perforated and nylon hairs were planted densely to prepare a nylon brush. Three rotary brushes were used. The distance between two supporting rollers (diameter: 200 mm) at the lower part of the brush was 300 mm. The brush rollers were pressed against the aluminum plate so that a load of a driving motor that drives the brushes exceeds the load before pressing the brush rollers against the aluminum plate by 7 kW. The direction of rotation of the brush was the same as the moving direction of the aluminum plate. The rotation number of the brushes was 200 rpm.

(b) Alkali Etching Treatment

The above-obtained aluminum plate was subjected to etching treatment by being sprayed with a 26% by mass aqueous solution of sodium hydroxide (containing aluminum ion at a concentration of 6.5% by mass) at 70° C., whereby the aluminum plate was dissolved by 6 g/m$^2$. The plate was then washed with well water by being sprayed with well water.

(c) Desmutting Treatment

The aluminum plate was subjected to desmutting treatment by being sprayed with a 1% by mass aqueous solution of nitric acid (containing 0.5% by mass of aluminum ion) at 30° C., then the aluminum plate was washed with water by being sprayed with water. The aqueous solution of nitric acid used in the desmutting treatment was a waste solution of the following process where the electrochemical surface roughening treatment was conducted with an alternating current in an aqueous solution of nitric acid.

(d) Electrochemical Surface Roughening

Electrochemical surface roughening treatment was conducted continuously by using an alternating voltage of 60 Hz. The electrolytic solution was an aqueous solution containing 10.5 g/liter of nitric acid and 5 g/liter of aluminum ion. The temperature of the electrolytic solution was 50° C. The alternating current was a rectangler-wave alternating current having a time TP, which is a time required for increase of the current from 0 to the peak value, of 0.8 msec and the duty ratio of 1:1. A carbon electrode was used as a counter electrode. Under these conditions, the electrochemical surface roughening was carried out. Ferrite was used for an auxiliary anode. An electrolysis bath used was a radial-cell type electrolysis bath.

The peak electric current density was 30 A/dm$^2$, and a total quantity of electricity when the aluminum plate was the anode was 220 C/dm$^2$. 5% of the electric current from a power source was diverted to the auxiliary anode.

The aluminum plate was then washed by being sprayed with water.

(e) Alkali Etching Treatment

The aluminum plate was subjected to etching treatment by being sprayed with an aqueous solution comprising sodium hydroxide at a concentration of 26% by mass and aluminum ion at a concentration of 6.5% by mass at 32° C. to dissolve the aluminum plate by 0.20 g/m$^2$. By this etching treatment, a smut component, which was mainly consisting of an aluminum hydroxide formed during the electrochemical surface roughening treatment with an alternating voltage in the prior stage, was removed, and edge portions of formed pits were dissolved to smooth the edge portions. Thereafter, the aluminum plate was washed by being sprayed with water.

(f) Desmutting Treatment

The aluminum plate was subjected to a desmutting treatment by being sprayed with an aqueous solution containing 15% by mass nitric acid and 4.5% by mass of aluminum ion at 30° C., and thereafter the aluminum plate was washed by being sprayed with water. The aqueous solution of nitric acid used in the desmutting treatment was the waste solution of the electrochemical surface roughening treatment with an alternating current in an aqueous solution of nitric acid.

(g) Electrochemical Surface Roughening

Electrochemical surface roughening treatment was conducted continuously by using an alternating voltage of 60 Hz. The electrolytic solution was an aqueous solution containing 7.5 g/liter of hydrochloric acid and 5 g/liter of aluminum ion. The temperature of the electrolytic solution was 35° C. The alternating current was a rectangler-wave alternating current. A carbon electrode was used as a counter electrode. Under these conditions, the electrochemical surface roughening was carried out. Ferrite was used for an auxiliary anode. An electrolysis bath used was a radial-cell type electrolysis bath.

The peak electric current density was 25 A/dm$^2$, and a total quantity of electricity when the aluminum plate was the anode was 50 C/dm$^2$.

The aluminum plate was then washed by being sprayed with water.

(h) Alkali Etching Treatment

The aluminum plate was subjected to etching treatment by being sprayed with an aqueous solution comprising sodium hydroxide at a concentration of 26% by mass and aluminum ion at a concentration of 6.5% by mass at 32° C. to dissolve the aluminum plate by 0.10 g/m$^2$. By this etching treatment, a smut component, which was mainly consisting of an aluminum hydroxide formed during the electrochemical surface roughening treatment with an alternating voltage in the prior stage, was removed, and edge portions of formed pits were dissolved to smooth the edge portions. Thereafter, the aluminum plate was washed by being sprayed with water.

(i) Desmutting Treatment

The aluminum plate was subjected to a desmutting treatment by being sprayed with an aqueous solution containing 25% by mass of sulfuric acid and 0.5% by mass of aluminum ion at 60° C., then the aluminum plate was washed by being sprayed with water.

(j) Anodic Oxidation Treatment

A sulfuric acid solution was used as the electrolytic solution. In every case, the electrolytic solution contained 170 g/liter of sulfuric acid and 0.5% by mass of aluminum ion. The temperature of the electrolytic solution was 43° C. The aluminum plate was then washed by being sprayed with water.

The current density was about 30 A/dm$^2$ in every case. The final amount of the oxide film was 2.7 g/m$^2$.

(Substrate A)

Except that the etching amount in the (e) step was changed to 3.4 g/m$^2$, the above steps (a) through (j) were carried out in the alphabetical order to prepare a substrate.

(Substrate B)

The above steps were carried out in the alphabetical order except that the steps (g), (h) and (i) were omitted, to prepare a substrate.

(Substrate C)

The above steps were carried out in the alphabetical order except that the steps (a), (g), (h) and (i) were omitted, to prepare a substrate.

(Substrate D)

The above steps were carried out in the alphabetical order except that the steps (a), (d), (e) and (f) were omitted and the total quantity of electricity in the step (g) was changed to 450 C/$dm^2$, to prepare a substrate.

The substrates A, B, C and D were subsequently subjected to the following hydrophilicity-imparting treatment and undercoating treatment.

(k) Alkali Metal Silicate Treatment

The aluminum substrate obtained by the anodic oxidation was immersed for 10 seconds in a 1% by mass aqueous solution of sodium silicate No. 3 at 30° C. in a bath. In this way, an alkali metal silicate treatment (silicate treatment) was conducted. Thereafter, the substrate was washed by being sprayed with water. The amount of adhered silicate was 3.6 mg/$m^2$.

(Undercoating Treatment)

The aluminum substrate after the alkali metal silicate treatment was coated with an undercoat solution having the following composition. Then, the aluminum substrate was dried for 15 seconds at 80° C. A coating amount after drying was 16 mg/$m^2$.

| (Composition of undercoat solution) | |
|---|---|
| The following polymer compound | 0.3 g |
| Methanol | 100 g |
| Water | 1.0 g |

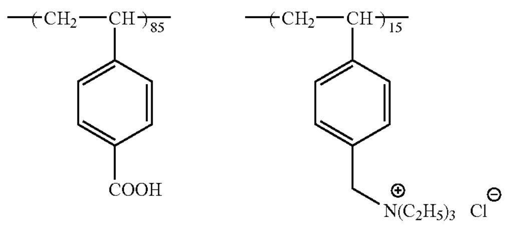

Weight average molecular weight 26,000

Examples 1 through 8 and Comparative Examples 1 and 2

The obtained substrate A was coated with a first layer (lower layer) coating solution having the following composition by use of a wire bar followed by drying at 150° C. for 60 seconds in a drying oven. The coating amount after drying was 0.85 g/$m^2$.

The obtained substrate having the lower layer was coated with a second layer (upper layer) coating solution having the following composition by use of a wire bar followed by drying at 145° C. for 70 seconds in a drying oven. The total coating amount after drying was 1.15 g/$m^2$. In this way, positive planographic printing plate precursors of Examples 1 through 8 and Comparative examples 1 and 2 were prepared.

| (First layer (lower layer) coating solution) | |
|---|---|
| Copolymer 1 (synthesized according to the following) | 2.133 g |
| Cyanine dye A (the following structure) | 0.098 g |
| 2-mercapto-5-methylthio-1,3,4-thiadiazole | 0.030 g |
| Cis-$\Delta^4$-tetrahydrophthalic anhydride | 0.100 g |
| 4,4'-sulfonyl diphenol | 0.090 g |
| P-toluenesulfonic acid | 0.008 g |
| A compound obtained by converting a counter anion of Ethyl Violet to 6-hydroxynaphthalenesulfonic acid | 0.100 g |
| 3-methoxy-4-diazophenylamine hexafluorophosphate | 0.030 g |
| Fluorine-type surfactant (MEGAFAC F-780 manufactured by Dainippon Ink and Chemicals, Incorporated) | 0.035 g |
| Methyl ethyl ketone | 26.6 g |
| 1-metoxy-2-propanol | 13.6 g |
| γ-butyrolactone | 13.8 g |

Cyanine dye A

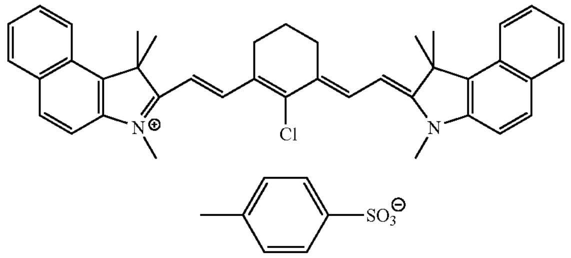

(Synthesis of Copolymer 1)

After agitation, into a 500 ml three-neck flask with a cooling jacket and a dropping funnel, 31.0 g (0.36 mole) of methacrylic acid, 39.1 g (0.36 mole) of ethyl chloroformate, and 200 ml of acetonitrile were put, and this mixture was agitated while cooled with an ice water bath. To this mixture, 36.4 g (0.36 mole) of triethylamine was added dropwise by using a dropping funnel over about 1 hour. After completion of the addition, the ice water bath was taken away, and the mixture was agitated for 30 minutes at room temperature.

To the reaction mixture, 51.7 g (0.30 mole) of p-aminobenzenesulfonamide was added, and the mixture was agitated for 1 hour while kept at 70° C. with an oil bath. After the reaction came to completion, the mixture was added to 1 liter of water while the water was agitated, and the obtained mixture was agitated for 30 minutes. The mixture was filtrated and a precipitate was separated. After 500 ml of water was added to the precipitate to make a slurry, the slurry was filtrated, and the obtained solid was dried, whereby a white solid of N-(p-aminosulfonylphenyl) methacrylamide was obtained (yield 46.9 g).

Subsequently, in a 20 ml three-neck flask with a stirrer, a cooling jacket and a dropping funnel, 4.61 g (0.0192 mole) of N-(p-aminosulfonylphenyl) methacrylamide, 2.58 g (0.0258 mole) of ethyl methacrylate, 0.80 g (0.015 mole) of acrylonitrile and 20 g of N,N-dimethyl acetamide were placed, and this mixture was agitated while kept at 65° C. with a water bath. As a polymerization initiator, 0.15 g of 2,2'-azo bis (2,4-dimethyl valeronitrile) (product name: V-65, produced by Wako Pure Chemical Industries, Ltd.) was added to the mixture, and the mixture was agitated under a nitrogen stream for 2 hours while kept at 65° C. To the reaction mixture, a mixture of 4.61 g of the N-(p-aminosulfonylphenyl) methacrylamide, 2.58 g of methyl methacrylate, 0.80 g of acrylonitrile, 20 g of N,N-dimethyl acetamide and 0.15 g of "V-65" was further added dropwise over 2 hours by using the dropping funnel. After completion of the addition, the obtained mixture was further agitated for 2 hours at 65° C. After the reaction came to completion, 40 g of methanol was added to the mixture followed by cooling. The obtained mixture was added to 2 liter of water while the water was agitated. After the mixture was agitated for 30 minutes, a precipitate was separated by filtration and dried, whereby 15 g of a white solid was obtained. The weight average molecular weight of this particular copolymer 1 was measured by gel permeation chromatography (polystyrene standard) and found to be 54,000.

| (Second layer (upper layer) coating solution) | |
|---|---|
| Copolymer of ethyl methacrylate and 2-methacryloyloxyethyl succinic acid (molar ratio 67:33, weight average molecular weight 92,000) | 0.030 g |
| Specific novolac resin (described in Table 18) | 0.300 g |
| Compound represented by the general formula (1-1) (ammonium compound described in Table 18) | 0.012 g |
| Cyanine dye A (the above structure) | 0.015 g |
| Compound obtained by converting a counter anion of Ethyl Violet to 6-hydroxynaphthalenesulfonic acid | 0.012 g |
| Fluorine-type surfactant (MEGAFAC F-780 manufactured by Dainippon Ink and Chemicals, Incorporated) | 0.022 g |
| Methyl ethyl ketone | 13.1 g |
| 1-metoxy-2-propanol | 6.79 g |

(Evaluation of Planographic Printing Plate Precursor)

The planographic printing plate precursor was evaluated with respect to development latitude, sensitivity, and storability after the exposure. The details of the evaluation method are as follows.

1. Development Latitude

A planographic printing plate precursor was preserved for 5 days under a condition of 25° C. and 50% r.h. Thereafter, the planographic printing plate precursor was image-wise exposed to test-pattern radiation by using TRENDSETTER 3244 manufactured by Creo Corp with a beam intensity of 9.0 W and a drum revolution speed of 150 rpm.

A developer was prepared by changing a mass proportion of water in an alkali developer having the following composition A or composition B so that the dilution ratio of the developer and the electric conductivity of the developer was controlled. The developer was charged in a PS processor 900H manufactured by Fuji Photo Film Co., Ltd. The planographic printing plate precursor was developed by the PS processor 900 H at a liquid temperature of 30° C. for 22 seconds. The highest electric conductivity and the lowest electric conductivity of the developers by which the image portion was not dissolved and with which excellent development was carried out without causing contamination or coloring due to remaining insufficiently developed photosensitive layer were determined. The difference between the highest electric conductivity and the lowest electric conductivity was considered as the development latitude and used as a factor in the estimation.

| (Composition of alkali developer A) | |
|---|---|
| $SiO_2.K_2O$ ($K_2O/SiO_2$ = 1/1 (molar ratio)) | 4.0% by mass |
| Citric acid | 0.5% by mass |
| Polyethyleneglycol lauryl ether (weight average molecular weight 1,000) | 0.5% by mass |
| Water | 95.0% by mass |

-continued

| (Composition of alkali developer B) | |
|---|---|
| D sorbit | 2.5% by mass |
| Sodium hydroxide | 0.85% by mass |
| Polyethyleneglycol lauryl ether (weight average molecular weight 1,000) | 0.5% by mass |
| Water | 96.15% by mass |

2. Sensitivity

The planographic printing plate precursor was image-wise exposed to a test-pattern radiation having varying exposure energy by using TRENDSETTER 3244 manufactured by Creo Corp.

Thereafter, the highest electric conductivity and the lowest electric conductivity of the developers by which the image portion was not dissolved and with which excellent development was carried out without causing contamination or coloring due to remaining insufficiently developed photosensitive layer were determined. The average of the highest electric conductivity and the lowest electric conductivity was calculated, and a developer having the average electric conductivity was prepared. The minimum exposure amount (the minimum beam intensity at the drum revolution speed of 150 rpm) that could develop a non-image portion with this developer was measured and considered as sensitivity. A smaller value refers to a higher sensitivity.

3. Storability after Exposure

After the exposed plate precursor was preserved in an environment of 25° C. and 70% r.h. for 1 hr, sensitivity was evaluated in a similar manner to that in the above sensitivity evaluation. A degree of a decrease in the sensitivity from immediately after the exposure was taken as an index of storability after exposure. The strability value represents the sensitivity 1 hr after the exposure, and a storability value which is closer to the sensitivity immediately after the exposure was judged as having better storability after exposure.

(Evaluation of Planographic Printing Plate Precursors According to Examples 1 through 8 and Comparative Examples 1 and 2)

The respective planographic printing plate precursors according to Examples 1 through 8 and Comparative examples 1 and 2 were evaluated with respect to each of the development latitude, the sensitivity and the storability after exposure, according to methods explained above. The developer B was used for development. The obtained results are shown in Table 18.

As shown in Table 18, it was confirmed that the planographic printing plate precursors of Examples 1 through 8, while maintaining the development latitude and the sensitivity, realized an improvement in the storability after exposure.

TABLE 18

| | Novolac resin | Ammonium compound | Sensitivity (W) | Storability after exposure (W) | Development latitude |
|---|---|---|---|---|---|
| Example 1 | P1 | I-3 | 5.0 | 5.5 | 6 |
| Example 2 | P1 | I-13 | 5.0 | 5.5 | 6 |
| Example 3 | P1 | I-37 | 5.0 | 5.5 | 6 |
| Example 4 | P1 | II-3 | 5.0 | 5.5 | 6 |

TABLE 18-continued

| | Novolac resin | Ammonium compound | Sensitivity (W) | Storability after exposure (W) | Development latitude |
|---|---|---|---|---|---|
| Example 5 | P2 | I-3 | 4.8 | 5.2 | 6 |
| Example 6 | P2 | I-13 | 4.8 | 5.2 | 6 |
| Example 7 | P2 | I-37 | 4.8 | 5.2 | 6 |
| Example 8 | P2 | II-3 | 4.8 | 5.2 | 6 |
| Comparative example 1 | C1 | I-3 | 6.0 | 8.0 | 6 |
| Comparative example 2 | P1 | A | 6.0 | 6.5 | 2 |

Novolac resin P1: Phenol/cresol-formaldehyde novolac (phenol:m-cresol:p-cresol = 30:30:40,
weight average molecular weight = 5500)
Novolac resin P2: Phenol/cresol-formaldehyde novolac (phenol:m-cresol:p-cresol = 60:30:10,
weight average molecular weight = 4800)
Novolac resin C1 Cresol-formaldehyde novolac (m-cresol:p-cresol = 6:4,
weight average molecular weight = 5000)

The ammonium compound A (ammonium A) used in Comparative example 2 is shown below.

Ammonium A

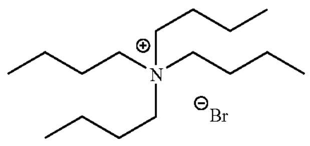

Examples 9 through 16, Comparative Examples 3 and 4

On the obtained substrate C, a first layer (lower layer) coating solution having the following composition was coated by use of a wire bar followed by drying at 130° C. for 60 seconds in a drying oven. The coating amount after the drying in the oven was 0.60 g/$m^2$.

On the obtained substrate having the lower layer, a second layer (upper layer) coating solution having the composition below was coated by use of a wire bar. After the coating, the substrate was dried at 150° C. for 60 seconds in a drying oven. The total coating amount after the drying in the oven was 1.25 g/$m^2$. Thereby, positive planographic printing plate precursors of Examples 9 through 16 and Comparative examples 3 and 4 were prepared.

| (First layer (lower layer) coating solution) | |
|---|---|
| Copolymer 1 | 2.133 g |
| Cyanine dye A (above structure) | 0.098 g |
| 2-mercapto-5-methylthio-1,3,4-thiadiazole | 0.030 g |
| Cis-$\Delta^4$-tetrahydrophthalic anhydride | 0.100 g |
| 4,4'-sulfonyl diphenol | 0.090 g |
| P-toluenesulfonic acid | 0.008 g |
| Compound obtained by converting a counter anion of Ethyl Violet to 6-hydroxynaphthalenesulfonic acid | 0.100 g |
| 3-methoxy-4-diazodiphenylamine hexafluorophosphate | 0.030 g |
| Fluorine-type surfactant (MEGAFAC F-780 manufactured by Dainippon Ink and Chemicals, Incorporated) | 0.035 g |
| Methyl ethyl ketone | 26.6 g |
| 1-metoxy-2-propanol | 13.6 g |
| Dimethyl sulfoxide | 13.8 g |

-continued

| (Second layer (upper layer) coating solution) | |
|---|---|
| Copolymer of ethyl methacrylate and 2-methacryloyloxyethyl succinic acid (molar ratio 67:33, weight average molecular weight 92,000) | 0.030 g |
| Novolac resin (described in Table 19) | 0.300 g |
| Compound represented by the general formula (1-1) (ammonium compound described in Table 19) | 0.016 g |
| Cyanine dye A (the above structure) | 0.015 g |
| Fluorine-type surfactant (MEGAFAC F-780 manufactured by Dainippon Ink and Chemicals, Incorporated) | 0.022 g |
| Methyl ethyl ketone | 13.1 g |
| 1-metoxy-2-propanol | 6.79 g |

(Evaluation of Examples 9 through 16 and Comparative Examples 3 and 4)

The respective planographic printing plate precursors of Examples 9 through 16 and Comparative examples 3 and 4 were evaluated in the same manner as in Example 1. The developer B was used in the development. The obtained results are shown in Table 19.

As shown in Table 19, it was found that samples of Examples, while maintaining the development latitude and the sensitivity, realized an improvement in the storability after exposure.

TABLE 19

| | Novolac resin | Ammonium compound | Sensitivity (W) | Storability after exposure (W) | Development latitude |
|---|---|---|---|---|---|
| Example 9 | P3 | I-2 | 5.5 | 5.75 | 8 |
| Example 10 | P3 | I-9 | 5.5 | 5.75 | 8 |
| Example 11 | P3 | II-7 | 5.5 | 5.75 | 8 |
| Example 12 | P3 | IV-2 | 5.5 | 5.75 | 7 |
| Example 13 | P4 | I-2 | 5.0 | 5.5 | 8 |
| Example 14 | P4 | I-9 | 5.0 | 5.5 | 8 |
| Example 15 | P4 | II-7 | 5.0 | 5.5 | 8 |
| Example 16 | P4 | IV-2 | 5.0 | 5.5 | 7 |
| Comparative example 3 | C1 | I-2 | 6.5 | 10.0 | 8 |
| Comparative example 4 | P3 | A | 6.0 | 6.5 | 3 |

Novolac resin P3: Phenol/cresol-formaldehyde novolac (phenol:m-cresol:p-cresol = 40:40:20,
weight average molecular weight = 5200)
Novolac resin P4: Phenol/xylenol-formaldehyde novolac (phenol:2, 5-xylenol = 70:30,
weight average molecular weight = 4600)
Novolac resin C1: Cresol-formaldehyde novolac (m-cresol:p-cresol = 6:4,
weight average molecular weight = 5000)

The ammonium compound A (ammonium A) used in Comparative example 4 is the same as that used in Comparative example 2.

Examples 17 through 24, Comparative Examples 5 and 6

On the obtained substrate D, a first layer (lower layer) coating solution having the following composition was coated by use of a wire bar followed by drying at 150° C. for 60 seconds in a drying oven. The coating amount after the drying was 0.81 g/$m^2$.

On the obtained substrate having the lower layer, a second layer (upper layer) coating solution having the composition below was coated by use of a wire bar. After the coating, the substrate was dried at 150° C. for 60 seconds in a drying oven. The total coating amount after the drying was 0.99 g/m$^2$. In this way, positive planographic printing plate precursors of Examples 17 through 24 and Comparative examples 5 and 6 were prepared.

| (First layer (lower layer) coating solution) | |
|---|---|
| Copolymer 1 mentioned above | 2.133 g |
| Cyanine dye A (above structure) | 0.098 g |
| Cis-$\Delta^4$-tetrahydrophthalic anhydride | 0.110 g |
| 4,4'-sulfonyl diphenol | 0.090 g |
| P-toluenesulfonic acid | 0.008 g |
| Compound obtained by converting a counter anion of Ethyl Violet to 6-hydroxynaphthalenesulfonic acid | 0.100 g |
| 3-methoxy-4-diazodiphenylamine hexafluorophosphate | 0.030 g |
| Fluorine-type surfactant (MEGAFAC F-780 manufactured by Dainippon Ink and Chemicals, Incorporated) | 0.035 g |
| Methyl ethyl ketone | 26.6 g |
| 1-metoxy-2-propanol | 13.6 g |
| γ-butyrolactone | 13.8 g |
| (Second layer (upper layer) coating solution) | |
| Copolymer of ethyl methacrylate and 2-methacryloyloxyethyl succinic acid (molar ratio 67:33, weight average molecular weight 92,000) | 0.030 g |
| Novolac resin (Table 20) | 0.300 g |
| Compound represented by the general formula (1-1) (ammonium compound described in Table 20) | 0.020 g |
| Cyanine dye A (above structure) | 0.015 g |
| Fluorine-type surfactant (MEGAFAC F-780 manufactured by Dainippon Ink and Chemicals, Incorporated) | 0.022 g |
| Methyl ethyl ketone | 13.1 g |
| 1-metoxy-2-propanol | 6.79 g |

(Evaluation of Examples 17 through 24 and Comparative Examples 5 and 6)

The respective planographic printing plate precursors obtained above were evaluated according to the above-mentioned methods. The developer A was used in the development. The obtained results are shown in Table 20.

As shown in Table 20, it was found that the planographic printing plate precursors of Examples 17 through 24, while maintaining the development latitude and the sensitivity, realized an improvement in the storability after exposure.

TABLE 20

| | Novolac resin | Ammonium compound | Sensitivity (W) | Storability after exposure (W) | Development latitude |
|---|---|---|---|---|---|
| Example 17 | P5 | I-2 | 6.0 | 7.0 | 8 |
| Example 18 | P5 | I-9 | 6.0 | 7.0 | 8 |
| Example 19 | P5 | II-7 | 6.0 | 7.0 | 8 |
| Example 20 | P5 | IV-2 | 6.0 | 7.0 | 7 |
| Example 21 | P6 | I-2 | 6.0 | 7.0 | 8 |
| Example 22 | P6 | I-9 | 6.0 | 7.0 | 8 |
| Example 23 | P6 | II-7 | 6.0 | 7.0 | 8 |
| Example 24 | P6 | IV-2 | 6.0 | 7.0 | 7 |
| Comparative example 5 | C2 | I-2 | 7.0 | 12.0 | 7 |
| Comparative example 6 | P5 | B | 6.5 | 8.0 | 2 |

Novolac resin P5: Phenol/cresol-formaldehyde novolac (phenol:m-cresol:p-cresol = 40:40:20,
weight average molecular weight = 8000)
Novolac resin P6: Phenol/cresol-formaldehyde novolac (phenol:m-cresol:p-cresol = 60:30:10,
weight average molecular weight = 7700)
Novolac resin C2: Cresol-formaldehyde novolac (m-cresol:p-cresol = 7:3,
weight average molecular weight = 10000)

The ammonium compound B (ammonium B) used in Comparative example 6 is shown below.

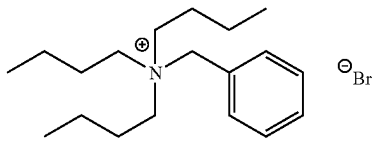

Ammonium B

Examples 25 through 32, Comparative Examples 7 and 8

On the obtained substrate D, the following image forming layer coating solution was coated and dried at 150° C. for 1 minute to form an image forming layer, whereby planographic printing plate precursors of Examples 25 through 32 and Comparative examples 7 and 8 were obtained. The coating amounts after the drying were 1.55 g/m$^2$.

| (Image forming layer coating solution) | |
|---|---|
| Novolac resin (described in Table 21) | 1.0 g |
| Compound represented by the general formula (1-1) (ammonium compound described in Table 21) | 0.05 g |
| Cyanine dye A (above structure) | 0.05 g |
| Dye obtained by converting a counter anion of Victoria Pure Blue BOH to 1-naphthalenesulfonic acid anion | 0.01 g |
| Fluorine-type surfactant (MEGAFAC F-177 manufactured by Dainippon Ink and Chemicals, Incorporated) | 0.05 g |
| Methyl ethyl ketone | 9.0 g |
| 1-metoxy-2-propanol | 9.0 g |

(Evaluation of Examples 25 through 32 and Comparative Examples 7 and 8)

The respective planographic printing plate precursors of Examples 25 through 32 and Comparative examples 7 and 8 were evaluated in the same manner as in Example 1. The developer A was used in the development. The obtained results are shown in Table 21.

As shown in Table 21, it was found that the planographic printing plate precursors of Examples 25 through 32, while maintaining the development latitude and the sensitivity, realized an improvement in the storability after exposure.

TABLE 21

| | Novolac resin | Ammonium compound | Sensitivity (W) | Storability after exposure (W) | Development latitude |
|---|---|---|---|---|---|
| Example 25 | P7 | I-2 | 4.0 | 4.5 | 5 |
| Example 26 | P7 | I-9 | 4.0 | 4.5 | 6 |
| Example 27 | P7 | II-7 | 4.0 | 4.5 | 5 |
| Example 28 | P7 | IV-2 | 4.0 | 4.5 | 5 |
| Example 29 | P8 | I-2 | 4.0 | 4.5 | 6 |
| Example 30 | P8 | I-9 | 4.0 | 4.5 | 6 |
| Example 31 | P8 | II-7 | 4.0 | 4.5 | 6 |
| Example 32 | P8 | IV-2 | 4.0 | 4.5 | 6 |
| Comparative example 7 | C2 | I-2 | 5.5 | 8.0 | 5 |
| Comparative example 8 | P7 | B | 4.5 | 5.5 | 1 |

Novolac resin P7: Phenol/cresol-formaldehyde novolac (phenol:m-cresol:p-cresol = 20:60:20,
weight average molecular weight = 10200)
Novolac resin P8: Phenol/xylenol-formaldehyde novolac
(phenol:2, 5 xylenol = 60:40, weight average molecular weight = 11000)
Novolac resin C2: Cresol-formaldehyde novolac (m-cresol:p-cresol = 7:3,
weight average molecular weight = 10000)

The ammonium compound B (ammonium B) used in Comparative example 8 is the same as that used in Comparative example 6.

Examples 33 through 40, Comparative Examples 9 and 10

On the substrate A, a first layer (lower layer) coating solution having the following composition was coated by use of a wire bar followed by drying at 150° C. for 60 seconds in a drying oven. The coating amount after the drying was 0.85 g/$m^2$.

On the obtained substrate with the lower layer, a second layer (upper layer) coating solution having the composition below was coated by use of a wire bar. After the coating, the substrate was dried in a drying oven at 140° C. for 60 seconds. The total coating amount was 1.17 g/$m^2$. In this way, positive planographic printing plate precursors according to Examples 33 through 40 and Comparative examples 9 and 10 were prepared.

| (First layer (lower layer) coating solution) | |
|---|---|
| Copolymer 1 in Example 1 | 2.133 g |
| Cyanine dye B (the following structure) | 0.098 g |
| 2-mercapto-5-methylthio-1,3,4-thiadiazole | 0.030 g |
| Cis-$\Delta^4$-tetrahydrophthalic anhydride | 0.100 g |
| 4,4'-sulfonyl diphenol | 0.090 g |
| P-toluenesulfonic acid | 0.008 g |
| Compound obtained by converting a counter anion of Ethyl Violet to 6-hydroxynaphthalenesulfonic acid | 0.100 g |
| 3-methoxy-4-diazodiphenylamine hexafluorophosphate | 0.030 g |
| Fluorine-type surfactant (MEGAFAC F-780 manufactured by Dainippon Ink and Chemicals, Incorporated) | 0.035 g |
| Methyl ethyl ketone | 26.6 g |
| 1-metoxy-2-propanol | 13.6 g |
| γ-butyrolactone | 13.8 g |

Cyanine Dye B

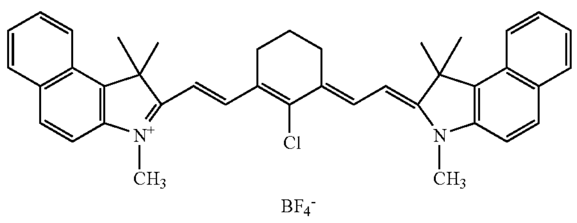

| (Second layer (upper layer) coating solution) | |
|---|---|
| Copolymer of ethyl methacrylate and 2-methacryloyloxyethyl succinic acid (molar ratio 67:33, weight average molecular weight 92,000) | 0.030 g |
| Particular novolac resin (described in Table 22) | 0.300 g |
| Onium salt represented by the general formula (1-2) (onium salt described in Table 22) | 0.012 g |
| Cyanine dye B mentioned above | 0.015 g |
| Compound obtained by converting a counter anion of Ethyl Violet to 6-hydroxynaphthalenesulfonic acid | 0.012 g |
| Fluorine-type surfactant (MEGAFAC F-780 manufactured by Dainippon Ink and Chemicals, Incorporated) | 0.022 g |
| Methyl ethyl ketone | 13.1 g |
| 1-metoxy-2-propanol | 6.79 g |

(Evaluation of Planographic Printing Plate Precursor)

The planographic printing plate precursors were evaluated with respect to each of the development latitude, sensitivity and storability after exposure. Details of evaluation methods are as shown below.

1. Development Latitude

A planographic printing plate precursor was preserved for 5 days under the condition of 25° C. and 50% r.h. Thereafter, the planographic printing plate was image-wise exposed to a test pattern radiation by using a TRENDSETTER 3244 manufactured by Creo Corp with a beam intensity of 9.0 W and a drum revolution speed of 150 rpm.

A developer was prepared by changing a mass proportion of water in an alkali developer having the composition A or composition B recited in Example 1 so that the dilution ratio of the developer and the electric conductivity of the developer was controlled. The developer was charged in a PS processor 900H manufactured by Fuji Photo Film Co., Ltd. The planographic printing plate precursor was developed by the PS processor 900 H at a liquid temperature of 29° C. for 24 seconds. The highest electric conductivity and the lowest electric conductivity of the developers by which the image portion was not dissolved and with which excellent development was carried out without causing contamination or coloring due to remaining insufficiently developed photosensitive layer were determined. The difference between the highest electric conductivity and the lowest electric conductivity was considered as the development latitude and used as a factor in the estimation.

2. Sensitivity

The sensitivity was measured in the same manner as in Example 1.

3. Storability after Exposure

The storability after exposure was measured in the same manner as in Example 1.

(Evaluation of Planographic Printing Plate Precursors of Examples 33 through 40 and Comparative Examples 9 and 10)

The respective planographic printing plate precursors of Examples 33 through 40 and Comparative examples 9 and 10 were evaluated with respect to each of the development latitude, sensitivity and storability after exposure according to the above-mentioned methods. The developer B was used in the development. The obtained results are shown in Table 22.

As shown in Table 22, it was found that the planographic printing plate precursors of Examples 33 through 40, while maintaining the development latitude and the sensitivity, realized an improvement in the storability after exposure.

TABLE 22

| | Novolac resin | Onium salt | Sensitivity (W) | Storability after exposure (W) | Development latitude |
|---|---|---|---|---|---|
| Example 33 | P1 | C-1 | 5.0 | 5.2 | 6 |
| Example 34 | P1 | C-3 | 5.0 | 5.2 | 6 |
| Example 35 | P1 | C-4 | 5.0 | 5.2 | 6 |
| Example 36 | P1 | C-10 | 5.0 | 5.0 | 6 |
| Example 37 | P2 | C-1 | 4.8 | 5.0 | 6 |
| Example 38 | P2 | C-3 | 4.8 | 5.0 | 6 |
| Example 39 | P2 | C-4 | 4.8 | 5.0 | 6 |

TABLE 22-continued

| | Novolac resin | Onium salt | Sensitivity (W) | Storability after exposure (W) | Development latitude |
|---|---|---|---|---|---|
| Example 40 | P2 | C-10 | 4.8 | 4.8 | 6 |
| Comparative example 9 | CP1 | C-1 | 6.0 | 7.0 | 6 |
| Comparative example 10 | P1 | A | 6.0 | 6.5 | 2 |

Novolac resin P1: Phenol/cresol-formaldehyde novolac (phenol:m-cresol:p-cresol = 30:40:30, weight average molecular weight = 5000)

Novolac resin P2: Phenol/cresol-formaldehyde novolac (phenol:m-cresol:p-cresol = 60:30:10, weight average molecular weight = 5200)

Novolac resin CP1: Cresol-formaldehyde novolac (m-cresol:p-cresol = 6:4, weight average molecular weight = 5000)

The onium salt A used in Comparative example 10 is the same as the ammonium compound used in Comparative example 2.

Examples 41 through 48, Comparative Examples 11 and 12

On the substrate C, a first layer (lower layer) coating solution having the following composition was coated by use of a wire bar followed by drying at 130° C. for 60 seconds in a drying oven. The coating amount after the drying was 0.60 g/m$^2$.

On the obtained substrate with the lower layer, a second layer (upper layer) coating solution having the composition below was coated by use of a wire bar. After the coating, the substrate was dried in a drying oven at 150° C. for 60 seconds. The total coating amount after the drying was 1.25 g/m$^2$. In this way, positive planographic printing plate precursors of Examples 41 through 48 and Comparative examples 11 and 12 were prepared.

| (First layer (lower layer) coating solution) | |
|---|---|
| Copolymer 1 in Example 1 | 2.133 g |
| Cyanine dye C (following structure) | 0.098 g |
| 2-mercapto-5-methylthio-1,3,4-thiadiazole | 0.030 g |
| Cis-Δ$^4$-tetrahydrophthalic anhydride | 0.100 g |
| 4,4'-sulfonyl diphenol | 0.090 g |
| P-toluenesulfonic acid | 0.008 g |
| Compound obtained by converting a counter anion of Ethyl Violet to 6-hydroxynaphthalenesulfonic acid | 0.100 g |
| 3-methoxy-4-diazodiphenylamine hexafluorophosphate | 0.030 g |
| Fluorine-type surfactant (MEGAFAC F-780 manufactured by Dainippon Ink and Chemicals, Incorporated) | 0.035 g |
| Methyl ethyl ketone | 26.6 g |
| 1-metoxy-2-propanol | 13.6 g |
| Dimethyl sulfoxide | 13.8 g |

Cyanine dye C

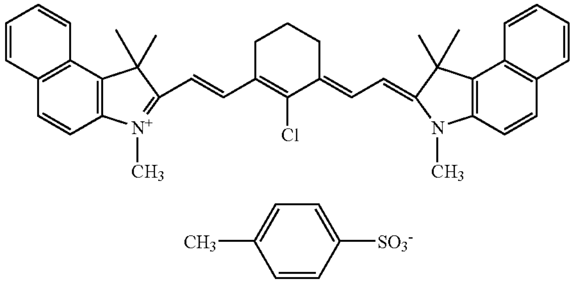

| (Second layer (upper layer) coating solution) | |
|---|---|
| Copolymer of ethyl methacrylate and 2-methacryloyloxyethyl succinic acid (molar ratio 67:33, weight average molecular weight 92,000) | 0.030 g |
| Novolac resin (described in Table 23) | 0.300 g |
| Onium salt represented by the general formula (1-2) (onium salt described in Table 23) | 0.016 g |
| Cyanine dye C shown above | 0.015 g |
| Fluorine-type surfactant (MEGAFAC F-780 manufactured by Dainippon Ink and Chemicals, Incorporated) | 0.022 g |
| Methyl ethyl ketone | 13.1 g |
| 1-metoxy-2-propanol | 6.79 g |

(Evaluation of Examples 41 through 48 and Comparative Examples 11 and 12)

The respective planographic printing plate precursors of Examples 41 through 48 and Comparative examples 11 and 12 were evaluated in the same manner as in Example 33. The developer B was used in the development. The obtained results are shown in Table 23.

As shown in Table 23, it was found that samples of Examples, while maintaining the development latitude and the sensitivity, realized an improvement in the storability after exposure.

TABLE 23

| | Novolac resin | Onium salt | Sensitivity (W) | Storability after exposure (W) | Development latitude |
|---|---|---|---|---|---|
| Example 41 | P3 | C-2 | 5.5 | 5.8 | 8 |
| Example 42 | P3 | C-8 | 5.5 | 5.8 | 8 |
| Example 43 | P3 | C-16 | 5.5 | 5.8 | 8 |
| Example 44 | P3 | C-20 | 5.5 | 5.6 | 7 |
| Example 45 | P4 | C-2 | 5.0 | 5.3 | 8 |
| Example 46 | P4 | C-8 | 5.0 | 5.3 | 8 |
| Example 47 | P4 | C-16 | 5.0 | 5.3 | 8 |
| Example 48 | P4 | C-20 | 5.0 | 5.0 | 8 |
| Comparative example 11 | CP1 | C-1 | 6.5 | 7.5 | 8 |
| Comparative example 12 | P3 | A | 6.0 | 7.0 | 3 |

Novolac resin P3: Phenol/cresol-formaldehyde novolac (phenol:m-cresol:p-cresol = 40:40:20,
weight average molecular weight = 5200)
Novolac resin P4: Phenol/xylenol-formaldehyde novolac
(phenol:2,5-xylenol = 70:30, weight average molecular weight = 4600)
Novolac resin CP1: Cresol-formaldehyde novolac (m-cresol:p-cresol = 6:4,
weight average molecular weight = 5000)

The onium salt A (ammonium A) used in Comparative example 12 is the same as that used in Comparative example 10.

Examples 49 through 56, Comparative Examples 13 and 14

On the obtained substrate D, a first layer (lower layer) coating solution having the following composition was coated by use of a wire bar followed by drying at 150° C. for 60 seconds in a drying oven. The coating amount after the drying was 0.81 g/$m^2$.

On the obtained substrate with the lower layer, a second layer (upper layer) coating solution having the composition below was coated by use of a wire bar. After the coating, the substrate was dried in a drying oven at 150° C. for 60 seconds. The total coating amount after the drying was 0.99 g/$m^2$. In this way, positive planographic printing plate precursors according to Examples 49 through 56 and Comparative examples 13 and 14 were prepared.

| (First layer (lower layer) coating solution) | |
|---|---|
| Copolymer 1 in Example 1 | 2.133 g |
| Cyanine dye D (following structure) | 0.098 g |
| Cis-$\Delta^4$-tetrahydrophthalic anhydride | 0.110 g |
| 4,4'-sulfonyl diphenol | 0.090 g |
| P-toluenesulfonic acid | 0.008 g |
| Compound obtained by converting a counter anion of Ethyl Violet to 6-hydroxynaphthalenesulfonic acid | 0.100 g |
| 3-methoxy-4-diazodiphenylamine hexafluorophosphate | 0.030 g |
| Fluorine-type surfactant (MEGAFAC F-780 manufactured by Dainippon Ink and Chemicals, Incorporated) | 0.035 g |
| Methyl ethyl ketone | 26.6 g |
| 1-metoxy-2-propanol | 13.6 g |
| γ-butyrolactone | 13.8 g |

Cyanine Dye D

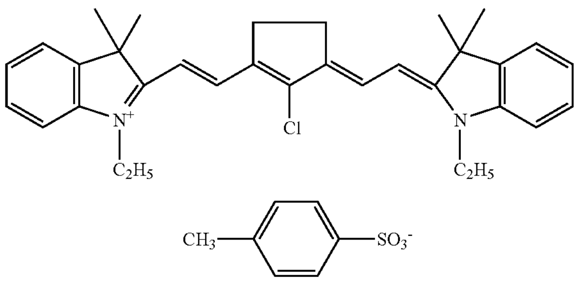

| (Second layer (upper layer) coating solution) | |
|---|---|
| Copolymer of ethyl methacrylate and 2-methacryloyloxyethyl succinic acid (molar ratio 67:33, weight average molecular weight 92,000) | 0.030 g |
| Novolac resin (described in Table 24) | 0.300 g |
| Onium salt represented by the general formula (1-2) (onium salt described in Table 24) | 0.020 g |
| Cyanine dye D mentioned above | 0.015 g |
| Fluorine-type surfactant (Megafac F-780 manufactured by Dainippon Ink and Chemicals, Incorporated) | 0.022 g |
| Methyl ethyl ketone | 13.1 g |
| 1-metoxy-2-propanol | 6.79 g |

(Evaluation of Examples 49 through 56 and Comparative Examples 13 and 14)

The obtained respective planographic printing plate precursors were evaluated in the same manner as in Example 33. The developer A was used in the development. The obtained results are shown in Table 24.

As shown in Table 24, it was found that the planographic printing plate precursors of Examples 49 through 56, while maintaining the development latitude and the sensitivity, realized an improvement in the storability after exposure.

TABLE 24

| | Novolac resin | Onium salt | Sensitivity (W) | Storability after exposure (W) | Development latitude |
|---|---|---|---|---|---|
| Example 49 | P5 | C-4 | 6.0 | 6.3 | 8 |
| Example 50 | P5 | C-13 | 6.0 | 6.3 | 8 |
| Example 51 | P5 | C-21 | 6.0 | 6.2 | 8 |
| Example 52 | P5 | C-28 | 6.0 | 6.2 | 7 |
| Example 53 | P6 | C-4 | 6.0 | 6.4 | 8 |
| Example 54 | P6 | C-13 | 6.0 | 6.4 | 8 |
| Example 55 | P6 | C-21 | 6.0 | 6.1 | 8 |
| Example 56 | P6 | C-28 | 6.0 | 6.2 | 7 |
| Comparative example 13 | CP2 | C-4 | 7.0 | 8.0 | 7 |
| Comparative example 14 | P5 | B | 6.5 | 8.0 | 2 |

Novolac resin P5: Phenol/cresol-formaldehyde novolac (phenol:m-cresol:p-cresol = 40:40:20, weight average molecular weight = 8000)
Novolac resin P6: Phenol/cresol-formaldehyde novolac (phenol:m-cresol:p-cresol = 60:30:10, weight average molecular weight = 7700)
Novolac resin CP2: Cresol-formaldehyde novolac (m-cresol:p-cresol = 7:3, weight average molecular weight = 10000)

The onium salt B used in Comparative example 14 was the same as the ammonium compound B used in Comparative example 6.

Examples 57 through 64, Comparative Examples 15 and 16

On the obtained substrate D, the following image forming layer coating solution was coated followed by drying at 150° C. for 1 minute, to form an image forming layer. Thereby, planographic printing plate precursors of Examples 57 through 64 and Comparative examples 15 and 16 were obtained. The coating amount after the drying was 1.55 g/$m^2$.

| (Image forming layer coating solution) | |
|---|---|
| Novolac resin (described in Table 25) | 1.0 g |
| Onium salt represented by the general formula (1-2) (onium salt described in Table 25) | 0.05 g |
| Cyanine dye D mentioned above | 0.05 g |
| Dye obtained by converting a counter anion of Victoria Pure Blue BOH to 1-naphthalenesulfonic acid anion | 0.01 g |
| Fluorine-type surfactant (MEGAFAC F-177 manufactured by Dainippon Ink and Chemicals, Incorporated) | 0.05 g |
| Methyl ethyl ketone | 9.0 g |
| 1-metoxy-2-propanol | 9.0 g |

(Evaluation of Examples 57 through 64 and Comparative Examples 15 and 16)

The respective planographic printing plate precursors of Examples 57 through 64 and Comparative examples 15 and 16 were evaluated in the same manner as in Example 33. The developer A was used in the development. The obtained results are shown in Table 25.

As shown in Table 25, it was found that the planographic printing plate precursors of Examples 57 through 64, while maintaining the development latitude and the sensitivity, realized an improvement in the storability after exposure.

TABLE 25

| | Novolac resin | Onium salt | Sensitivity (W) | Storability after exposure (W) | Development latitude |
|---|---|---|---|---|---|
| Example 57 | P7 | C-14 | 4.0 | 4.0 | 5 |
| Example 58 | P7 | C-22 | 4.0 | 4.3 | 6 |
| Example 59 | P7 | C-23 | 4.0 | 4.4 | 5 |
| Example 60 | P7 | C-29 | 4.0 | 4.3 | 5 |
| Example 61 | P8 | C-14 | 3.8 | 3.9 | 6 |
| Example 62 | P8 | C-22 | 3.8 | 4.1 | 6 |
| Example 63 | P8 | C-23 | 3.8 | 4.1 | 6 |
| Example 64 | P8 | C-29 | 3.8 | 4.0 | 6 |
| Comparative example 15 | CP2 | C-1 | 5.5 | 6.5 | 5 |
| Comparative example 16 | P7 | B | 4.5 | 5.5 | 1 |

Novolac resin P7: Phenol/cresol-formaldehyde novolac (phenol:m-cresol:p-cresol = 20:60:20, weight average molecular weight = 10200)
Novolac resin P8: Phenol/xylenol-formaldehyde novolac (phenol:2,5-xylenol = 60:40, weight average molecular weight = 11000)
Novolac resin CP2: Cresol-formaldehyde novolac (m-cresol:p-cresol = 7:3, weight average molecular weight = 10000)

The onium salt B (ammonium B) used in Comparative example 16 was the same as that used in Comparative example 14.

According to the invention, an image forming material that is useful for the heat-mode type positive planographic printing plate precursor and excellent in solubility discrimination and in the storability after exposure can be provided. A planographic printing plate precursor utilizing the image forming material can improve storability after exposure without deteriorating development latitude and sensitivity.

What is claimed is:

1. A positive image forming material comprising, on a substrate, a positive image forming layer which includes at least (A) a novolac type phenolic resin containing phenol as a structural unit, (B) a photo-thermal converting agent, and (C) an onium salt represented by the following formula (1-2-A):

$$R^A—SO_3^-M^+ \quad \text{Formula (1-2-A)}$$

wherein, in formula (1-2-A), $^-R^A$ represents a substituent including at least one substituent that has an alkali dissociative proton and $M^+$ represents a sulfonium ion, wherein the positive image forming material does not include a crosslinking agent and wherein the photo-thermal converting agent is represented by the following formula (a):

Formula (a)

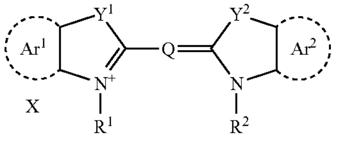

wherein in formula (a), $R^1$ and $R^2$ each independently represent an alkyl group having 1 to 12 carbon atoms, and the alkyl group may have a substituent selected from an alkoxy group, an aryl group, an amide group, an alkoxycarbonyl group, a hydroxyl group, a sulfo group or a carboxyl group; $Y^1$ and $Y^2$ each independently represent an oxygen atom, a sulfur atom, a selenium atom, a dialkylmethylene group or a —CH═CH—; $Ar^1$ and $Ar^2$ each independently represent an aromatic hydrocarbon group and may have a substituent selected from an alkyl group, an alkoxy group, a halogen atom, or an alkoxy carbonyl group; in $Ar^1$, the carbon atom adjacent to $Y^1$ and a carbon atom adjacent to said carbon atom may belong to another ring that is condensed with $Ar^1$; in $Ar^2$, the carbon atom adjacent to $Y^2$ and a carbon atom adjacent to said carbon atom may be members of another ring that is condensed with $Ar^2$; X represents a counter ion necessary for neutralizing an electric charge, which is not required when the cation moiety of the formula (a) has an anionic substituent; and Q represents a polymethine group selected from a pentamethine group, a heptamethine group or a nonamethine group comprising, in the methine chain thereof, three consecutive carbon atoms that are members of a cyclohexene ring or a cyclopentene ring.

2. The positive image forming material according to claim 1, wherein a mass of the compound represented by formula (1-2-A) is 50% or less of a mass of a total solids content in the image forming layer.

3. The positive image forming material according to claim 1, wherein the novolac type phenolic resin is a resin obtained by condensing phenol, a substituted phenol represented by the following formula (I), and an aldehyde:

General formula (I)

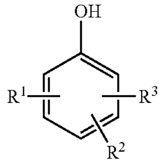

wherein in formula (I), $R^1$ and $R^2$ each independently represent a hydrogen atom, an alkyl group, or a halogen atom and $R^3$ represents an alkyl group having 3 to 6 carbon atoms or a cycloalkyl group having 3 to 6 carbon atoms.

4. The positive image forming material according to claim 3, wherein a phenol content in monomers that constitute the novolac type phenolic resin is from 21 to 90% by mole.

5. The positive image forming material according to claim 3, wherein a weight average molecular weight of the novolac type phenolic resin is from 500 to 50000.

6. The positive image forming material according to claim 3, wherein a proportion of the novolac type phenolic resin to a total solids content in the image forming layer is from 0.1 to 20% by mass.

7. The positive image forming material according to claim 1, further comprising a resin intermediate layer between the substrate and the positive image forming layer.

* * * * *